United States Patent
Kong et al.

(10) Patent No.: US 9,875,925 B2
(45) Date of Patent: Jan. 23, 2018

(54) METHOD OF FABRICATING SEMICONDUCTOR DEVICE

(71) Applicant: SAMSUNG ELECTRONICS CO., LTD., Suwon-si, Gyeonggi-Do (KR)

(72) Inventors: Myung-ho Kong, Hwaseong-si (KR); Jeong-hee Park, Hwaseong-si (KR); Taek-jung Kim, Seoul (KR); Han-young Kim, Anyang-si (KR); Keon-seok Seo, Suwon-si (KR); Jong-myeong Lee, Seongnam-si (KR); Hee-sook Park, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 26 days.

(21) Appl. No.: 15/065,916

(22) Filed: Mar. 10, 2016

(65) Prior Publication Data
US 2016/0372359 A1 Dec. 22, 2016

(30) Foreign Application Priority Data

Jun. 17, 2015 (KR) ........................ 10-2015-0086174

(51) Int. Cl.
*H01L 21/74* (2006.01)
*H01L 29/423* (2006.01)
*H01L 29/78* (2006.01)
*H01L 21/768* (2006.01)

(52) U.S. Cl.
CPC ........ *H01L 21/743* (2013.01); *H01L 29/4236* (2013.01); *H01L 29/78* (2013.01); *H01L 21/76897* (2013.01)

(58) Field of Classification Search
CPC ......... H01L 27/10873; H01L 27/10894; H01L 29/4941; H01L 21/76831; H01L 21/76826; H01L 21/28247; H01L 21/823437; H01L 21/32105; H01L 21/02208; H01L 23/485; H01L 21/76825; H01L 21/76829; H01L 27/10897; H01L 27/11507; H01L 21/0223; H01L 21/28211; H01L 21/84; H01L 29/518; H01L 21/76856
See application file for complete search history.

(56) References Cited

U.S. PATENT DOCUMENTS

| 5,925,918 | A | 7/1999 | Wu et al. |
| 6,303,483 | B1 | 10/2001 | Kunikiyo |
| 6,479,362 | B2 | 11/2002 | Cunningham |
| 6,699,777 | B2 | 3/2004 | Agarwal |
| 6,774,442 | B2 * | 8/2004 | Hayashi ............ H01L 21/28061 257/412 |

(Continued)

FOREIGN PATENT DOCUMENTS

| JP | 2004-165174 | 6/2004 |
| KR | 100315037 | 11/2001 |

(Continued)

*Primary Examiner* — Eliseo Ramos Feliciano
*Assistant Examiner* — Joannie A Garcia
(74) *Attorney, Agent, or Firm* — Volentine & Whitt, PLLC

(57) ABSTRACT

A method of fabricating a semiconductor device includes forming a doped polysilicon layer on a substrate, forming a barrier layer on the doped polysilicon layer, forming an oxidized barrier layer by oxidizing a surface of the barrier layer, and forming a metal layer on the oxidized barrier layer.

17 Claims, 81 Drawing Sheets

(56) References Cited

U.S. PATENT DOCUMENTS

| | | | |
|---|---|---|---|
| 7,053,459 B2* | 5/2006 | Yamamoto | H01L 21/28044 |
| | | | 257/306 |
| 7,582,924 B2 | 9/2009 | Lee et al. | |
| 8,168,491 B2 | 5/2012 | Rho | |
| 2004/0051153 A1* | 3/2004 | Yamamoto | H01L 21/28044 |
| | | | 257/412 |
| 2004/0171241 A1* | 9/2004 | Kitamura | H01L 21/28247 |
| | | | 438/592 |
| 2007/0001246 A1* | 1/2007 | Lim | H01L 21/28061 |
| | | | 257/412 |
| 2008/0122102 A1* | 5/2008 | Sakata | C23C 16/045 |
| | | | 257/763 |
| 2010/0285659 A1* | 11/2010 | Rho | H01L 21/823842 |
| | | | 438/593 |
| 2011/0212274 A1* | 9/2011 | Selsley | C23C 14/5826 |
| | | | 427/540 |
| 2014/0024208 A1 | 1/2014 | Frank et al. | |

FOREIGN PATENT DOCUMENTS

| | | |
|---|---|---|
| KR | 100327588 | 2/2002 |
| KR | 1020090032893 A | 4/2009 |
| KR | 1020100062698 A | 6/2010 |

\* cited by examiner

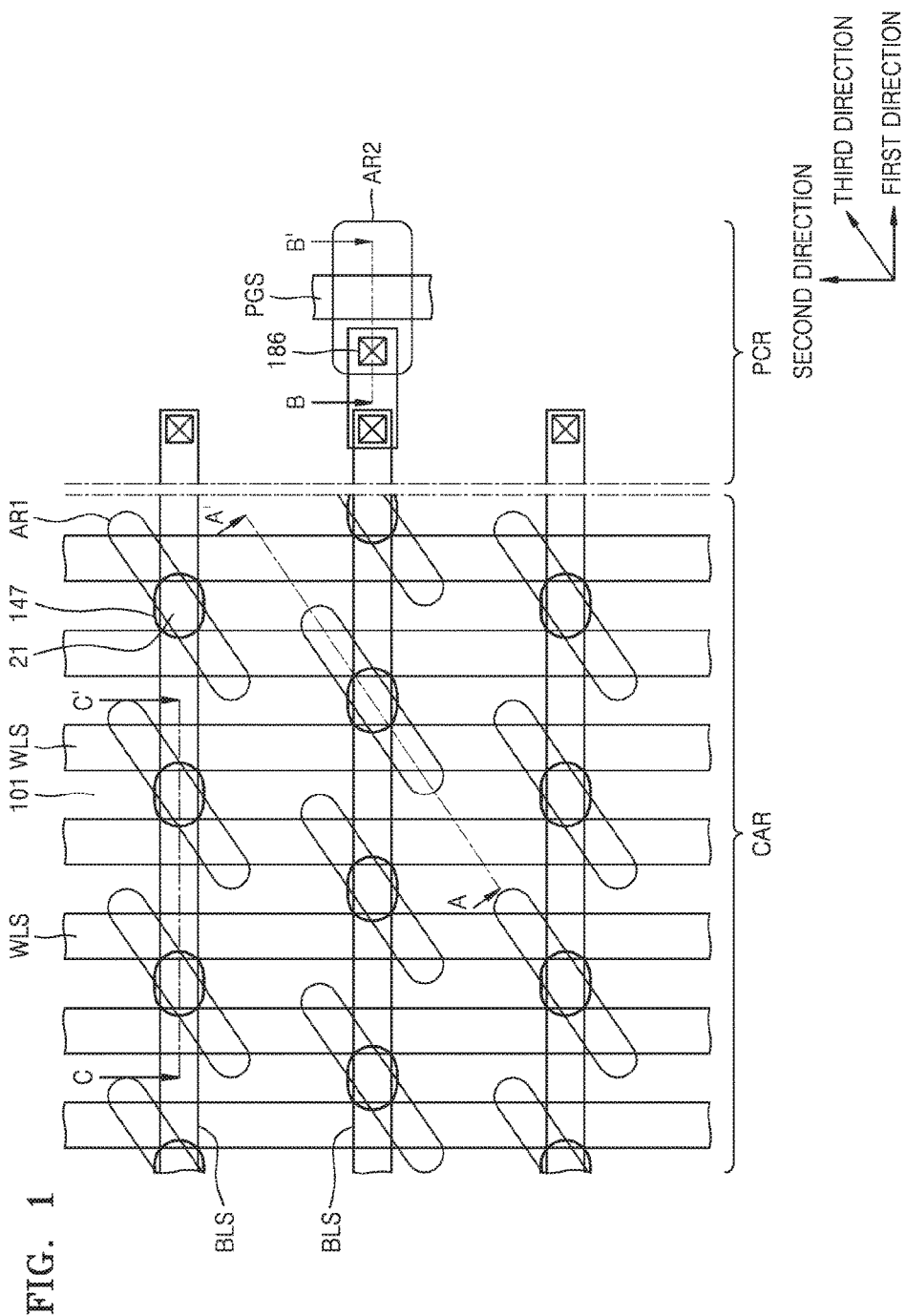

METHOD OF FABRICATING SEMICONDUCTOR DEVICE

CROSS-REFERENCE TO RELATED APPLICATION

This application claims the benefit of Korean Patent Application No. 10-2015-0086174, filed on Jun. 17, 2015, in the Korean Intellectual Property Office, the disclosure of which is hereby incorporated by reference in its entirety.

BACKGROUND

The inventive concept relates to a method of fabricating a semiconductor device. In particular, the inventive concept relates to conductive lines and processes of forming conductive lines in the fabricating of semiconductor devices.

As the electronics industry has become highly developed, semiconductor devices have become more highly integrated. Accordingly, the line widths of patterns of semiconductor devices, such as signal lines, are increasingly becoming smaller. Thus, much research is being conducted in the developing of manufacturing techniques which produce extremely fine patterns of conductive lines without sacrificing performance of these patterns to conduct signals, i.e., which can reliably increase the existing degree to which semiconductor devices are integrated.

SUMMARY

According to an aspect of the inventive concept, there is provided a method of fabricating a semiconductor device, which includes forming a doped polysilicon layer on a substrate, forming a barrier layer on the doped polysilicon layer, forming an oxidized barrier layer by oxidizing a surface of the barrier layer, and forming a metal layer on the oxidized barrier layer.

According to another aspect of the inventive concept, there is provided a method of fabricating a semiconductor device, which includes providing a substrate, forming a bit line structure on the substrate in a cell array region, and forming a peripheral gate structure in a peripheral circuit region, and in which each of the bit line structure and the peripheral gate structure comprises a first conductive pattern, a barrier pattern on the first conductive pattern, an oxide at an upper part of the barrier pattern, and a second conductive pattern on the oxide, and the forming of the barrier pattern and the oxide of each of the bit line structure and the peripheral gate structure comprises forming a barrier of material on conductive material and oxidizing an uppermost part of the barrier without oxidizing a lower portion of the barrier.

According to another aspect of the inventive concept, there is provided a method of fabricating a semiconductor device, which includes forming a layer of doped semiconductor material on a substrate, forming a barrier of material on the doped polysilicon layer, wherein at least an uppermost portion of the barrier comprises a crystalline metal nitride layer, oxidizing an upper portion only of the barrier to form an oxide at the uppermost portion of the barrier, thereby leaving a lower portion of the barrier as is on the layer of doped semiconductor material, and forming a conductive layer comprising metal directly on the oxide.

BRIEF DESCRIPTION OF THE DRAWINGS

The inventive concept will be more clearly understood from the following detailed description of examples thereof taken in conjunction with the accompanying drawings in which:

FIG. 1 is a plan view of an exemplary portion, i.e., a layout, of various semiconductor devices that may be fabricated according to the inventive concept;

FIGS. 2A to 15B are sectional views of a semiconductor device during the course of its manufacture, in which FIGS. 2A, 3A, 4A, 5A, 6A, 7A, 8A, 9A, 10A, 11A, 12A, 13A, 14A, and 15A are sectional views each taken in the direction of lines A-A' and B-B' of FIG. 1, whereas FIGS. 2B, 3B, 4B, 5B, 6B, 7B, 8B, 9B, 10B, 11B, 12B, 13B, 14B, and 15B are sectional views each taken in the direction of line C-C' of FIG. 1.

FIGS. 16A to 17C are sectional views of another semiconductor device during the course of its manufacture, in which FIGS. 16A and 17A are sectional views each taken in the direction of lines A-A' and B-B' of FIG. 1, whereas FIG. 17C is an enlarged view of region M of FIG. 17A, and which figures collectively illustrate another example of a method of fabricating a semiconductor device according to the inventive concept;

FIGS. 18A to 19C are sectional views of another semiconductor device during the course of its manufacture, in which FIGS. 18A and 19A are sectional views each taken in the direction of lines A-A' and B-B' of FIG. 1, whereas FIG. 19C is an enlarged view of region O of FIG. 19A, and which figures collectively illustrate another example of a method of fabricating a semiconductor device according to the inventive concept;

FIGS. 21A to 26B are sectional views of another semiconductor device during the course of its manufacture, in which FIGS. 21A, 22A, 23A, 24A, 25A and 26A are sectional views each taken in the direction of line G-G' of FIG. 20, and FIGS. 21B, 22B, 23B, 24B, 25B and 26B are sectional views each taken in the direction of lines H-H' and I-I' of FIG. 20, and which figures collectively illustrate an example of a method of fabricating a semiconductor device having the layout shown in FIG. 20 according to the inventive concept;

FIGS. 28A to 37B are sectional views of another semiconductor device during the course of its manufacture FIGS. 28A to 37B, in which FIGS. 28A, 29A, 30A, 31A, 32A, 33A, 34A, 35A, 36A and 37A are sectional views each taken in the direction of line D-D' of FIG. 27, and FIGS. 28B, 29B, 30B, 31A, 32B, 33B, 34B, 35B, 36B and 37B are sectional views each taken in the direction of lines E-E' and F-F' of FIG. 27, and which figures collectively illustrate an example of a method of fabricating a semiconductor device having the layout shown in FIG. 27 according to the inventive concept;

DETAILED DESCRIPTION

Figure 2A:
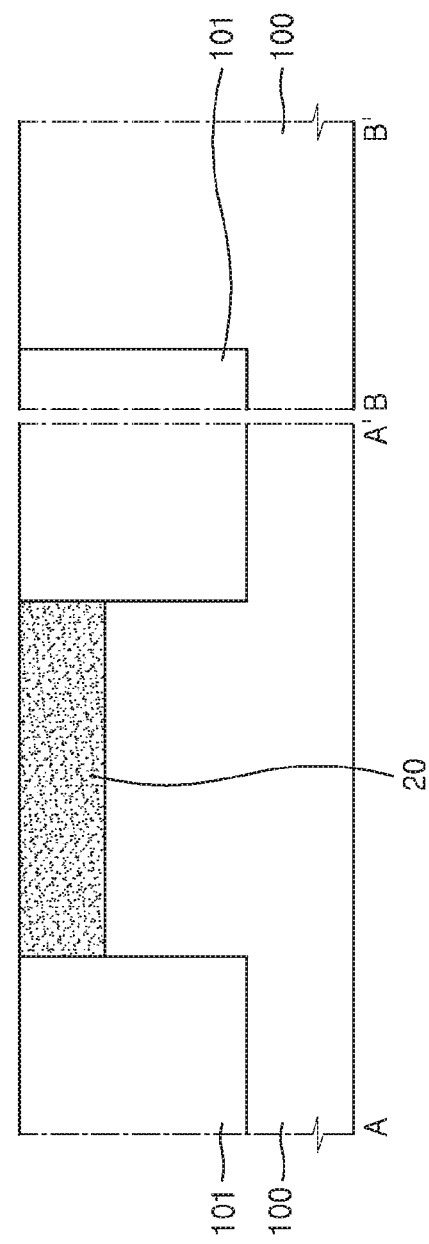

Hereinafter, examples of the inventive concept will be described in detail with reference to the accompanying drawings. Like components in the drawings will be denoted by like reference numerals throughout the specification and repeated descriptions thereof will be omitted.

As used herein, the term "and/or" includes any and all combinations of one or more of the associated listed items. Expressions such as "at least one of" when preceding a list of elements, modify the entire list of elements and do not modify the individual elements of the list.

It should be understood that the examples of the inventive concept are provided for complete disclosure and thorough understanding of the inventive concept by those of ordinary skill in the art and that the inventive concept may be realized in different ways and is not limited to the following examples.

Although the terms such as "first", "second" and the like are used herein to describe various members, regions, layers, portions, and/or components, it will be apparent that the members, regions, layers, portions, and/or components are not to be limited by these terms. These terms do not imply a specific order, a relative upper or lower location, or relative superiority or inferiority, and are used only to distinguish one member, region, layer, portion, or component from other members, regions, layers, portions, or components. Thus, a first member, region, portion, or component, which will be described below, could be termed a second member, region, portion, or component without departing from the teachings of the inventive concept. For example, a first component could be termed a second component without departing from the scope of the inventive concept.

Unless otherwise defined, all terms used herein, including technical and scientific terms, have the same meanings as understood in common by those of ordinary skill in the art. For example, it will be appreciated that numerical values of a particular dimension of an element or feature refer to design specifications and that the term "about" as used in connection with such numerical values encompasses typical variations from the design specifications that may result from the processes used to fabricate such elements or features. Likewise, it will be appreciated that numerical values or range of values of a particular process parameter refer to the desired value(s) under the control of the particular process and that the term "about" as used in connection with such numerical values encompasses typical fluctuations of the parameters from those desired under the control of the process. Accordingly, all descriptions of a dimension or process parameter preceded by the term "about" may be inclusive of the stated value(s) of the dimension or process parameter. The term "similar" will be understood as meaning the same or substantially the same. In addition, it will be understood that generally used terms as defined in dictionaries are to be interpreted as consistent meanings as understood in the context of related techniques and are not to be interpreted as excessively formalistic meanings unless explicitly defined herein.

When an example can be otherwise realized, a specific process may be performed in a different order from a described order. For example, two processes successively described may be substantially simultaneously performed, and may also be performed in an opposite order to a described order.

In the accompanying drawings, modifications of illustrated shapes can be anticipated, for example, depending on fabricating techniques and/or tolerances. Thus, examples of the inventive concept are not to be construed as being limited to specific shapes of regions illustrated herein, and are to be construed as including, for example, variations of shapes caused in the process of fabrication.

FIG. 1 shows an exemplary layout of a cell array region CAR and a peripheral circuit region PCR of semiconductor devices that may be fabricated according to the inventive concept. The specific shape of features and layout of the cell array region CAR and peripheral circuit region PCR are merely illustrative, i.e., the cell array region CAR and peripheral circuit region PCR can have different layouts and/or features with shapes different from those illustrated without departing from the scope and spirit of the inventive concept.

An example of a method of fabricating such a semiconductor device according to the inventive concept will now be described with reference to FIGS. 2A to 15B.

Figure 2B:
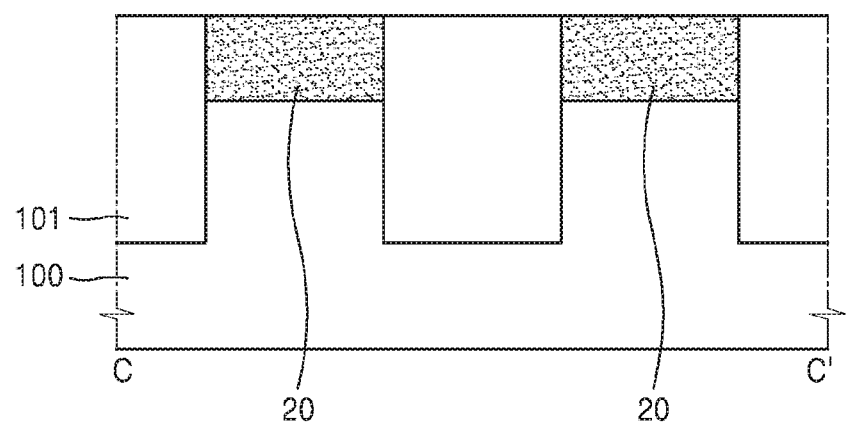

Referring to FIGS. 1, 2A, and 2B, a device isolation film 101 is formed in a substrate 100, whereby first active regions AR1 may be defined in a cell array region CAR, and a second active region AR2 may be defined in a peripheral circuit region PCR. The cell array region CAR may be a region in which memory cells are arranged. The peripheral circuit region PCR may be a region in which a word line driver, a sense amplifier, row and column decoders, and control circuits are arranged.

The substrate 100 may include silicon (Si), for example, crystalline Si, polycrystalline Si, or amorphous Si. In some examples, the substrate 100 may include a semiconductor such as germanium (Ge), or a compound semiconductor such as silicon germanium (SiGe), silicon carbide (SiC), gallium arsenide (GaAs), indium arsenide (InAs), or indium phosphide (InP).

The device isolation film 101 may be a shallow trench isolation (STI) region for improving a speed and a degree of integration of a device.

In some examples, the device isolation film 101 may include at least one of oxides such as tonen silazene (TOSZ), high temperature oxides (HTOs), high density plasma (HDP) products, tetraethyl orthosilicate (TEOS), boron-phosphorus silicate glass (BPSG), undoped silicate glass, or the like. In addition, the device isolation film 101 may include an insulating film including at least one of silicon oxide, silicon nitride, and silicon oxynitride. In other examples, the device isolation film 101 may have a structure in which a plurality of insulating films is stacked. For example, the device isolation film 101 may have a structure in which a first film (not shown) of silicon nitride and a second film (not shown) of silicon oxide are stacked.

The first active regions AR1 may have bar shapes horizontally spaced from each other, and may extend in a third direction non-perpendicular to both a first direction and a second direction. The first direction and the second direction may be directions perpendicular to each other.

An impurity region 20 may be formed in an upper portion of each of the first active regions AR1. In some examples, the impurity region 20 serves as a source/drain region. The impurity region 20 may be formed before or after the device isolation film 101 is formed. In other examples, the impurity region 20 is formed in at a later time rather than immediately preceding or following the forming of the device isolation film 101.

Figure 3A:
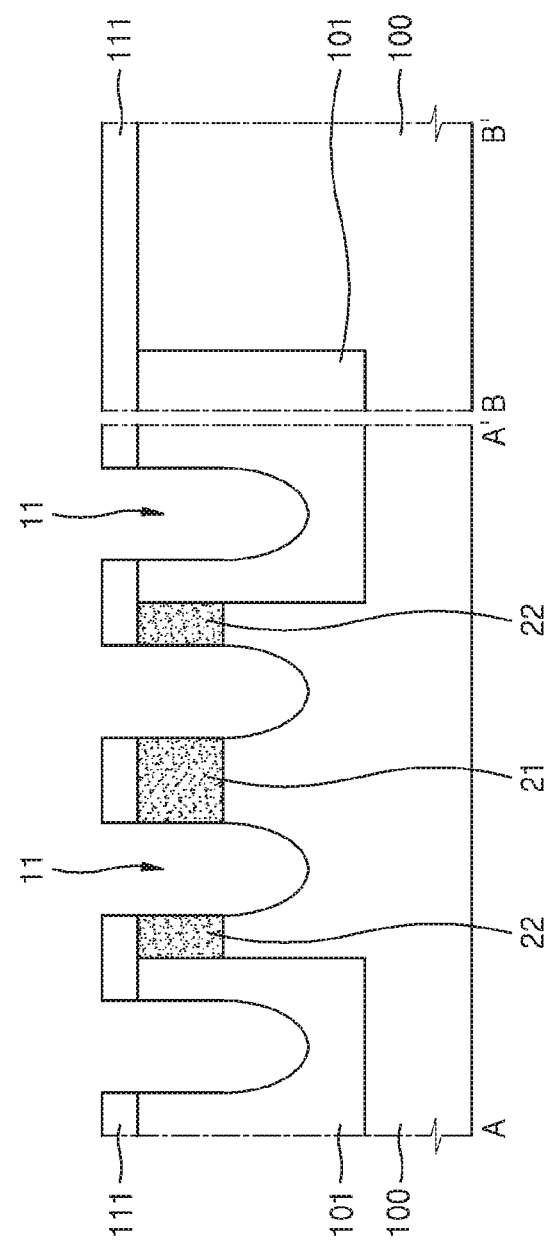
Figure 3B:
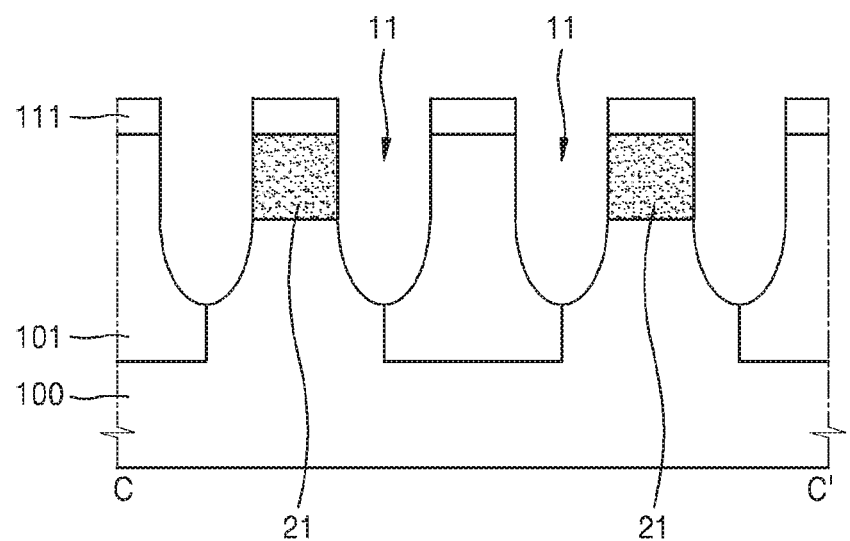

Referring to FIGS. 1, 3A, and 3B, word line trenches 11 may be formed in an upper portion of the substrate 100 in the cell array region CAR. The word line trenches 11 may extend in the second direction and be spaced from each other in the first direction, thereby separating the impurity region 20 (see FIGS. 2A and 2B) into first impurity regions 21 and second impurity regions 22. That is, in the one first active region AR1, the impurity region 21 may be interposed between a pair of the second impurity regions 22, and the impurity region 21 may be separated from the second impurity regions 22 by the word line trenches 11.

The word line trenches 11 may be formed by forming a mask pattern 111 on an upper surface of the substrate 100, followed by performing a dry and/or wet etching process using the mask pattern 111 as an etch mask. For example, the mask pattern 111 may include at least one of a photoresist, silicon nitride, and silicon oxide. The word line trenches 11 may have a depth less than that of the device isolation film 101.

In some examples, the two word line trenches 11 may be formed side by side as separated from each other. Since a word line (not shown) which will be disposed in each of the word line trenches 11 can serve as a gate of a transistor, two transistors can be arranged in each of the first active regions AR1.

The word line trenches 11 may be formed by any etch method, e.g., a physical etching method such as sputter etching and the like, a chemical etching method such as reactive radical etching and the like, or a physicochemical etching method such as reactive ion etching (RIE), magnetically enhanced RIE (MERIE), transformer coupled plasma (TCP) etching, inductively coupled plasma (ICP) etching.

Although all the word line trenches 11 shown in FIGS. 3A and 3B have the same depth, the word line trench formed in the first active region AR1 and the word line trench formed in the device isolation film 101 may have depths different from each other. The reason for this is that since the first active region AR1 includes a silicon material and the device isolation film 101 includes an oxide, the first active region AR1 and the device isolation film 101 may have different etch selectivities from each other.

Figure 4A:
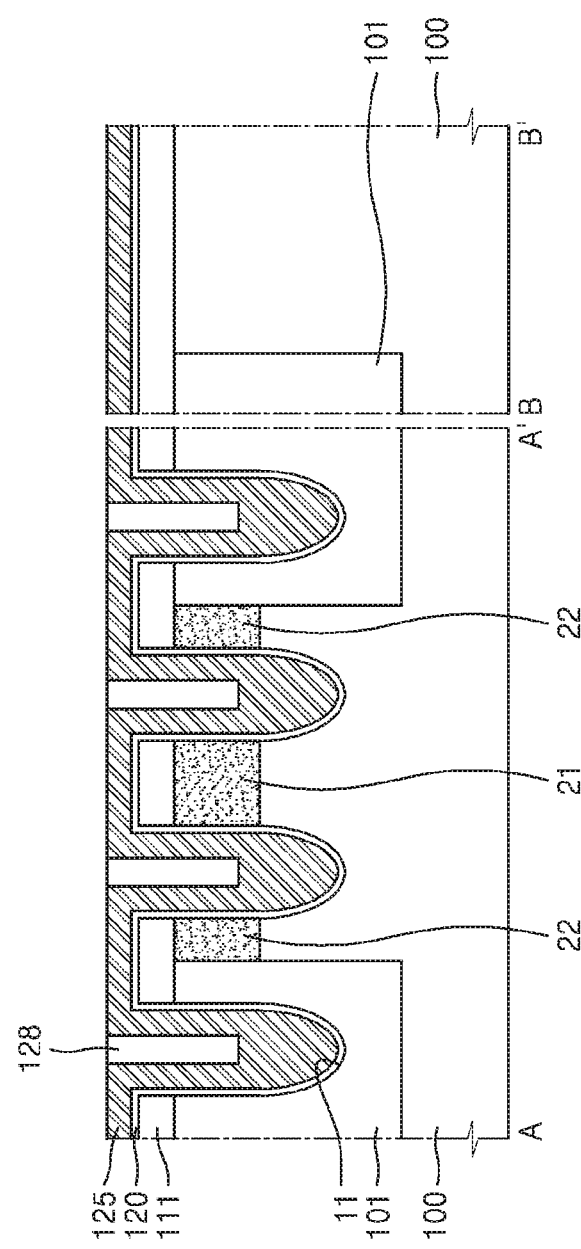
Figure 4B:
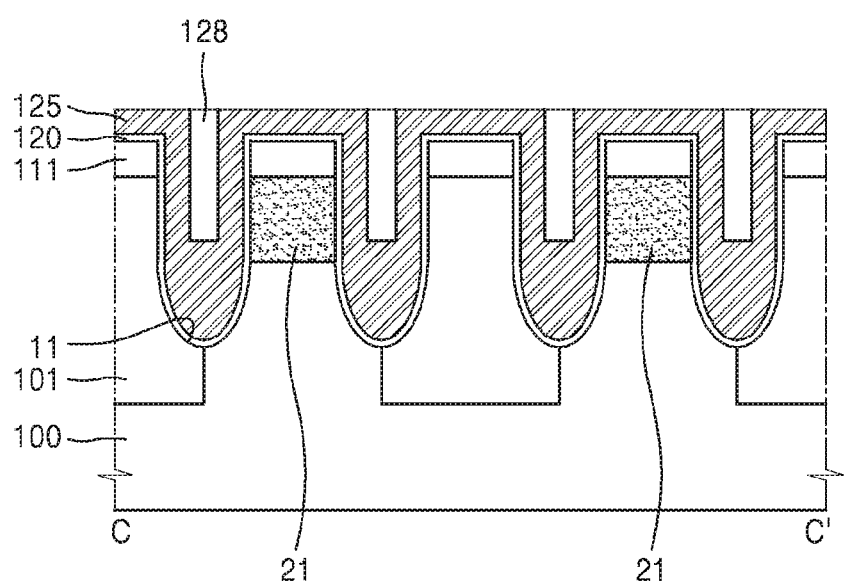

Referring to FIGS. 1, 4A, and 4B, a gate dielectric layer 120, a conductive layer 125, and a buried layer 128 may be formed in the stated order on a resultant product in which the word line trenches 11 are formed.

In some examples, the gate dielectric layer 120 includes a silicon oxide layer, a high permittivity (high-k) dielectric layer, or the like. In other examples, the gate dielectric layer 120 is a composite layer having a double structure of a silicon oxide layer and a silicon nitride layer, or a surface-nitrided silicon oxide layer. Examples of the high permittivity dielectric layer include layers of at least one material selected from the group consisting of aluminum oxide ($AlO_x$), tantalum oxide ($Ta_xO_y$), titanium oxide ($TiO_x$), yttrium oxide ($Y_xO_y$), zirconium oxide ($ZrO_x$), zirconium silicon oxide ($ZrSi_xO_y$), hafnium oxide ($HfO_x$), hafnium silicon oxide ($HfSi_xO_y$), lanthanum oxide ($La_xO_y$), lanthanum aluminum oxide ($LaAl_xO_y$), lanthanum hafnium oxide ($LaHf_xO_y$), hafnium aluminum oxide ($HfAlO_y$), and praseodymium oxide ($Pr_xO_y$).

The conductive layer 125 may include a layer of at least one material selected from the group consisting of doped polysilicon, one or more metals, one or metal nitrides, and one or more metal silicides. The one or more metals may be selected from the group consisting of aluminium (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), and zirconium (Zr). The one or more metal nitrides may be selected from the group consisting of titanium nitride (TiN), tungsten nitride (WN), tantalum (TaN), titanium silicon nitride (TiSiN), tantalum silicon nitride (TaSiN), and tungsten silicon nitride (WSiN). The one or more metal silicides may be selected from the group consisting of cobalt silicide ($CoSi_x$), nickel silicide ($NiSi_x$), titanium silicide ($TiSi_x$), tungsten silicide ($WSi_x$), and tantalum silicide ($TaSi_x$).

That is, the conductive layer 125 may be a single layer or a composite layer. For example, the conductive layer 125 may be a composite layer of a metal material and polysilicon.

The buried layer 128 may include at least one of silicon oxide, silicon nitride, and silicon oxynitride. The buried layer 128 may be formed by forming an insulating layer (not shown) on the conductive layer 125, followed by performing planarization, for example, chemical mechanical polishing (CMP) on the insulating layer. In the present example, as shown in FIGS. 4A and 4B, the conductive layer 125 is formed in the word line trenches 11, and the buried layer 128 is formed in a space remaining in the word line trenches 11, but the inventive concept is not limited thereto. That is, the word line trenches 11 may be filled completely by the conductive layer 125, i.e., the buried layer 128 is not formed.

Each of the gate dielectric layer 120, the conductive layer 125, and the buried layer 128 may be formed by any method such as physical vapour deposition (PVD), chemical vapour deposition (CVD), or atomic layer deposition (ALD).

Figure 5A:
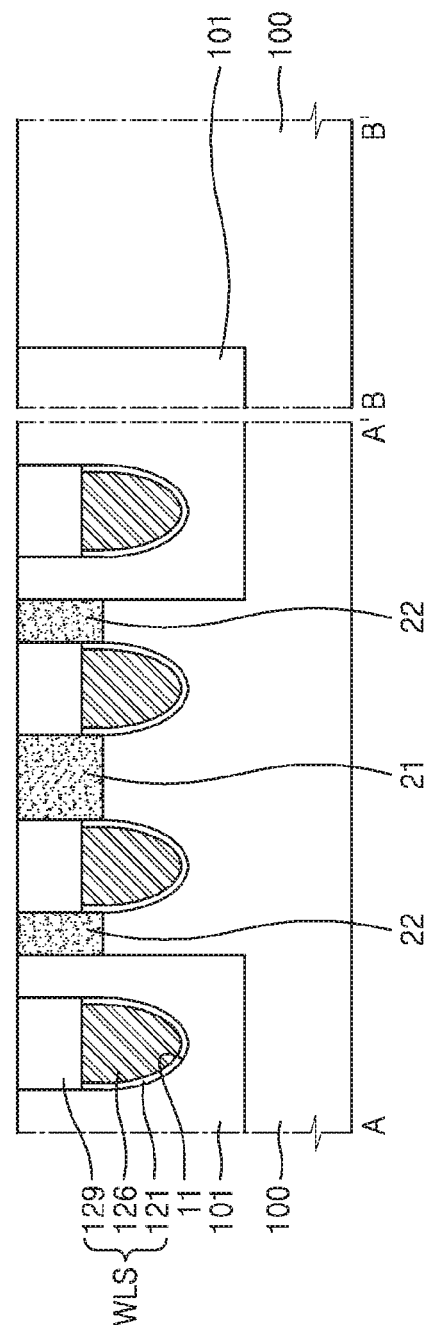
Figure 5B:
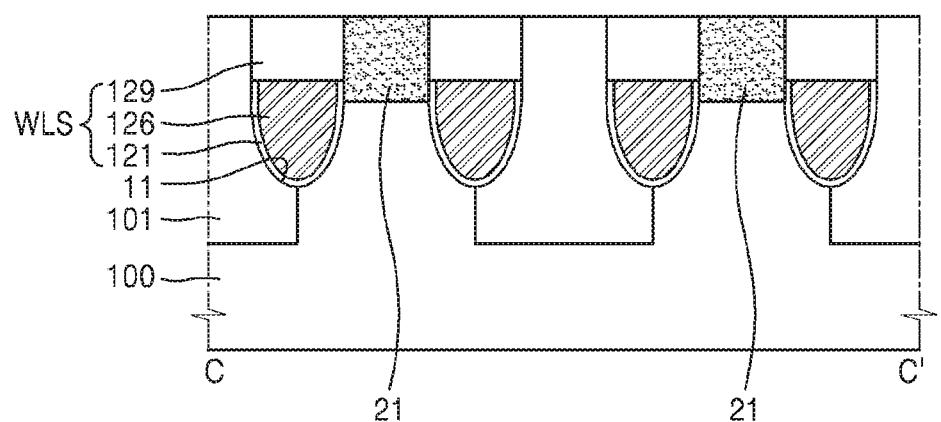

Referring to FIGS. 1, 5A, and 5B, the gate dielectric layer 120 (see FIGS. 4A and 4B) and the conductive layer 125 (see FIGS. 4A and 4B) may be etched to be confined within the word line trenches 11. As a result of the etching process, the gate dielectric layer 120 may become gate dielectric films 121 separated from each other, and the conductive layer 125 may become gate electrodes 126 separated from each other.

The etching process may be performed until the buried layer 128 (see FIGS. 4A and 4B) is removed, and as a result, upper surfaces (at uppermost ends) of the gate dielectric films 121 and upper surfaces of the gate electrodes 126 may be disposed at a level in the device lower than the level of the upper surfaces of the word line trenches 11. The effective channel length of the semiconductor device is increased by forming the gate electrodes 126 as a buried gate structure, thereby reducing a short channel effect.

Gate capping patterns 129 may be formed on the gate electrodes 126. The gate capping patterns 129 may be formed by forming an insulating film filling the space in the word line trenches 11 voided by the aforementioned etching process, followed by performing planarization until the upper surface of the substrate 100 is exposed.

The gate capping patterns 129 may include at least one of silicon nitride, silicon oxide, and silicon oxynitride. As a result of forming the gate capping patterns 129, word line structures WLS may be formed in the word line trenches 11. Each of the word line structures WLS may include the gate dielectric film 121, the gate electrode 126, and the gate capping pattern 129, which are stacked in the stated order in each of the word line trenches 11.

Figure 6A:
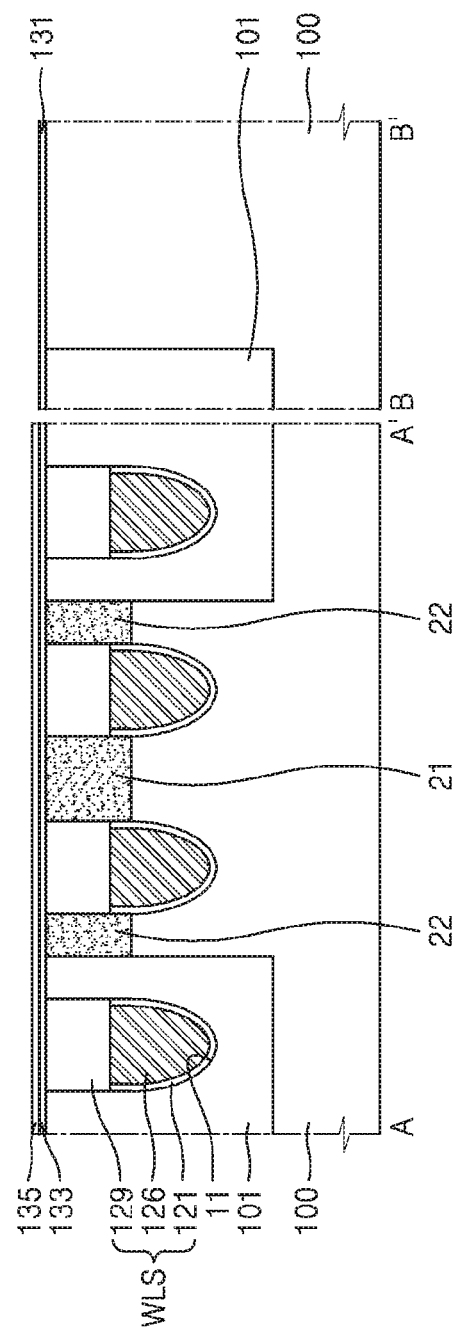
Figure 6B:
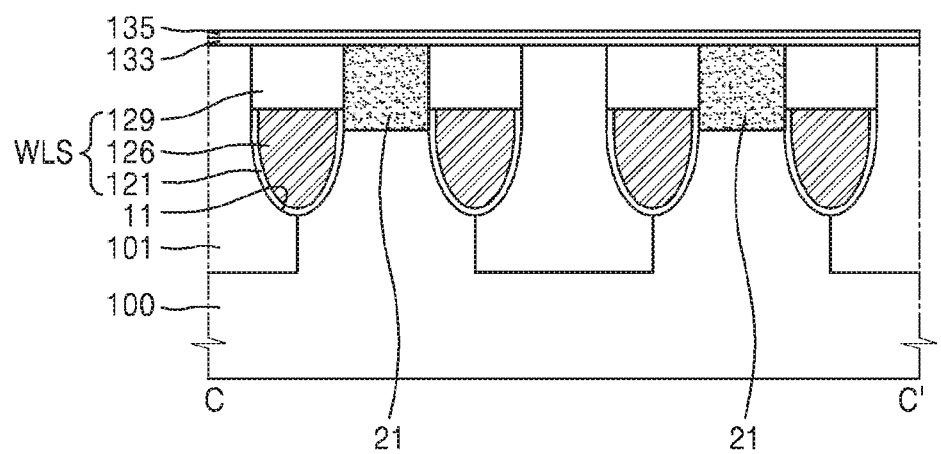

Referring to FIGS. 1, 6A, and 6B, a first insulating layer 133 and a second insulating layer 135 are formed in the stated order on the substrate 100 in the cell array region CAR and the peripheral circuit region PCR, followed by removing the first insulating layer 133 and the second insulating layer 135 in the peripheral circuit region PCR, thereby exposing the upper surface of the substrate 100 again. Next, while the cell array region CAR is covered with a mask pattern (not shown), a gate dielectric layer 131 is formed on the substrate 100 in the peripheral circuit region PCR.

The first insulating layer 133 may include an oxide film, and the second insulating layer 135 may include a nitride film; however, the inventive concept is not limited thereto.

The gate dielectric layer 131 may include a silicon oxide layer, a high permittivity (high-k) dielectric layer, or the like. In other examples, the gate dielectric layer 131 is a composite layer having a double structure of a silicon oxide layer and a silicon nitride layer, or a surface-nitrided silicon oxide layer.

Figure 7A:
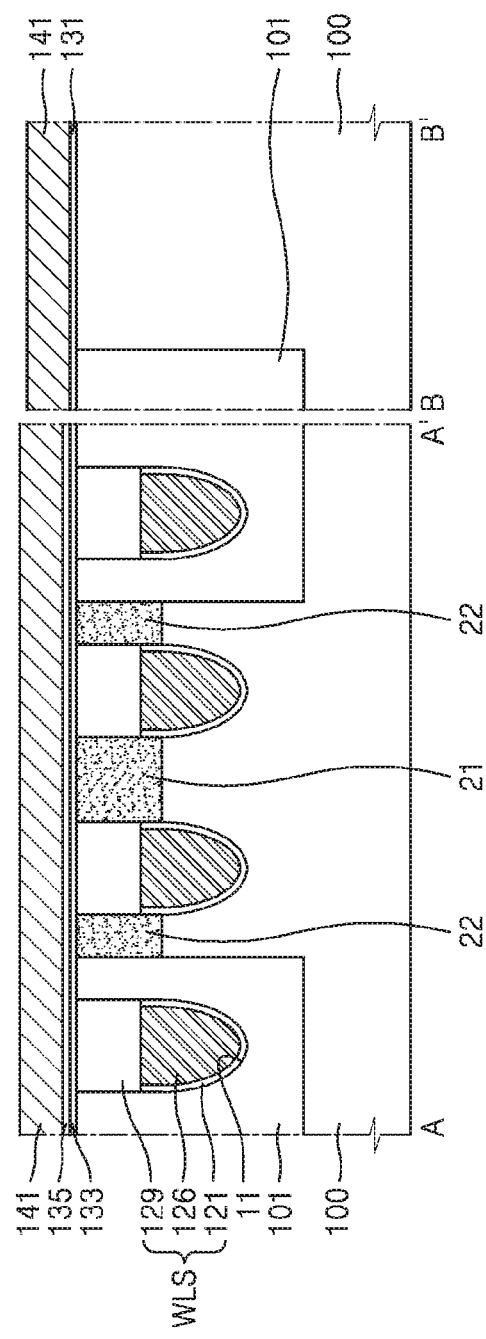
Figure 7B:
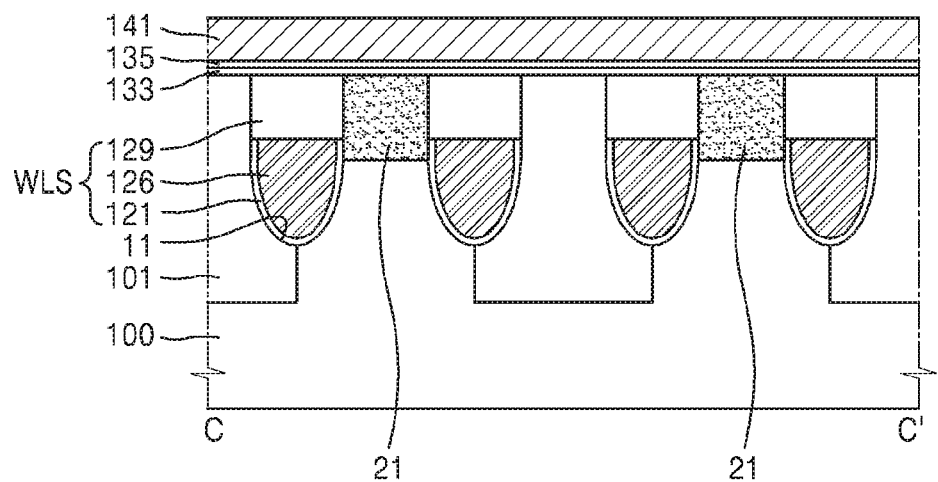

Referring to FIGS. 1, 7A, and 7B, a first semiconductor layer 141 is formed on the cell array region CAR and the peripheral circuit region PCR. The first semiconductor layer 141 may include doped polysilicon but is not limited thereto.

Figure 8A:
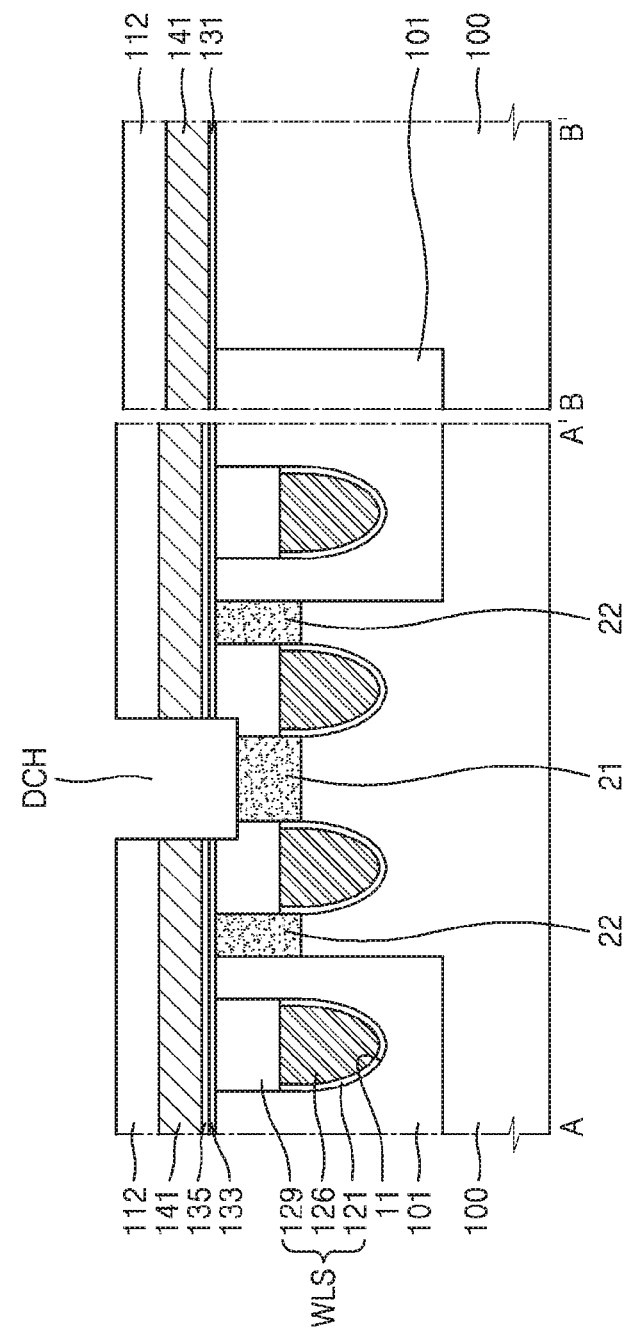
Figure 8B:
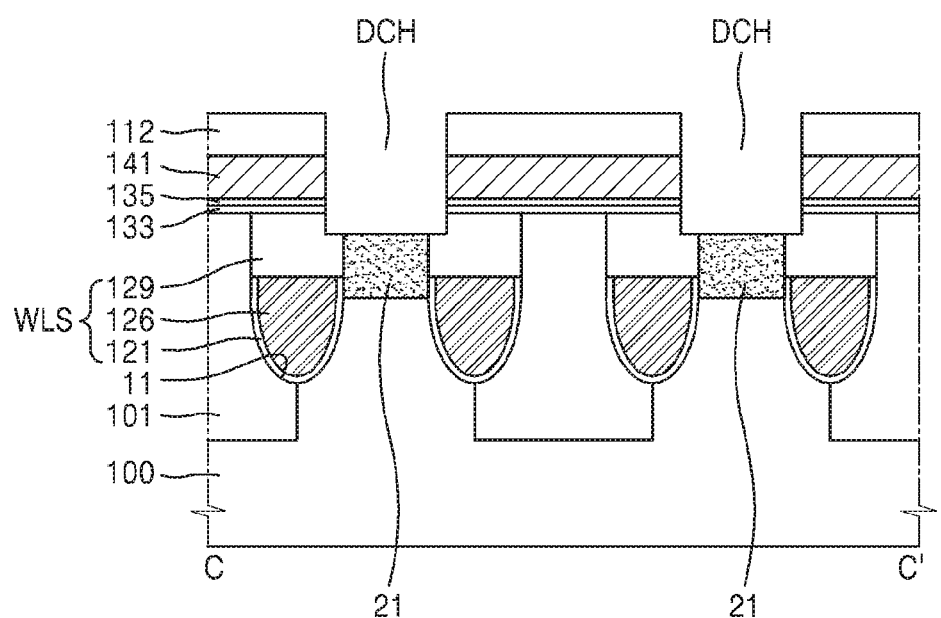

Referring to FIGS. 1, 8A, and 8B, a mask pattern 112 is formed on the first semiconductor layer 141 in the cell array region CAR and the peripheral circuit region PCR. An opening, which exposes a portion of the first semiconductor layer 141 in the cell array region CAR, is formed in the mask pattern 112. The peripheral circuit region PCR may be covered with the mask pattern 112 and thus may not be exposed to the outside of the semiconductor device.

Next, the first semiconductor layer 141 exposed through the opening of the mask pattern 112 is etched, followed by etching a portion of the substrate 100 exposed as a result of the etching, thereby forming a direct contact hole (DCH) exposing the first impurity region 21 in the cell array region CAR. The direct contact hole (DCH) may have a circular or elliptical shape in a planar perspective. The mask pattern 112 may include a hard mask pattern including an oxide film or a nitride film. To form the mask pattern 112, a photolithography process may be used.

Figure 9A:
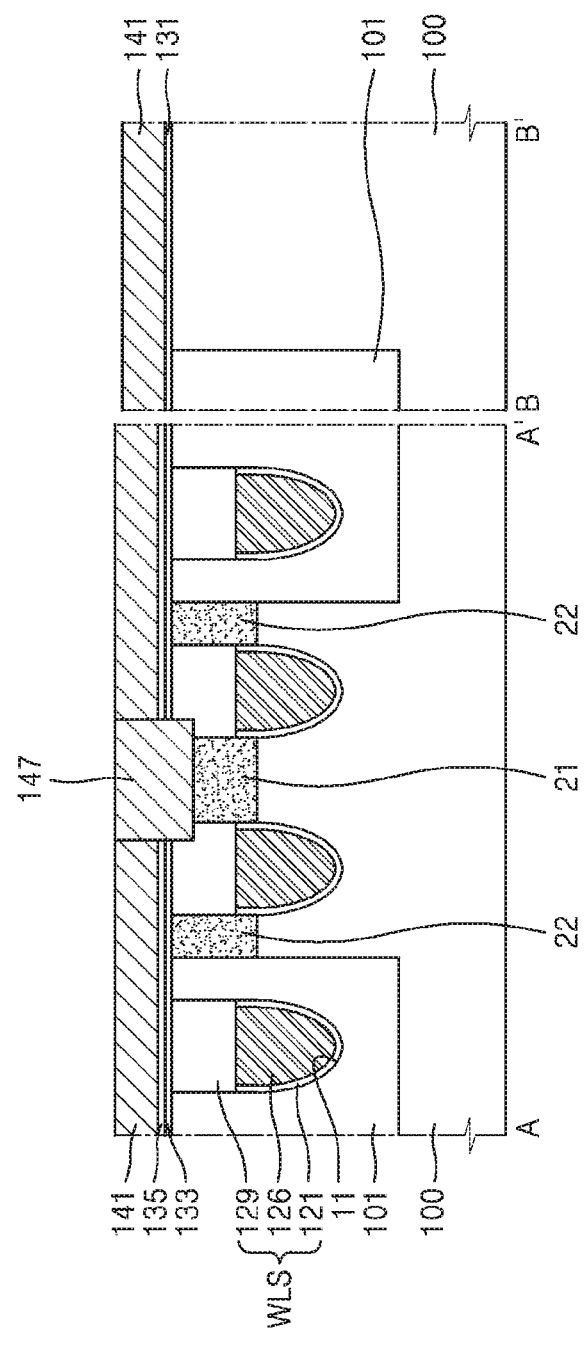
Figure 9B:
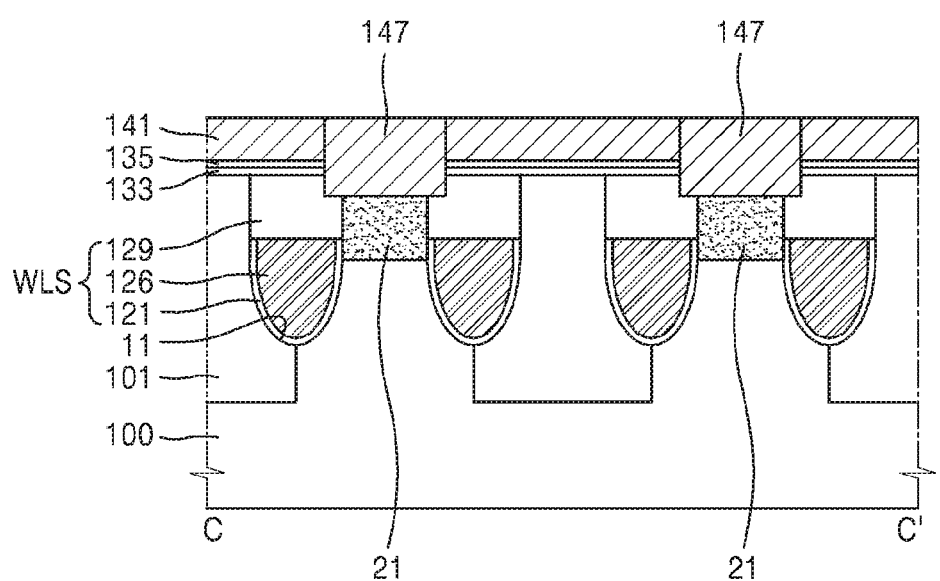

Referring to FIGS. 1, 9A, and 9B, the mask pattern 112 (see FIGS. 8A and 8B) is removed, followed by forming a conductive layer sufficiently thick to fill the direct contact hole (DCH) and cover the semiconductor layer 141. Next, the conductive layer is etched-back so as to remain only in the direct contact hole (DCH), thereby forming a direct contact 147. The direct contact 147 may include doped polysilicon but is not limited thereto. The direct contact 147 may include the same material as the first semiconductor layer 141.

Figure 10A:
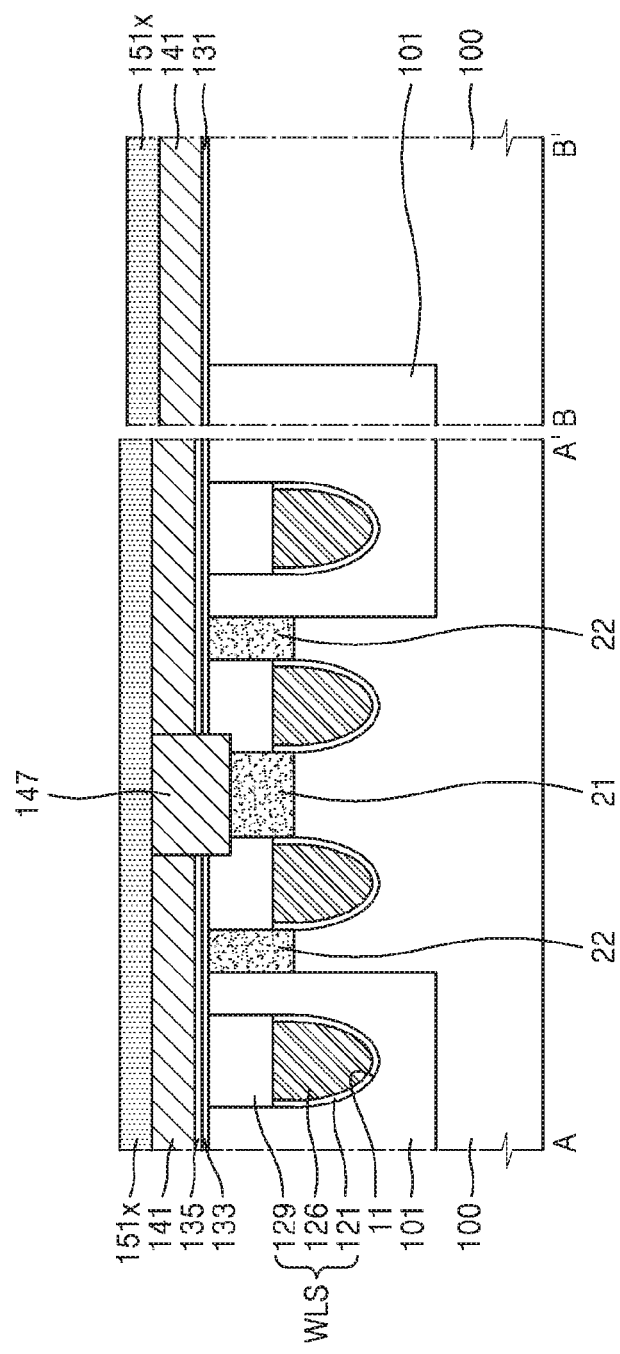
Figure 10B:
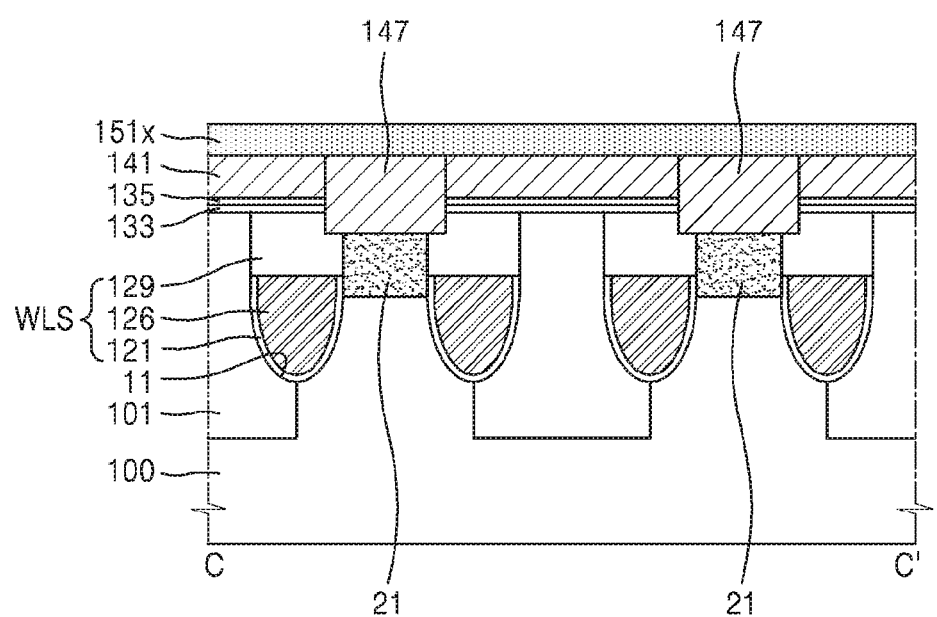
Figure 11A:
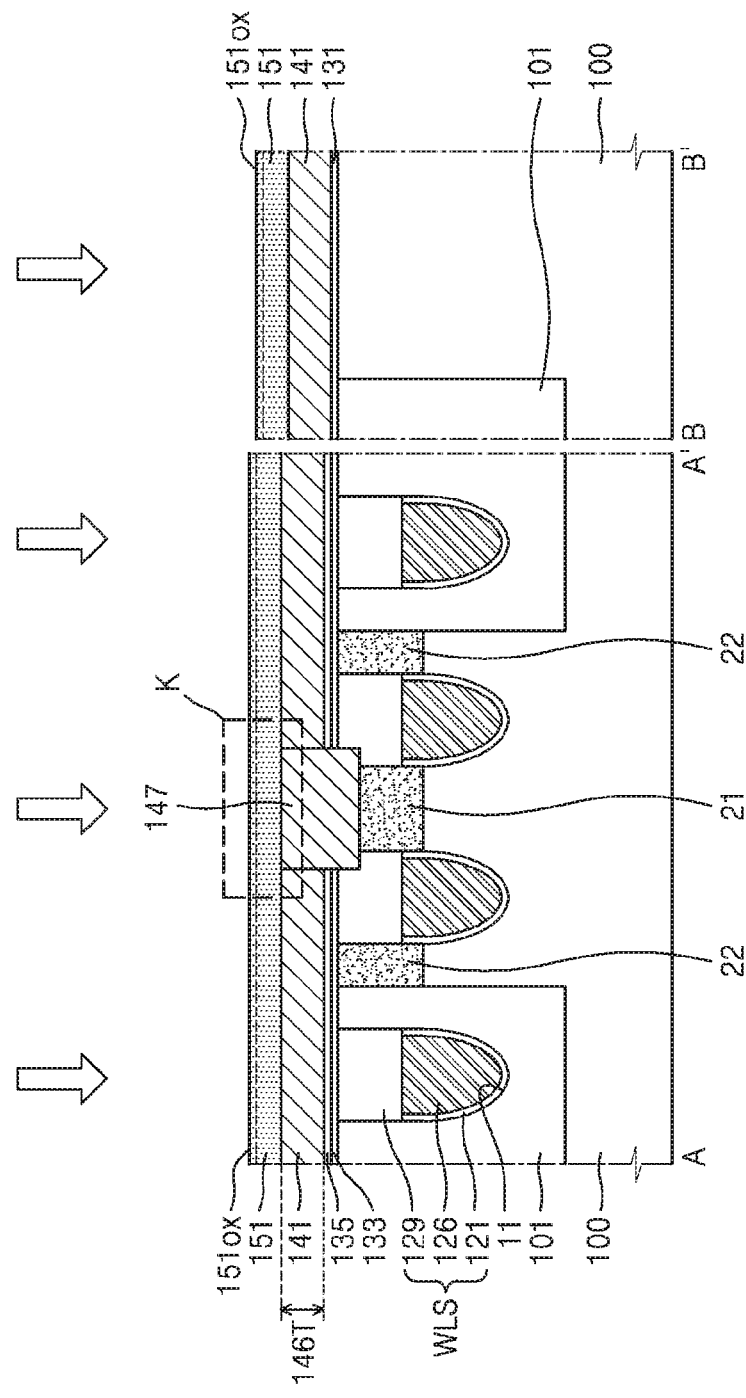
Figure 11B:
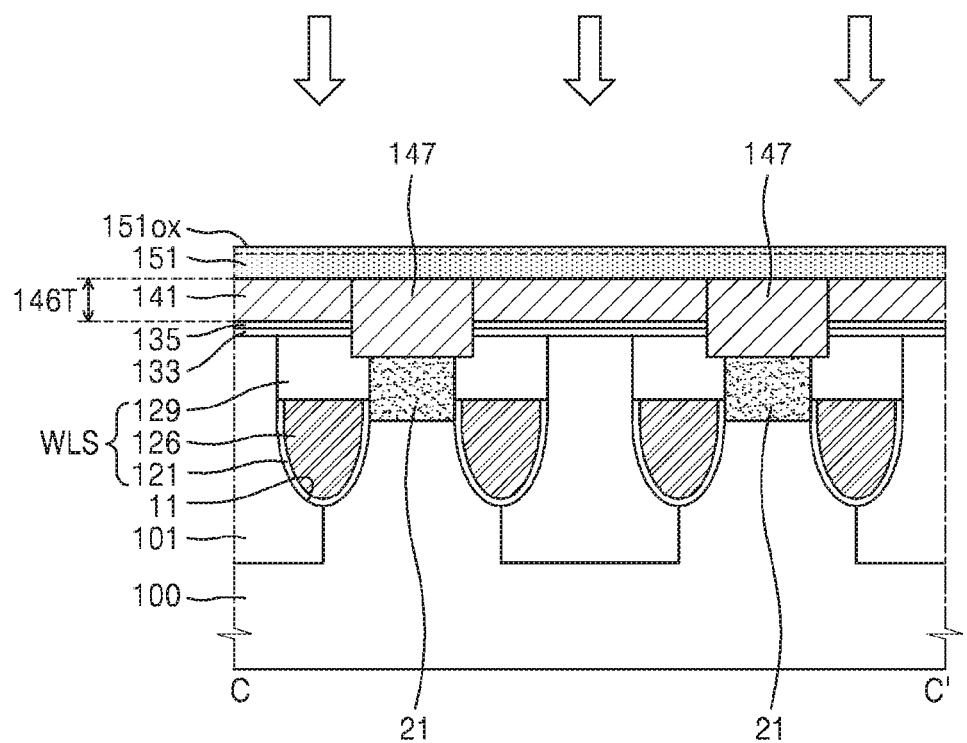
Figure 11C:
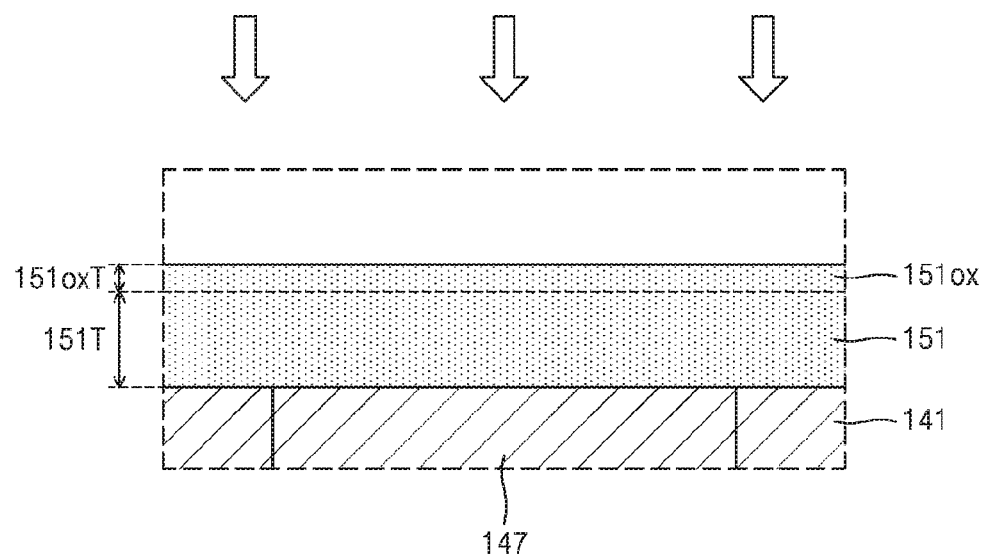
FIG. 11C is an enlarged view of region K of FIG. 11A, and which figures collectively illustrate an example of a method of fabricating a semiconductor device having the layout shown in FIG. 1 according to the inventive concept.

Referring to FIGS. 1, 10A, and 10B, a barrier layer 151x may be formed on the cell array region CAR and the peripheral circuit region PCR.

The barrier layer 151x may serve to prevent dopants in the first semiconductor layer 141 or the direct contact 147 from diffusing into a metal layer 161 (see FIG. 12A) formed by a subsequent process. The barrier layer 151x may have a crystalline structure.

The barrier layer 151x may include at least one metal nitride. The at least one metal nitride may be selected from the group consisting of titanium silicon nitride (TiSiN), tungsten nitride (WN), titanium aluminum nitride (TiAlN), titanium nitride (TiN), titanium carbon nitride (TiCN), titanium tungsten nitride (TiWN), tantalum nitride (TaN), tantalum silicon nitride (TaSiN), tantalum aluminum nitride (TaAlN), and molybdenum nitride (MoN).

In some examples, the barrier layer 151x is formed by performing a CVD or ALD process using $TiCl_4$, dichlorosilane (DCS, $SiH_2Cl_2$), and $NH_3$ sources. The barrier layer 151x may be formed at a temperature of about 560° C. to about 680° C. Instead of the DCS source, a $SiH_4$ source may be used. The barrier layer 151x may have a silicon concentration of about 10 atm % or more.

Referring to FIGS. 1 and 11A to 11C, an oxidation process is performed on a surface of the barrier layer 151x (see FIG. 10A), thereby forming an oxidized barrier layer 151ox. In the description that follows, the term "oxidized barrier layer" refers to the oxidized part of the layer obtained by oxidizing a barrier layer whereas the term "barrier layer" will refer to the part of the barrier layer which is not oxidized but remains as is at the conclusion of the oxidation process.

In some examples, the oxidized barrier layer 151ox has a thickness 151oxT of about 1 Å to about 20 Å, and the barrier layer 151 has a thickness 151T of about 20 Å to 70 Å.

The oxidation process may be a plasma oxidation, rapid thermal oxidation (RTO), or native oxidation process, but is not limited to any of these specific oxidation processes.

For example, in the case in which plasma oxidation is employed, oxidation is promoted by forming plasma in an atmosphere of an oxygen atom (O)-containing gas (hereinafter, an oxygen gas). For example, the substrate 100, on which the barrier layer 151x (see FIG. 10a) is formed, is placed in a plasma chamber (not shown), followed by supplying a mixture of an oxygen gas and an inert gas into the plasma chamber. In this example, the oxygen gas may be oxygen ($O_2$), ozone ($O_3$), nitrous oxide ($N_2O$), or the like, and the inert gas may be helium (He), nitrogen ($N_2$), argon (Ar), or the like.

In some examples, the oxygen gas or the inert gas is injected at a flow rate of about 50 sccm to about 7000 sccm. A pressure in the plasma chamber may be maintained at about 1 mTorr to about 10 Torr, a temperature therein may be maintained at about 200° C. to about 500° C., and a radio frequency (RF) power therein may be maintained at about 100 W to about 10000 W. The plasma oxidation may be performed for about 1 second to about 30 seconds.

At least one of the flow rate of the gas injected into the chamber, the pressure, the temperature, the RF power, and the process time may be controlled to thereby adjust the thickness 151oxT of the oxidized barrier layer 151ox as desired.

Rapid thermal oxidation is a process of promoting oxidation by performing a thermal process or heat treatment (see FIG. 10A). For example, the substrate 100, on which the barrier layer 151x is formed, is placed in a reactor in an oxygen atmosphere, followed by performing a rapid thermal process in which an inside of the reactor is heated to a high temperature, e.g., a temperature of about 400° C. to about 1000° C. The rapid thermal oxidation may be performed for about 20 seconds to about 1 minute.

Native oxidation may promote oxidation of a layer by exposing the layer to air. Thus, in the case in which native oxidation is employed, the substrate 100, on which the barrier layer 151x is may be exposed to air at atmospheric pressure and room temperature for some relatively long period of time, e.g., for 24 hours or more.

Figure 12A:
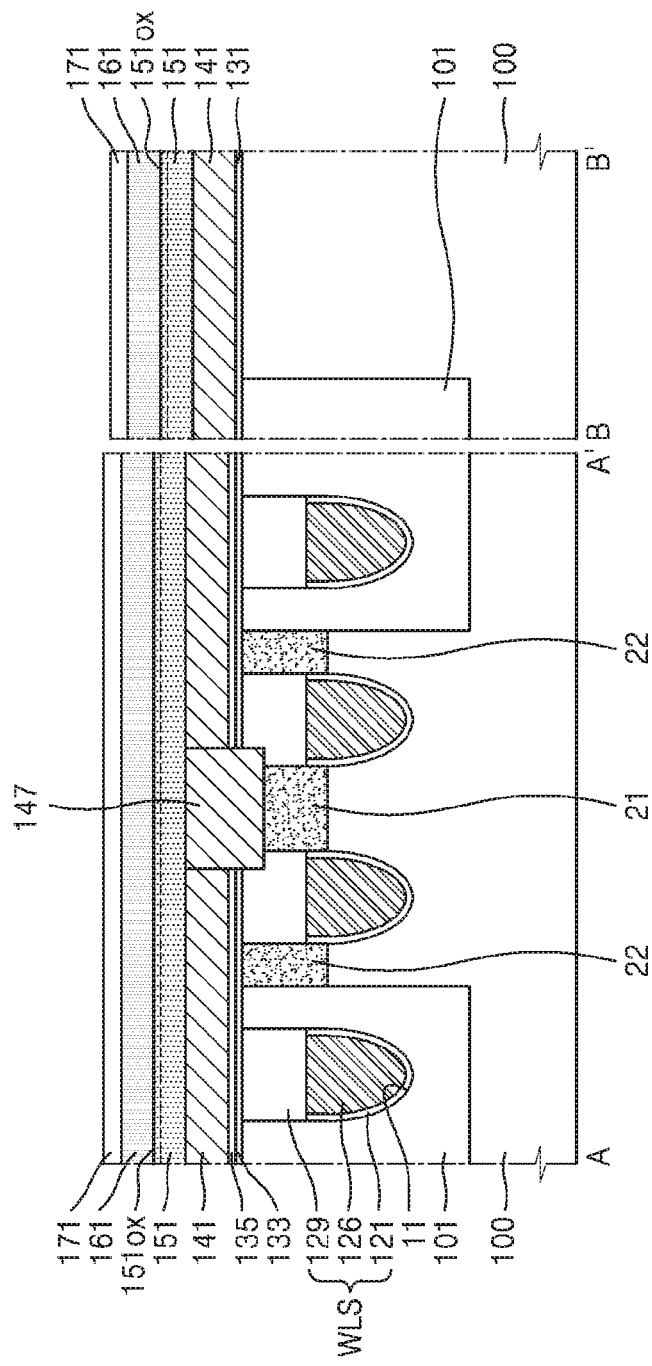
Figure 12B:
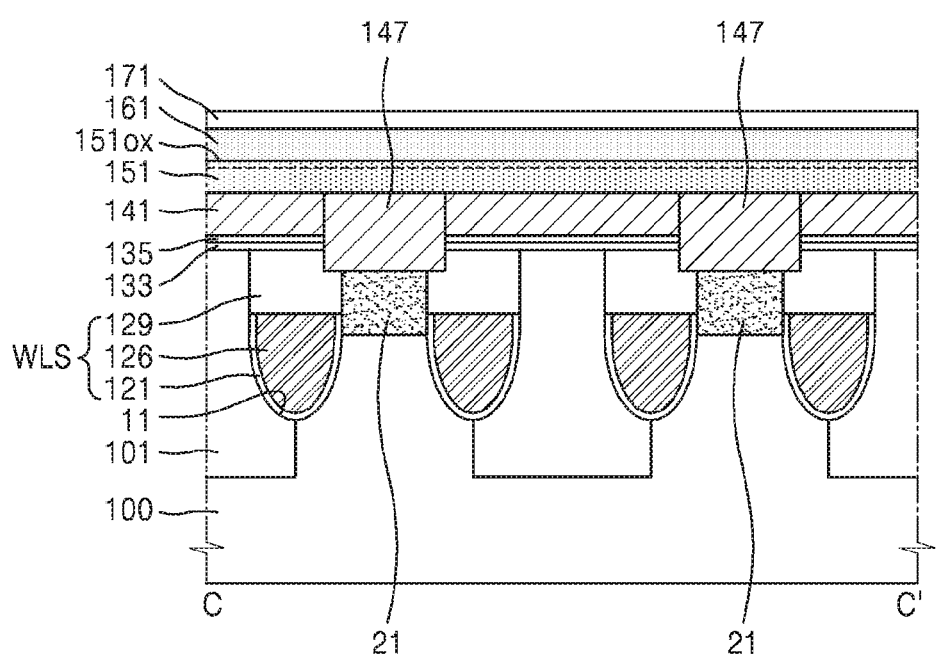

Referring to FIGS. 1, 12A, and 12B, a metal layer 161 and a capping layer 171 may be formed in the stated order on the oxidized barrier layer 151ox of the cell array region CAR and the peripheral circuit region PCR.

The metal layer 161 may include a metal and/or a conductive metal nitride. For example, the metal layer 161 may include at least one of tungsten (W), titanium (Ti), tantalum (Ta), tungsten nitride (WN), titanium nitride (TiN), and tantalum nitride (TaN). The capping layer 171 may include at least one of silicon oxide, silicon nitride, and silicon oxynitride.

Each of the metal layer 161 and the capping layer 171 may be formed by any appropriate method such as physical vapour deposition (PVD), chemical vapour deposition (CVD), or atomic layer deposition (ALD).

Because the metal layer 161 is formed on the oxidized barrier layer 151ox as described in the present example, crystal grains of the metal layer 161 are relatively large, such that the resistivity of the metal layer 161 is correspondingly low. That is, if the metal layer 161 were formed on the barrier layer 151, the crystalline structure of the barrier layer 151 would act to restrict the size of the crystal grains of the metal layer whereby the resistivity of the metal layer 161 would be relatively high.

Figure 13A:
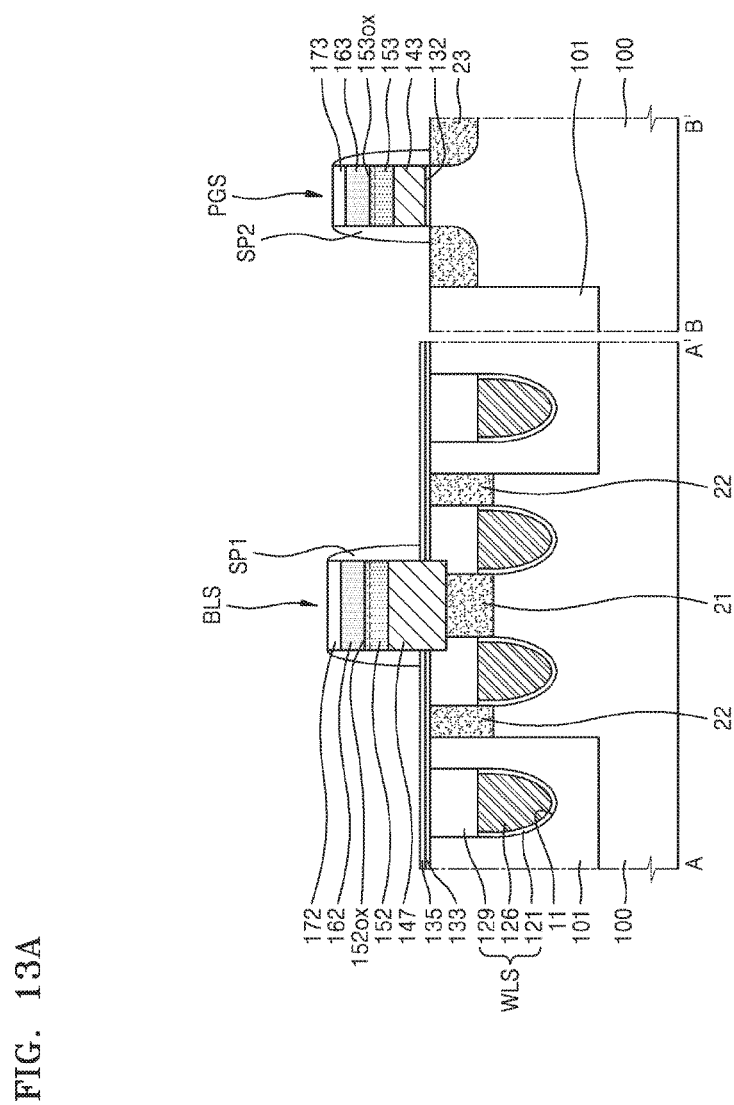
Figure 13B:
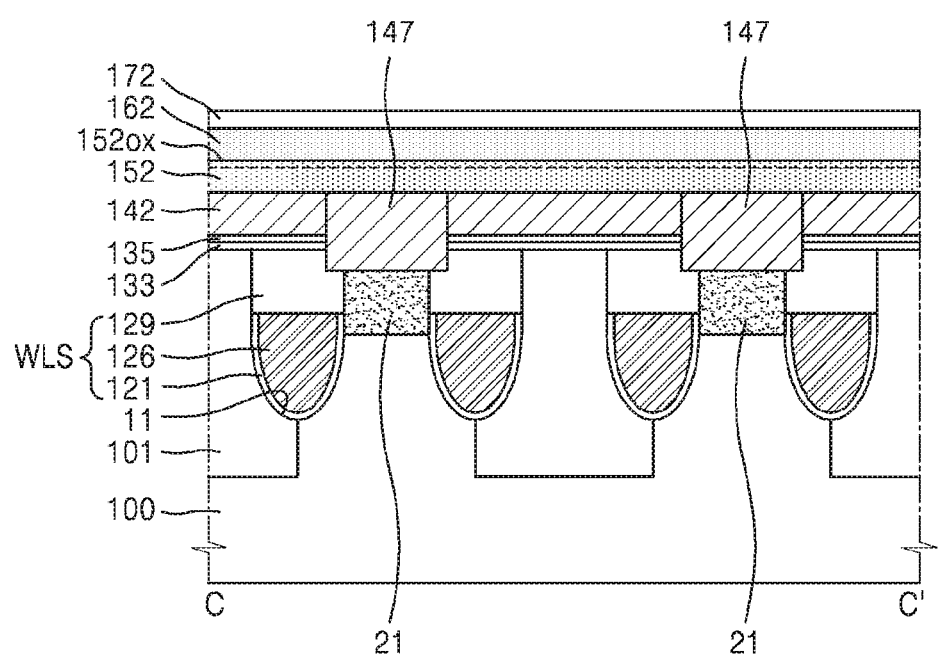

Referring to FIGS. 1, 13A, and 13B, the first semiconductor layer 141, the barrier layer 151, the oxidized barrier layer 151ox, the metal layer 161, and the capping layer 171 may be patterned, thereby forming a bit line structure BLS in the cell array region CAR and forming a peripheral gate structure PGS in the peripheral circuit region PCR.

Specifically, as a result of the patterning process in this example, the first semiconductor layer 141, the barrier layer 151, the oxidized barrier layer 151ox, the metal layer 161, and the capping layer 171 of the cell array region CAR become a first conductive pattern 142, a barrier pattern 152, an oxidized barrier pattern 152ox, a second conductive pattern 162, and a capping pattern 172, respectively. In addition, the gate dielectric layer 131, the first semiconductor layer 141, the oxidized barrier layer 151ox, the metal layer 161, and the capping layer 171 of the peripheral circuit region PCR become a gate dielectric film 132, a first conductive pattern 143, a barrier pattern 153, an oxidized barrier pattern 153ox, a second conductive pattern 163, and a capping pattern 173, respectively.

Thus, the bit line structure BLS may include the first conductive pattern 142, the barrier pattern 152, the oxidized barrier pattern 152ox, the second conductive pattern 162, and the capping pattern 172, and may be connected to the first impurity region 21 of the substrate 100 through the direct contact 147. The peripheral gate structure PGS may include the gate dielectric film 132, the first conductive pattern 143, the barrier pattern 153, the oxidized barrier pattern 153ox, the second conductive pattern 163, and the capping pattern 173.

A first spacer SP1 maybe formed on sides of the bit line structure BLS and a second spacer SP2 may be formed on sides of the peripheral gate structure PGS to complete the forming of the bit line structure BLS and the peripheral gate structure PGS.

A third impurity region 23 may be formed in the second active region AR2 of the peripheral circuit region PCR at opposite sides of the peripheral gate structure PGS. The third impurity region 23 may be formed by implanting impurity ions, which have the same conductivity type as that of the first conductive pattern 143, into the substrate 100 exposed by the peripheral gate structure PGS.

Since resistivities of the second conductive patterns 162, 163 can be kept minimal by the oxidized barrier patterns 152ox, 153ox only, and which have only a thickness of about 1 Å to about 20 Å in the present example, the heights of the bit line structure BLS and the peripheral gate structure PGS can be minimized without compromising their electrical performance characteristics.

Figure 14A:
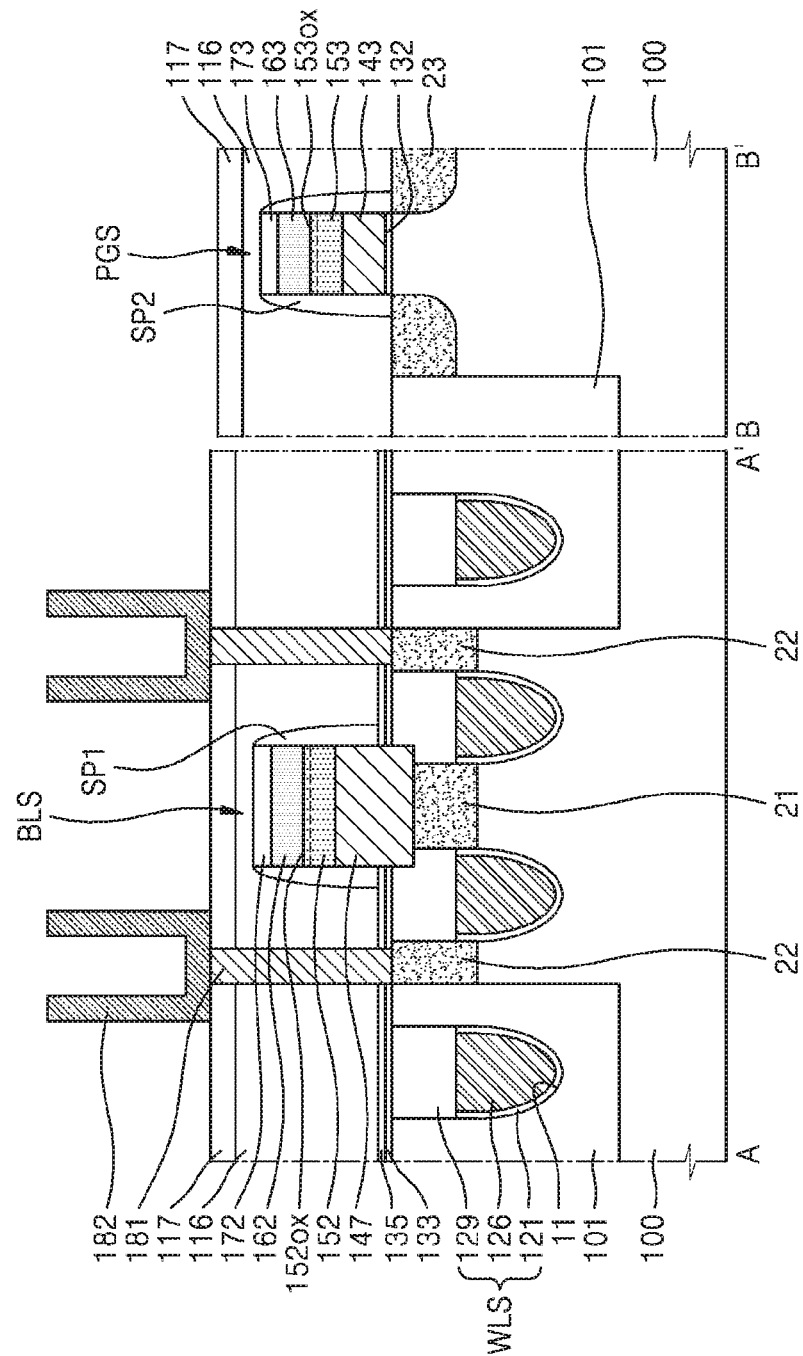
Figure 14B:
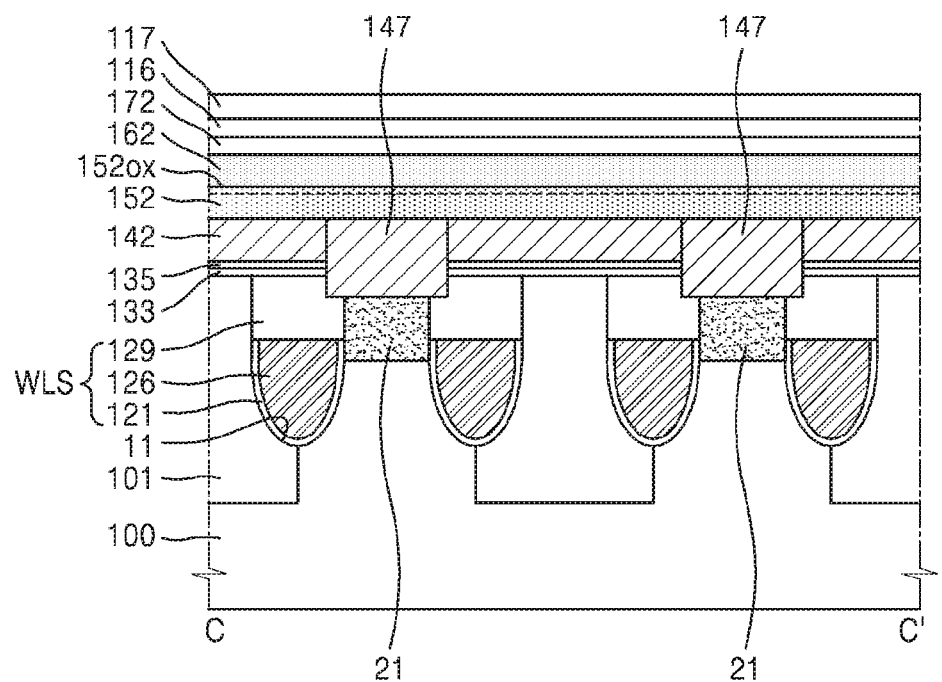

Referring to FIGS. 1, 14A, and 14B, a first interlayer dielectric 116 and a second interlayer dielectric 117, which cover the bit line structure BLS and the peripheral gate structure PGS, and first contacts 181, which extend through the second interlayer dielectric 117, the first interlayer dielectric 116, the first insulating layer 133, and the second insulating layer 135 to be connected to the second impurity regions 22, may be formed. Lower electrodes 182 connected to the first contacts 181 may be formed on the second interlayer dielectric 117.

As shown in FIG. 14A, the lower electrodes 182 may have the shape of a cylinder with a closed bottom end but is not limited to having such a shape. For example, the lower electrodes 182 may have the shape of a pillar (i.e., may be solid).

The first contacts 181 and the lower electrodes 182 may include at least one of a metal, a conductive metal compound, and a doped semiconductor. The interlayer dielectrics 116, 117 may include at least one of silicon oxide, silicon nitride, and silicon oxynitride. Each of the first contacts 181, the lower electrodes 182, and the interlayer dielectrics 116, 117 may be formed by an appropriate method such as physical vapour deposition (PVD), chemical vapour deposition (CVD), or atomic layer deposition (ALD).

Figure 15A:
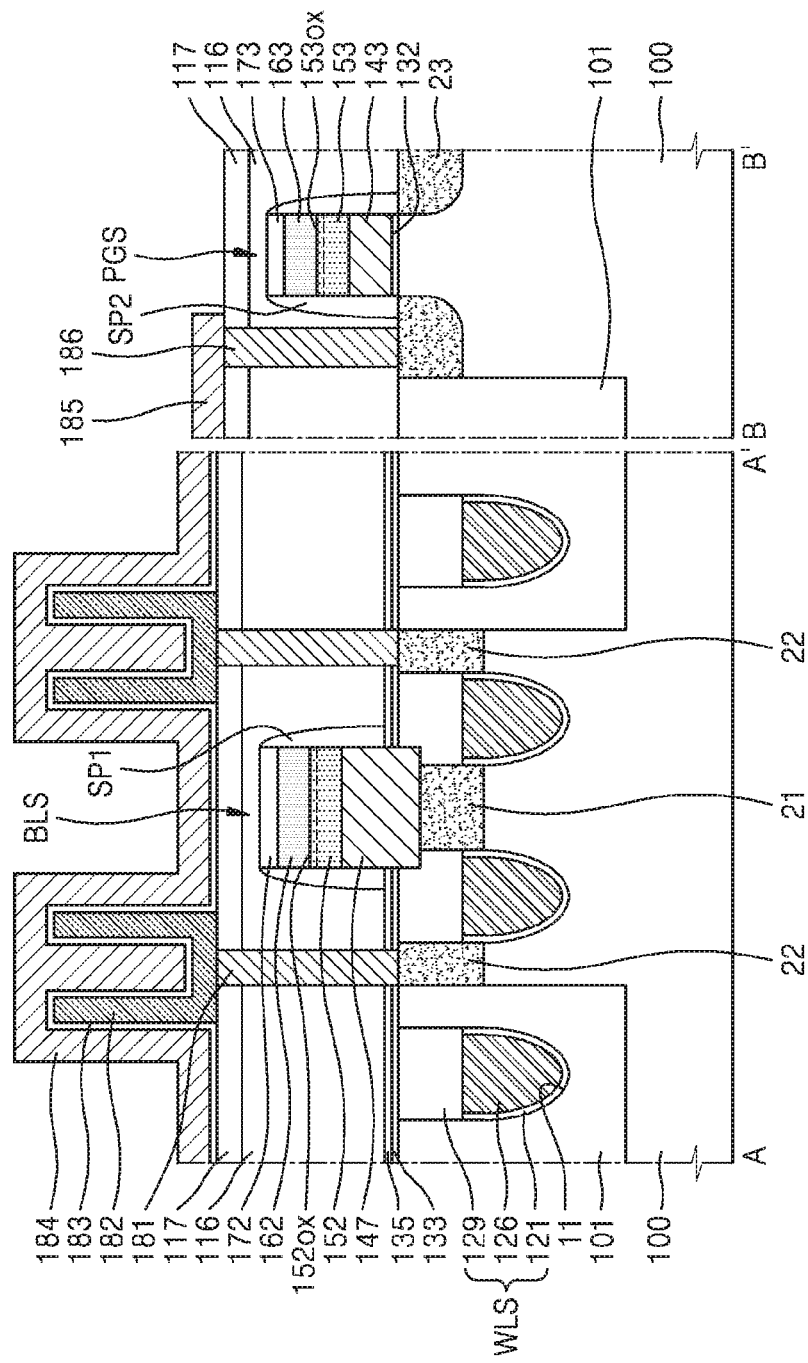
Figure 15B:
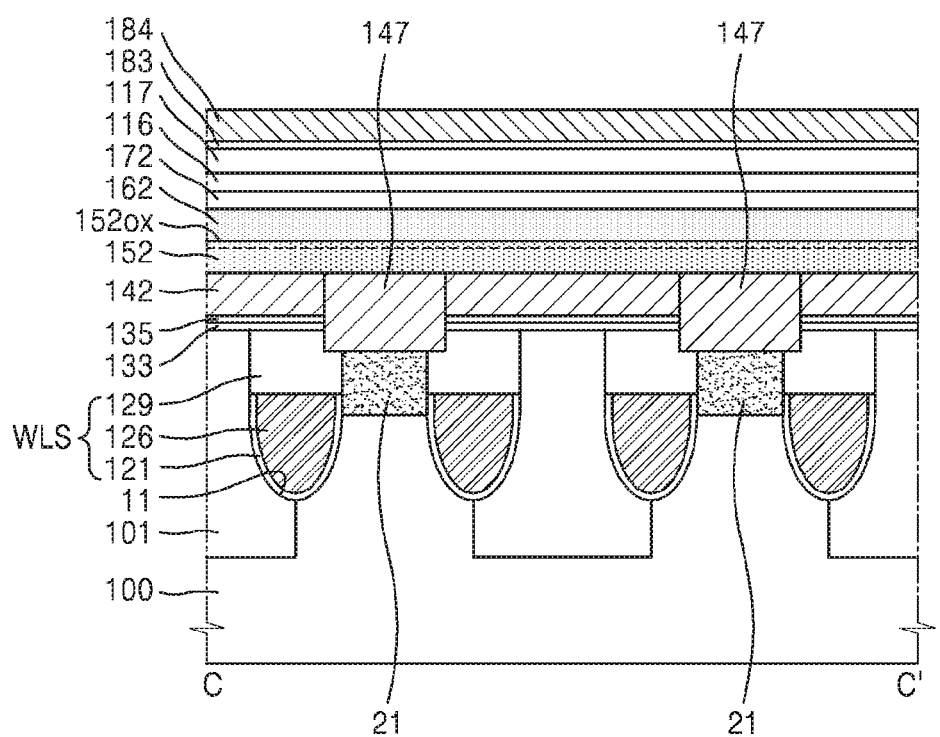

Referring to FIGS. 1, 15A, and 15B, an insulating layer 183 and an upper electrode 184 may be formed in the stated order on the lower electrodes 182. The lower electrodes 182, the insulating layer 183, and the upper electrode 184 may form a capacitor of the semiconductor device. The upper electrode 184 may include substantially the same material as the lower electrodes 182 but is not limited thereto.

A second contact 186 connected to the third impurity region 23 of the peripheral circuit region PCR may be formed. The second contact 186 may electrically connect a peripheral conductive line 185 on the second interlayer dielectric 117 to the third impurity region 23. The peripheral conductive line 185 may be electrically connected to the bit line structure BLS.

FIGS. 16A to 17C illustrate processes in another example of a method of fabricating a semiconductor device according to the inventive concept.

Other than barrier layer 251 and oxidized barrier layer 251ox, elements and features in FIGS. 16A to 17C similar to those shown in and described with reference to FIGS. 1 to 15B will be designated by like reference numerals and detailed descriptions thereof will be omitted for the sake of brevity.

Referring to FIGS. 1 and 16A to 16C, a barrier layer 251x may be formed in the cell array region CAR and the peripheral circuit region PCR.

The barrier layer 251x in this example is formed by repeatedly and alternately stacking metal nitride layers 251m1, 251m2, 251m3 (hereinafter, a TiN layer is used as an example for description) and SiN layers 251s1, 251s2, 251s3. In this example, SiN layer 251s3 is the topmost part of the barrier layer 251x.

In some examples, the TiN layers 251m1, 251m2, 251m3 are formed using $TiCl_4$ and $NH_3$ pulses, and the SiN layers 251s1, 251s2, 251s3 are formed using DCS and $NH_3$ pulses.

Referring to FIGS. 1 and 17A to 17C, an oxidation process is performed on a surface of the barrier layer 251x (see FIG. 16A), thereby forming an oxidized barrier layer 251ox. The oxidized barrier layer 251ox shown in FIGS.

17A to 17C is the oxidized part of the barrier layer 251x, whereas barrier layer 251 is the part of the original barrier layer which remains as is, i.e., is not oxidized, at the conclusion of the oxidation process.

Figure 16A:
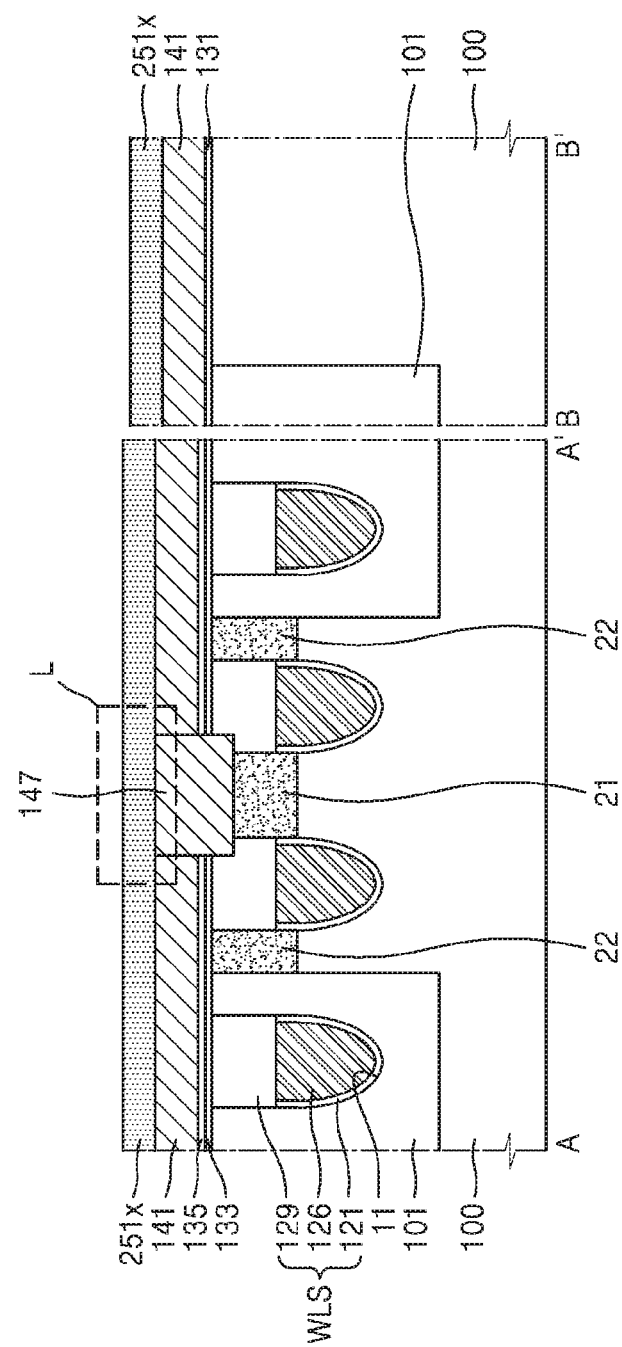
Figure 16B:
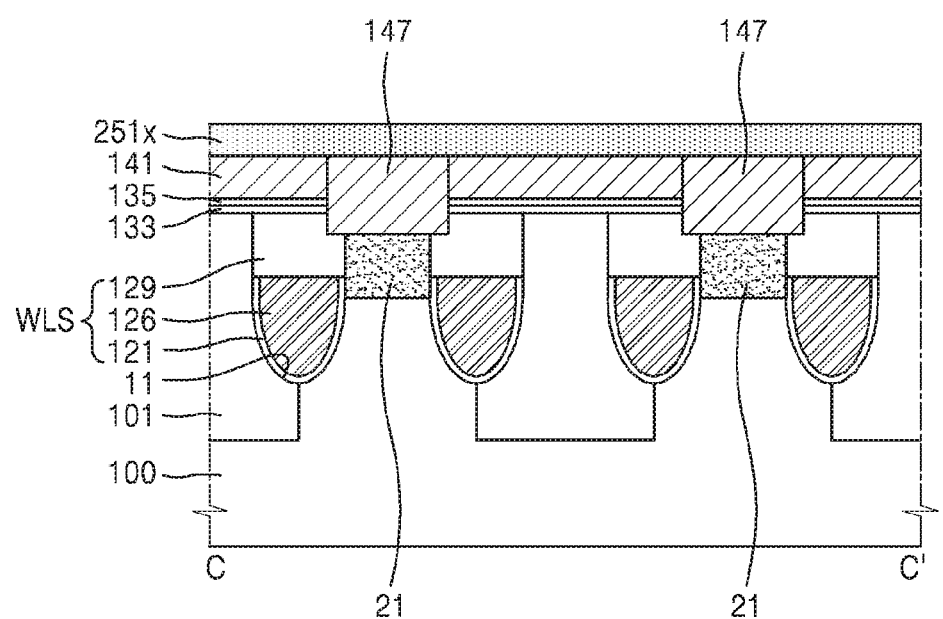
FIGS. 16B and 17B are sectional views each taken in the direction of line C-C' of FIG. 1.
Figure 16C:
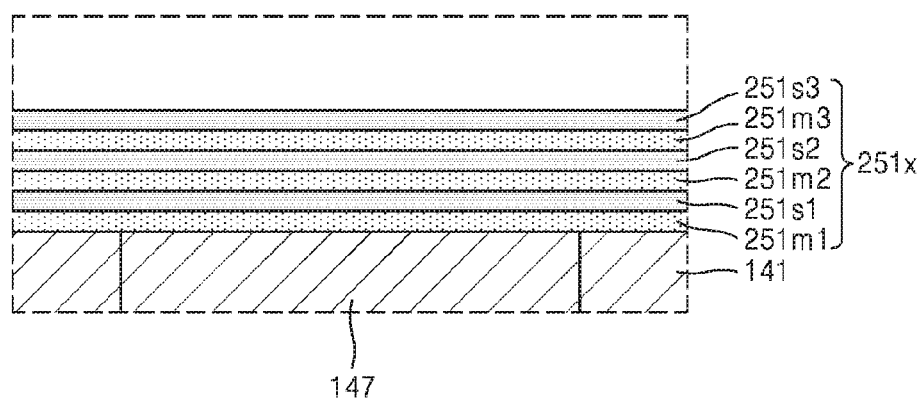
FIG. 16C is an enlarged view of region L of FIG. 16A.
Figure 17A:
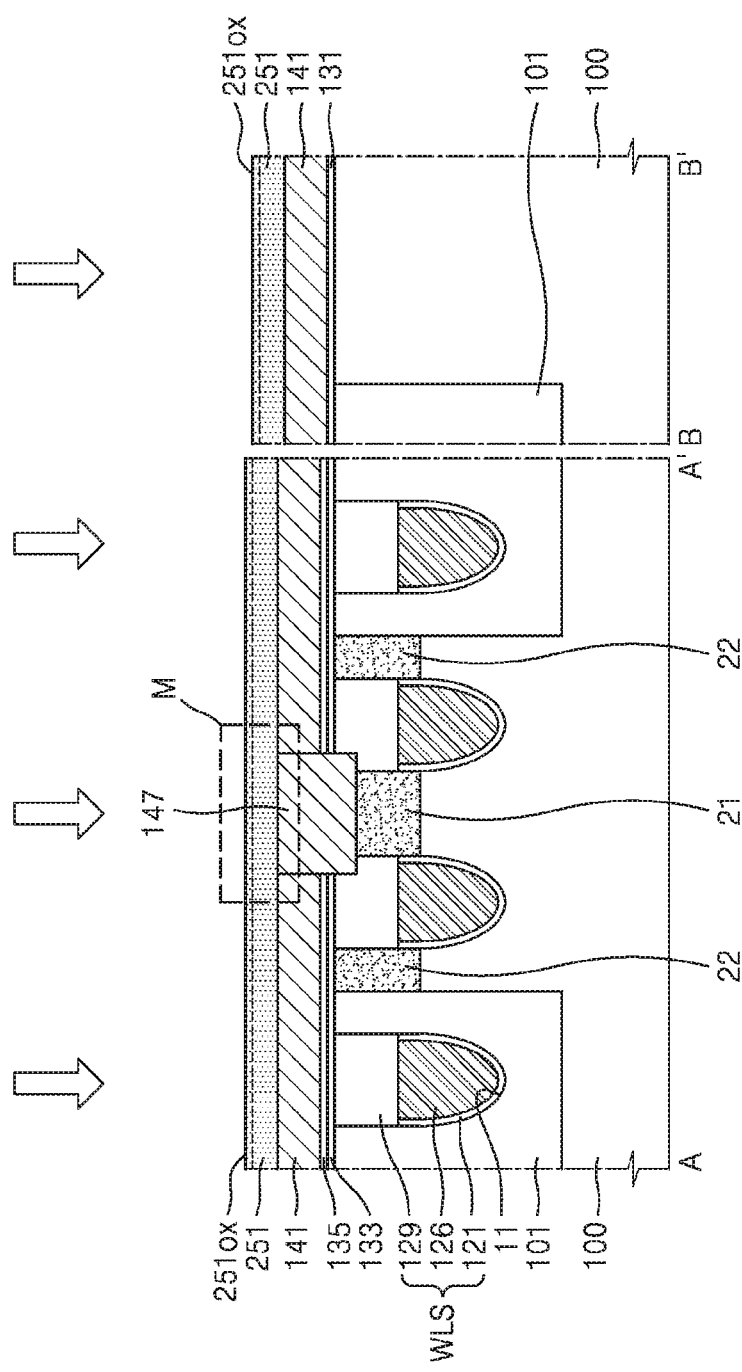
Figure 17B:
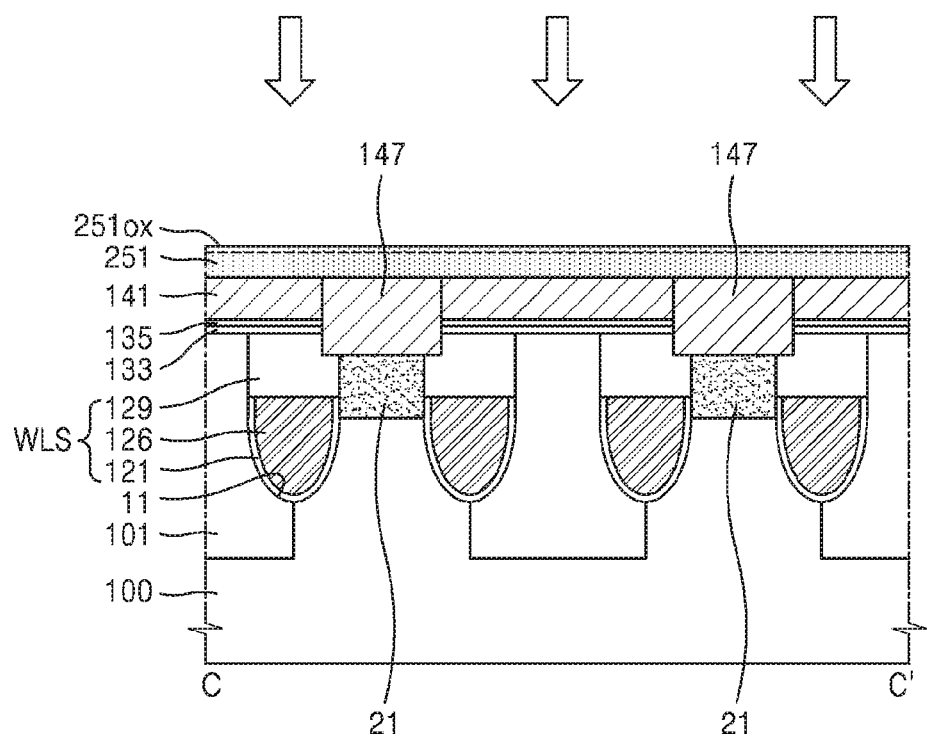
Figure 17C:
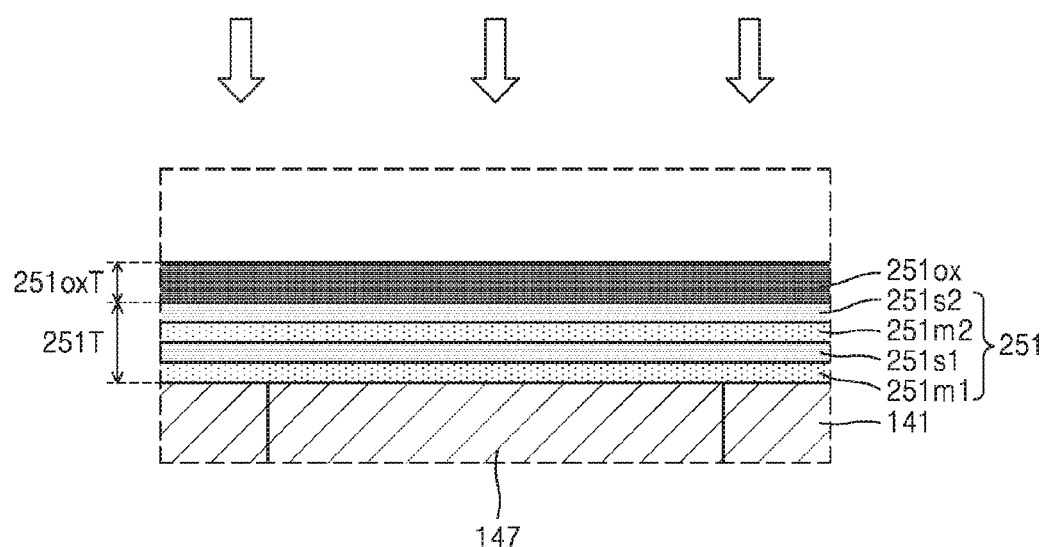

The oxidized barrier layer 251ox may be formed by oxidizing the uppermost SiN layer 251s3 shown in FIG. 16C and the TiN layer 251m3 adjoining the uppermost SiN layer 251s3. In this example, the oxidized barrier layer 251ox may include at least one of titanium oxynitride (TiON) and titanium silicon oxynitride (TiSiON), and silicon oxynitride (SiON).

In some examples, the oxidized barrier layer 251ox has a thickness 251oxT of about 1 Å to about 20 Å, and the barrier layer 251 has a thickness 251T of about 20 Å to about 70 Å. Also, the oxidation process may be a plasma oxidation, rapid thermal oxidation (RTO), or native oxidation process as described above.

FIGS. 18A to 19C illustrate processes of another method of fabricating a semiconductor device according to the inventive concept.

Other than barrier layer 351 and oxidized barrier layer 351ox, elements and features in FIGS. 18A to 19C similar to those shown in and described with reference to FIGS. 1 to 15B will be designated by like reference numerals and detailed descriptions thereof will be omitted for the sake of brevity.

Figure 18A:
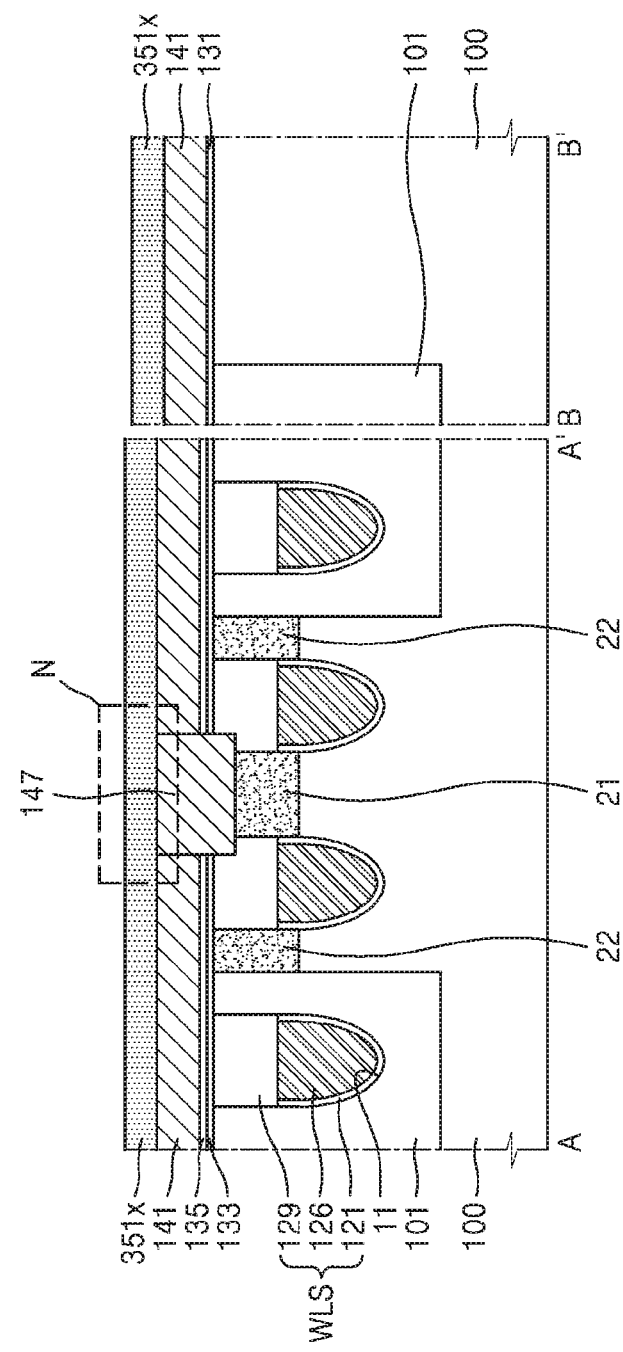
Figure 18B:
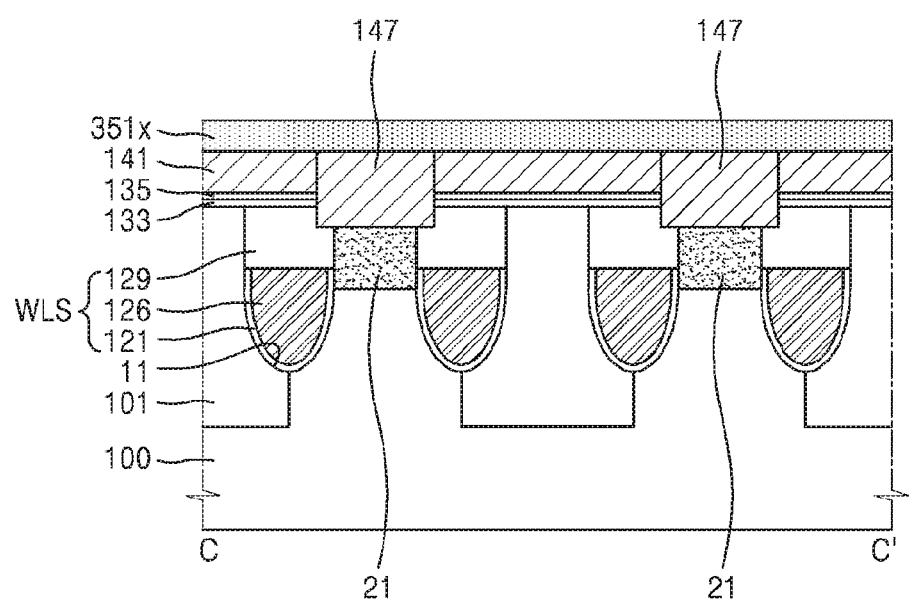
FIGS. 18B and 19B are sectional views each taken in the direction of line C-C' of FIG. 1.
Figure 18C:
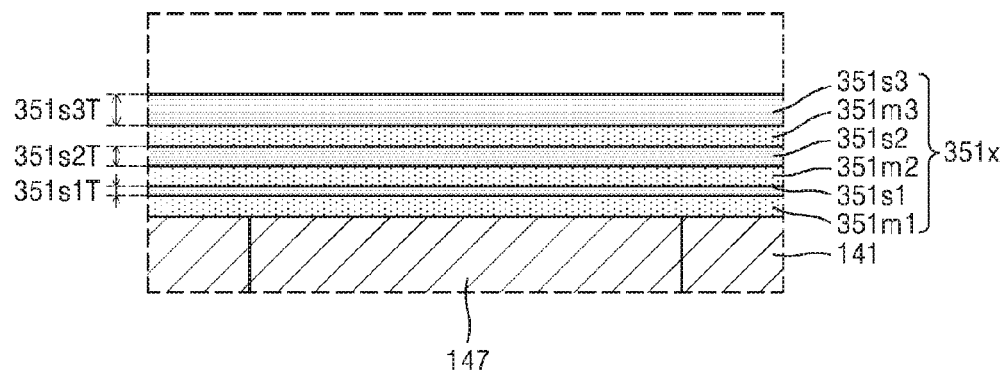
FIG. 18C is an enlarged view of region N of FIG. 18A.

Referring to FIGS. 18A to 18C, a barrier layer 351x may be formed in the cell array region CAR and the peripheral circuit region PCR.

A silicon concentration in the barrier layer 351x may continuously increase or decrease from an upper portion to a lower portion of the barrier layer 351x.

In some examples, the silicon concentration of the upper portion of the barrier layer 351x ranges from about 10 atm % to about 30 atm %, while the silicon concentration of the lower portion of the barrier layer 351x ranges from about 30 atm % to about 50 atm %. In other examples, the silicon concentration of the upper portion of the barrier layer 351x ranges from about 30 atm % to about 50 atm %, while the silicon concentration of the lower portion of the barrier layer 351x ranges from about 10 atm % to about 30 atm %.

To these ends, i.e., to form the barrier layer 351x such that the silicon concentration in the barrier layer 351x continuously increases or decreases from the upper portion to the lower portion thereof, TiN layers 351m1, 351m2, 351m3 and SiN layers 351s1, 351s2, 351s3 may be repeatedly and alternately stacked such that the silicon concentration in the barrier layer 351x is adjusted by adjusting the number of TiN cycles and the number of SiN cycles in one loop of an ALD process. In this example, the SiN layer 351s3 is the topmost part of the barrier layer 351x.

For example, the barrier layer 351x in which the silicon concentration is continuously increased from the lower portion to the upper portion of the barrier layer 351x may be realized by allowing each of the SiN layers 351s1, 351s2, 351s3 to have a gradually increasing thickness from the lower portion to the upper portion of the barrier layer 351x. That is, as shown in FIG. 18C, the thickness 351s3T of the SiN layer 351s3 may be greater than the thickness 351s2T of the SiN layer 351s2, and the thickness 351s2T of the SiN layer 351s2 may be greater than the thickness 351s1T of the SiN layer 351s1.

Figure 19A:
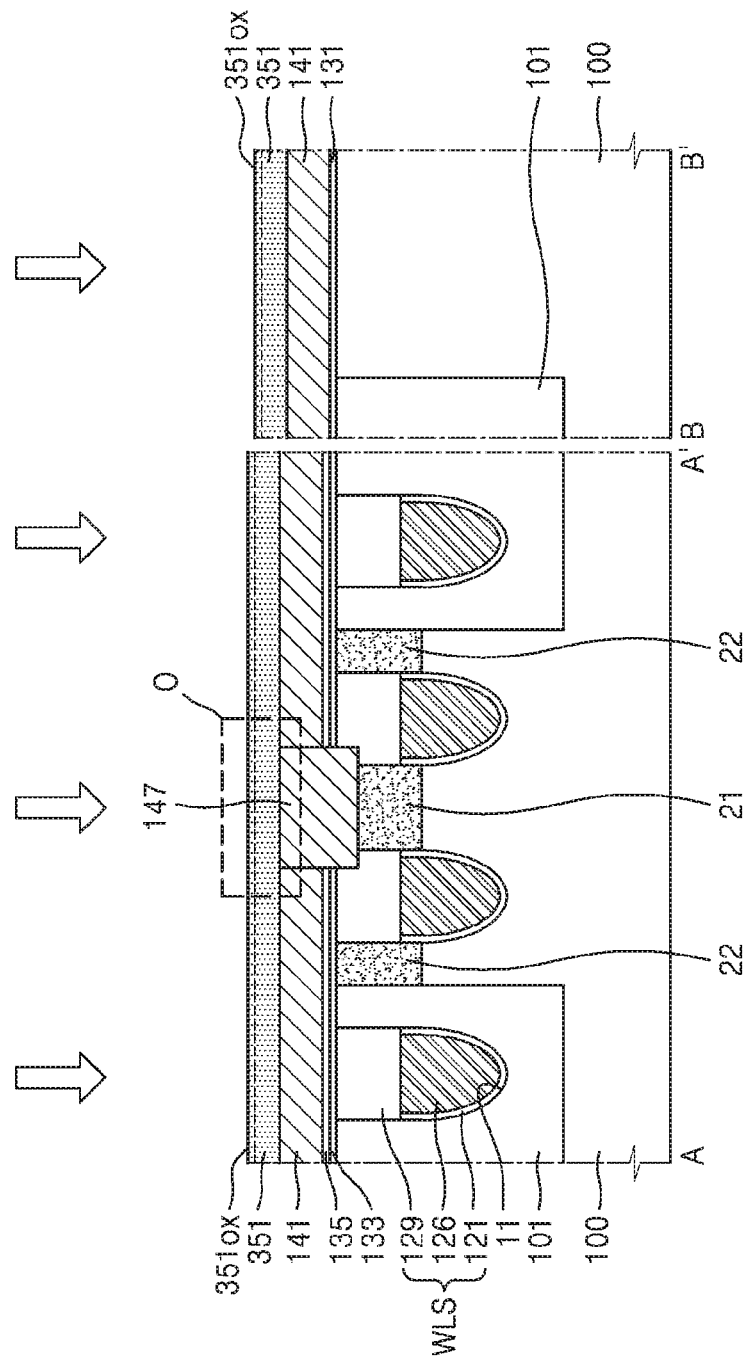
Figure 19B:
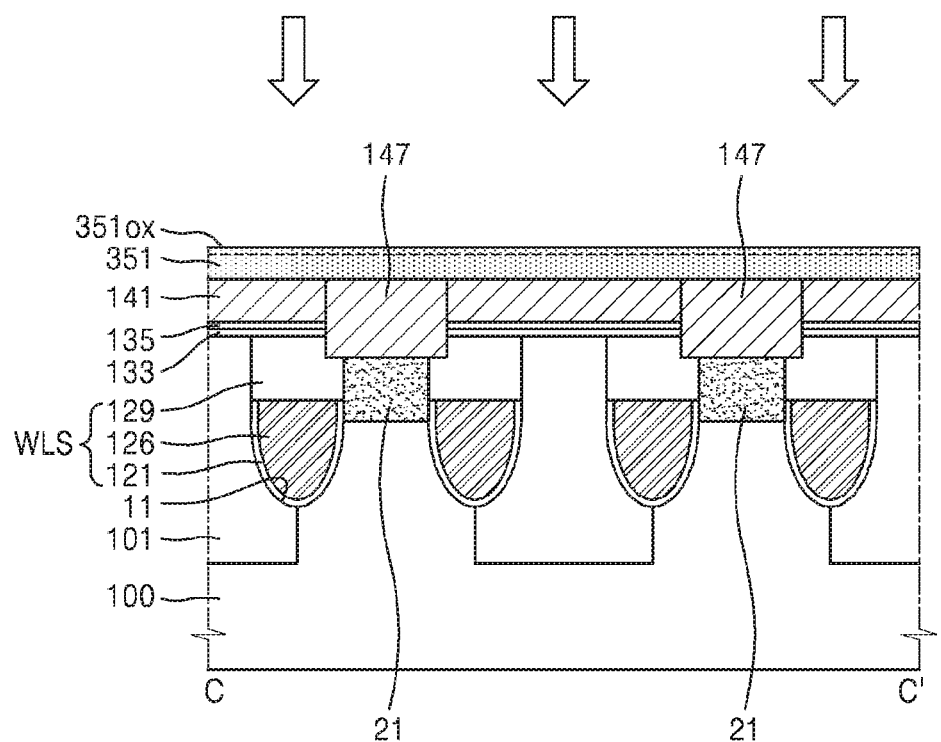
Figure 19C:
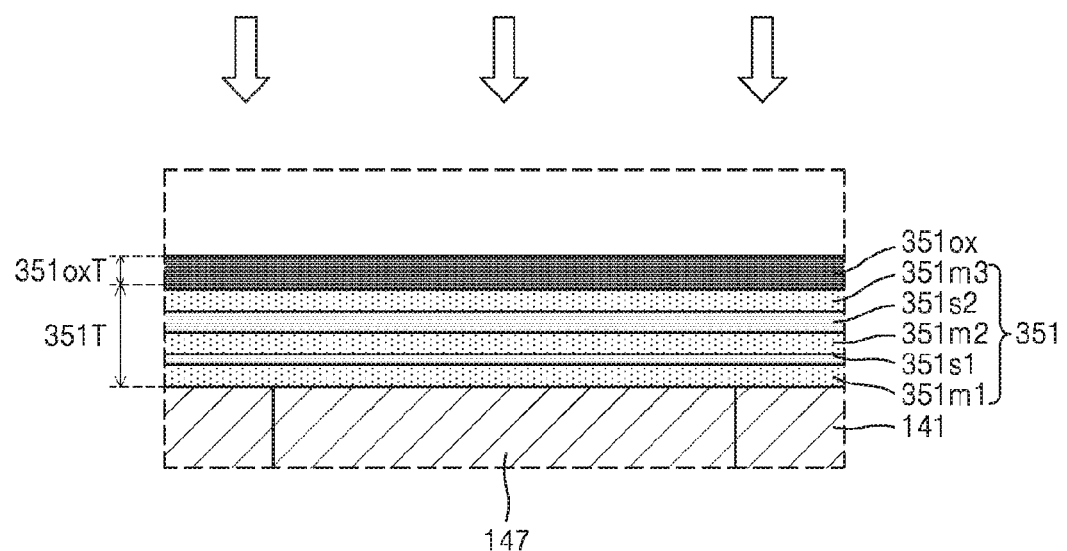

Referring to FIGS. 1 and 19A to 19C, an oxidation process is performed on a surface of the barrier layer 351x (see FIG. 18A), thereby forming an oxidized barrier layer 351ox. As with the previously described examples, the oxidized barrier layer 351ox shown in FIGS. 19A to 19C is the resulting oxidized part of the barrier layer 351x, whereas barrier layer 351 is that part of the barrier layer 351x which has not been oxidized at the conclusion of the oxidation process.

The oxidized barrier layer 351ox may be formed by oxidizing the uppermost SiN layer 351s3 of the barrier layer 351x. In this case, the oxidized barrier layer 351ox may consist of silicon oxynitride (SiON).

In some examples, the oxidized barrier layer 351ox may have a thickness 351oxT of about 1 Å to about 20 Å, and the barrier layer 351 may have a thickness 351T of about 20 Å to about 70 Å. Also, the oxidation process may be a plasma oxidation, rapid thermal oxidation (RTO), or native oxidation process as described above.

Figure 20:
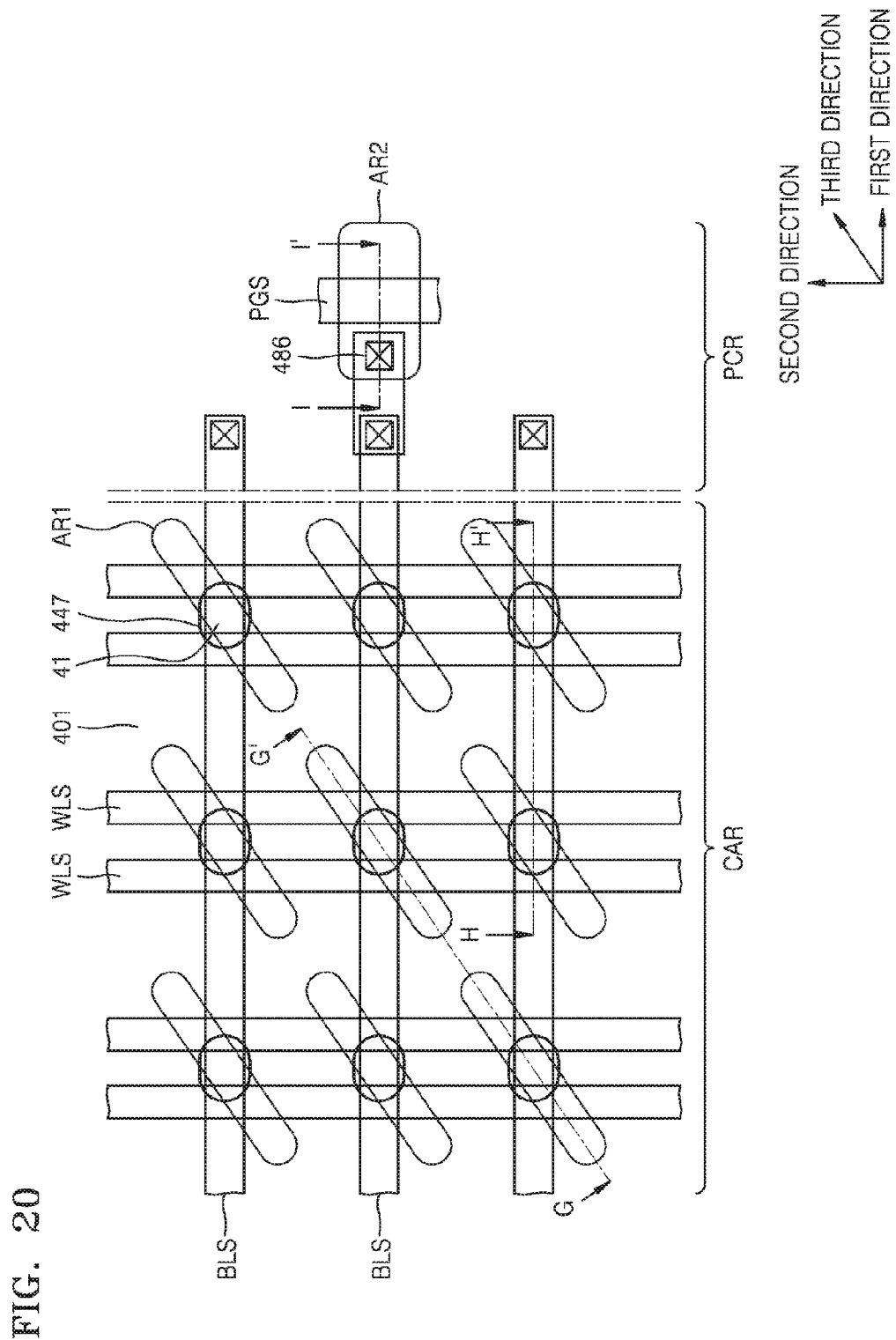
FIG. 20 is a plan view of an exemplary portion of other semiconductor devices that may be fabricated according to the inventive concept.

FIG. 20 shows an exemplary layout of a cell array region CAR and a peripheral circuit region PCR of other examples of semiconductor devices that may be fabricated according to the inventive concept. However, even the specific shape of elements and features and the layout of the cell array region CAR and peripheral circuit region PCR shown in FIG. 20 are merely illustrative and not limitative of the inventive concept.

FIGS. 21A to 26B illustrate an example of a method of fabricating a semiconductor device having the layout shown in FIG. 20, according to the inventive concept.

Figure 21A:
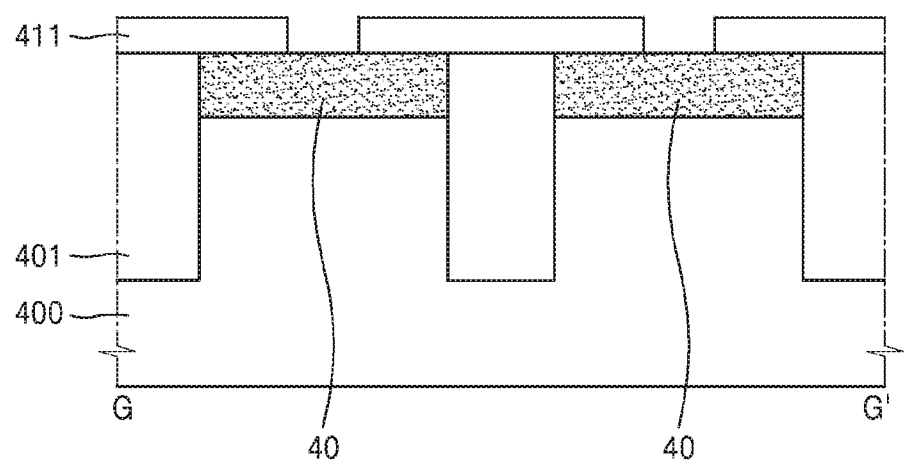
Figure 21B:
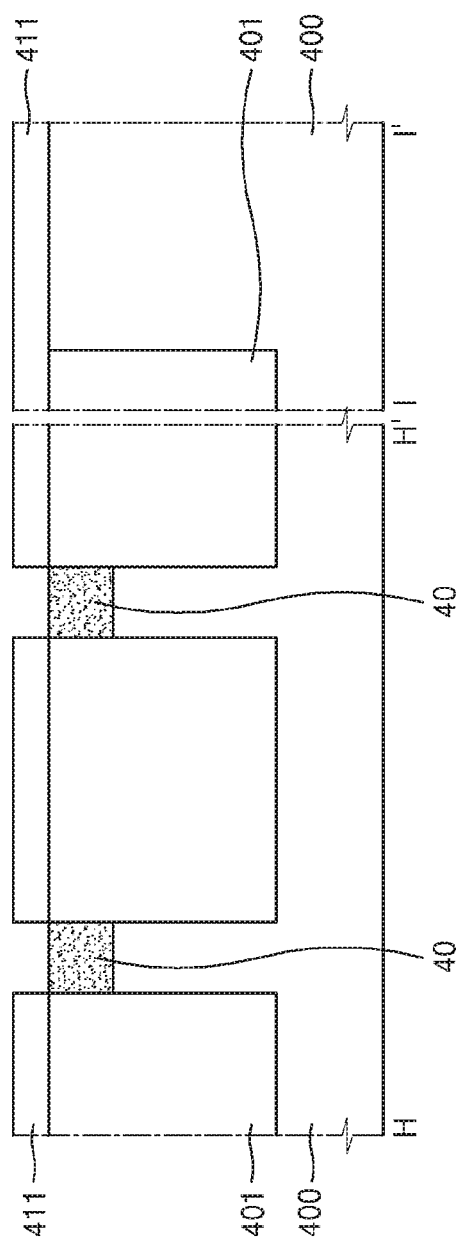

Referring to FIGS. 20, 21A, and 21B, a device isolation film 401 is formed in a substrate 400, whereby first active regions AR1 may be defined in a cell array region CAR, and a second active region AR2 may be defined in a peripheral circuit region PCR.

The substrate 400 may include Si, for example, crystalline Si, polycrystalline Si, or amorphous Si. In some examples, the substrate 400 may include a semiconductor such as Ge, or a compound semiconductor such as SiGe, SiC, GaAs, InAs, or InP.

The device isolation film 401 may be a shallow trench isolation (STI) region for improving a speed and a degree of integration of a device.

An impurity region 40 may be formed at upper portions of the first active regions AR1. The impurity region 40 may be formed by implanting impurity ions into an upper portion of the substrate 400.

A mask pattern 411, which includes openings exposing the impurity regions 40, may be formed on the cell array region CAR. Each of the openings of the mask pattern 411 may extend along a second direction as indicated in FIG. 20 and may expose the impurity regions 40 along the second direction. The mask pattern 411 may cover the peripheral circuit region PCR.

Figure 22A:
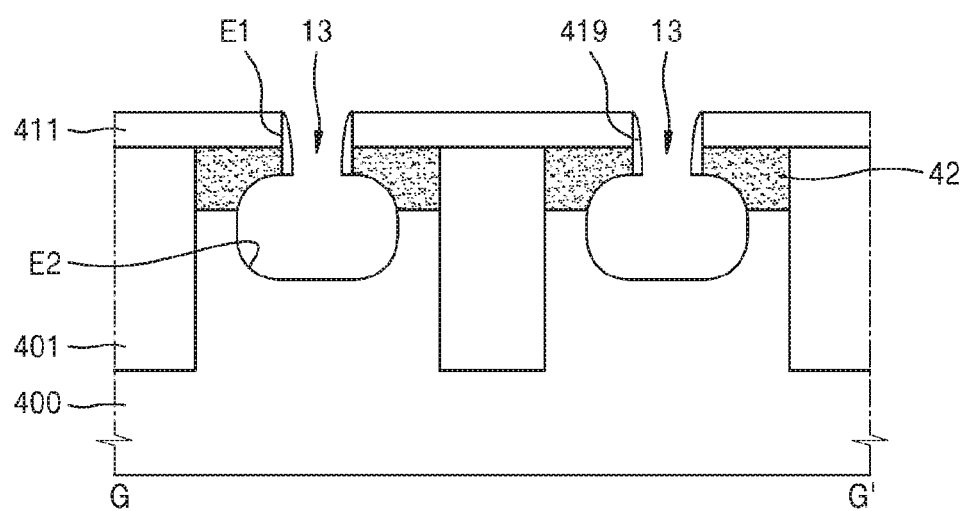
Figure 22B:
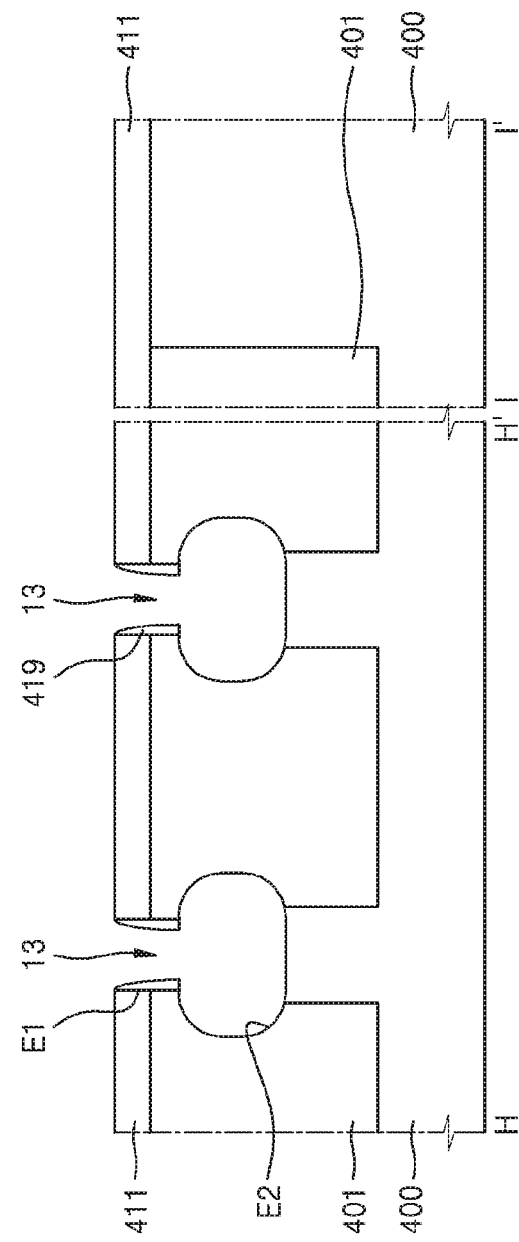

Referring to FIGS. 20, 22A, and 22B, trenches 13 may be formed in the substrate 400 by using the mask pattern 411 as an etch mask. The trenches 13 may extend along the second direction as spaced from each other in a first direction. The trenches 13 may have a shape in which a width at an upper side thereof is less than a width at a lower side thereof.

Forming the trenches 13 may include a plurality of etching processes. For example, first, the upper surface of the substrate, which is exposed by the mask pattern 411, is etched by anisotropic etching, thereby forming a first etch region E1. Next, a protective spacer 419 is formed along the sides of the first etch region E1, followed by performing isotropic etching of the substrate 400 exposed by the protective spacer 419, thereby forming a second etch region E2 which extends from the first etch region E1 and is wider than the first etch region E1. Upon forming the second etch region E2, the device isolation film 401 may be partially etched. As a result of the forming of the trenches 13, second impurity regions 41 separated from each other are formed from the impurity region 40 (see FIGS. 21A and 21B).

Figure 23A:
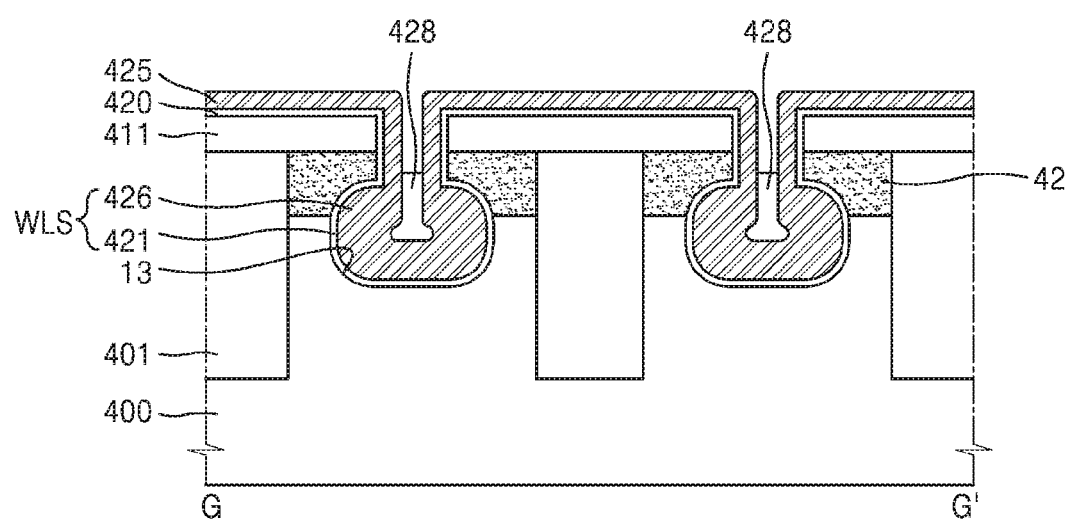
Figure 23B:
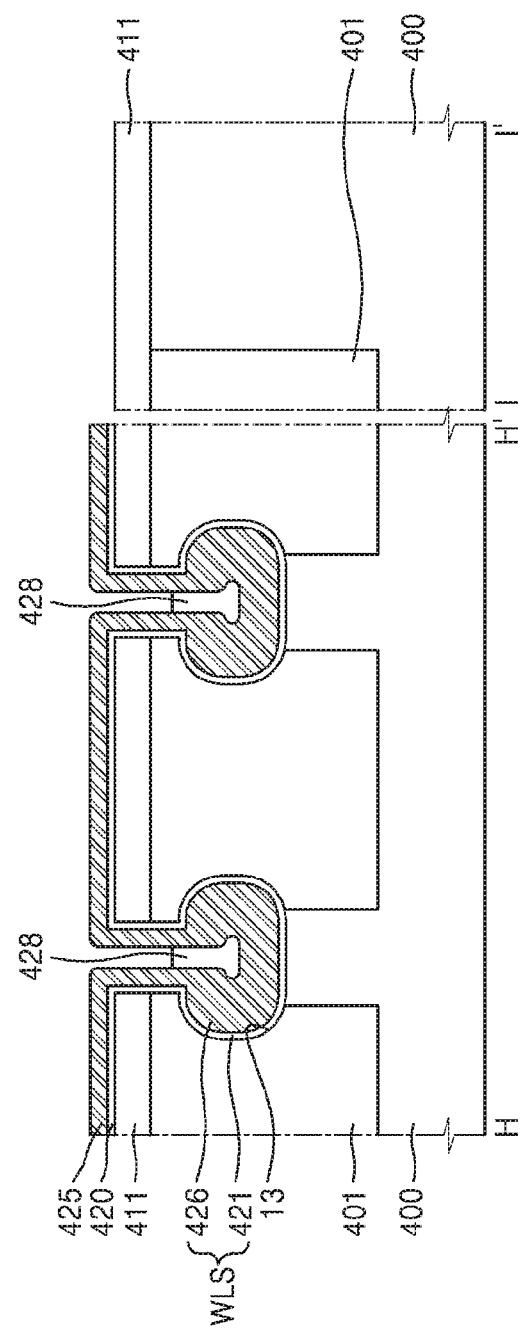

Referring to FIGS. 20, 23A, and 23B, a gate dielectric layer 420, a conductive layer 425, and a buried layer 428 may be formed in the stated order in the trenches 13.

In some examples, the gate dielectric layer 420 includes a silicon oxide layer, a high permittivity (high-k) dielectric layer, or the like. In other examples, the gate dielectric layer 420 is a composite layer having a double structure of a silicon oxide layer and a silicon nitride layer, or a surface-nitrided silicon oxide layer.

The conductive layer 425 may include at least one material selected from the group consisting of doped polysilicon, metals, metal nitrides, and metal silicides.

The buried layer 428 may include at least one of silicon oxide, silicon nitride, and silicon oxynitride. The buried layer 428 may be formed by forming an insulating layer (not shown) on the conductive layer 425, followed by recessing the insulating layer such that an upper surface of the insulating layer is situated at a level beneath that of the upper surface of the substrate 400.

Each of the gate dielectric layer 420, the conductive layer 425, and the buried layer 428 may be formed by any appropriate method such as physical vapour deposition (PVD), chemical vapour deposition (CVD), or atomic layer deposition (ALD).

Figure 24A:
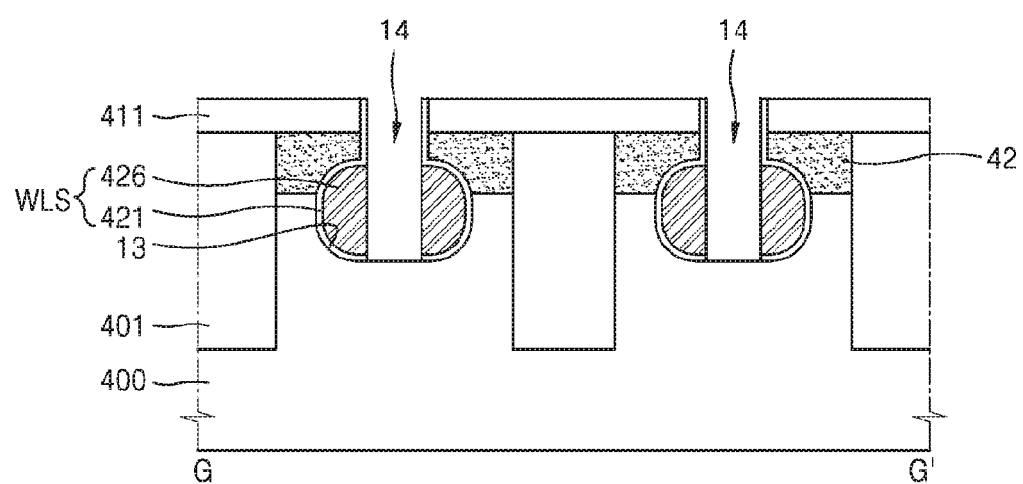
Figure 24B:
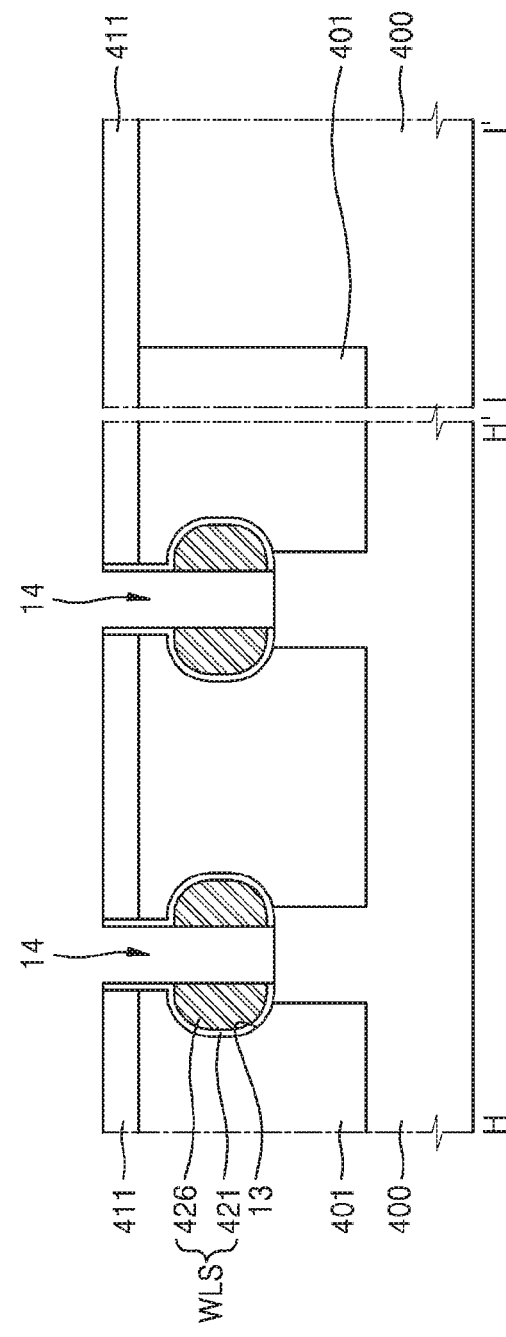

Referring to FIGS. 20, 24A, and 24B, a portion of the conductive layer 425, which is located above an upper surface of the buried layer 428, may be removed. A portion of the conductive layer 425, which is located below the upper surface of the buried layer 428, may remain. Removing the portion of the conductive layer 425 may be performed by isotropic etching.

Next, the buried layer 428 may be removed, followed by performing anisotropic etching of the remaining conductive layer 425 using the mask pattern 411 as an etch mask, thereby forming cell gate structures separated by the trenches 14. The cell gate structures may be word line structures WLS. The word line structures WLS may have mirror symmetry with respect to the one trench 14 located therebetween.

Figure 25A:
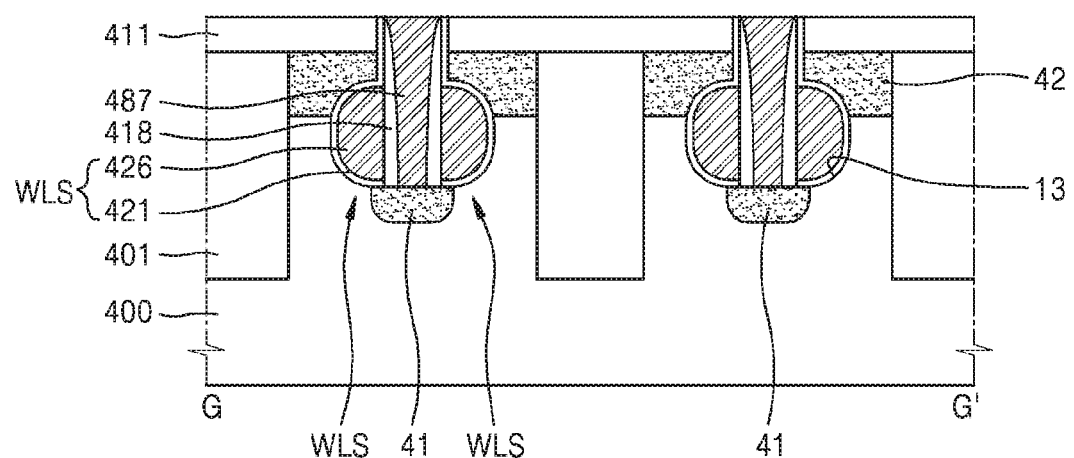
Figure 25B:
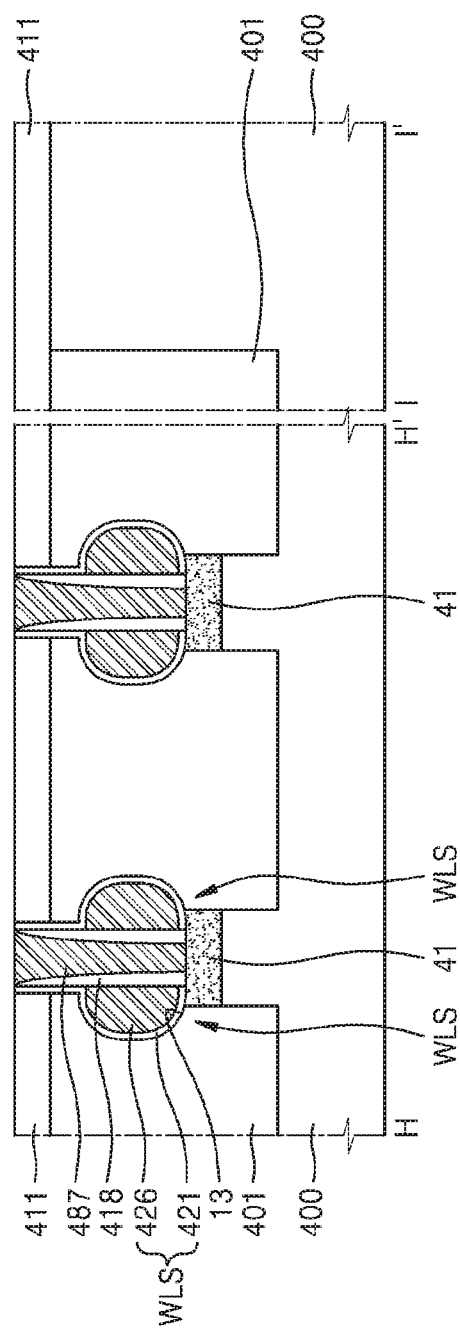

Referring to FIGS. 20, 25A, and 25B, a trench spacer 418 may be formed on sides of the trenches 14, followed by forming first impurity regions 41 in some regions of the substrate 400 exposed by the trenches 14.

Next, contact patterns 487, which fill the trenches 14 and are connected to the first impurity regions 41, may be formed on the resultant product in which the first impurity regions 41 are formed. The contact patterns 487 may extend in the second direction along the word line structures WLS. The contact patterns 487 may be formed by forming a conductive layer filling the trenches 14, followed by performing planarization until the mask pattern 411 is exposed. The trench spacer 418 may include at least one of silicon oxide, silicon nitride, and silicon oxynitride. The contact patterns 487 may include at least one material selected from the group consisting of metals, conductive metal nitrides, and doped semiconductors.

Figure 26A:
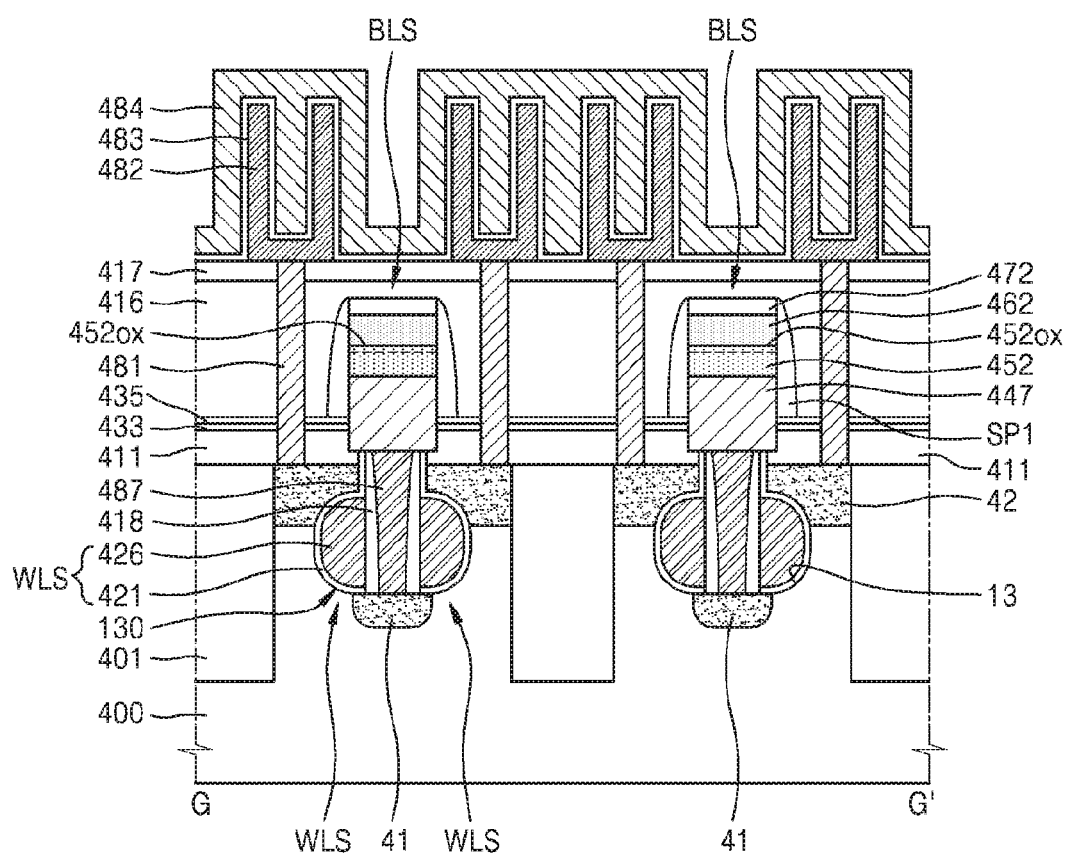
Figure 26B:
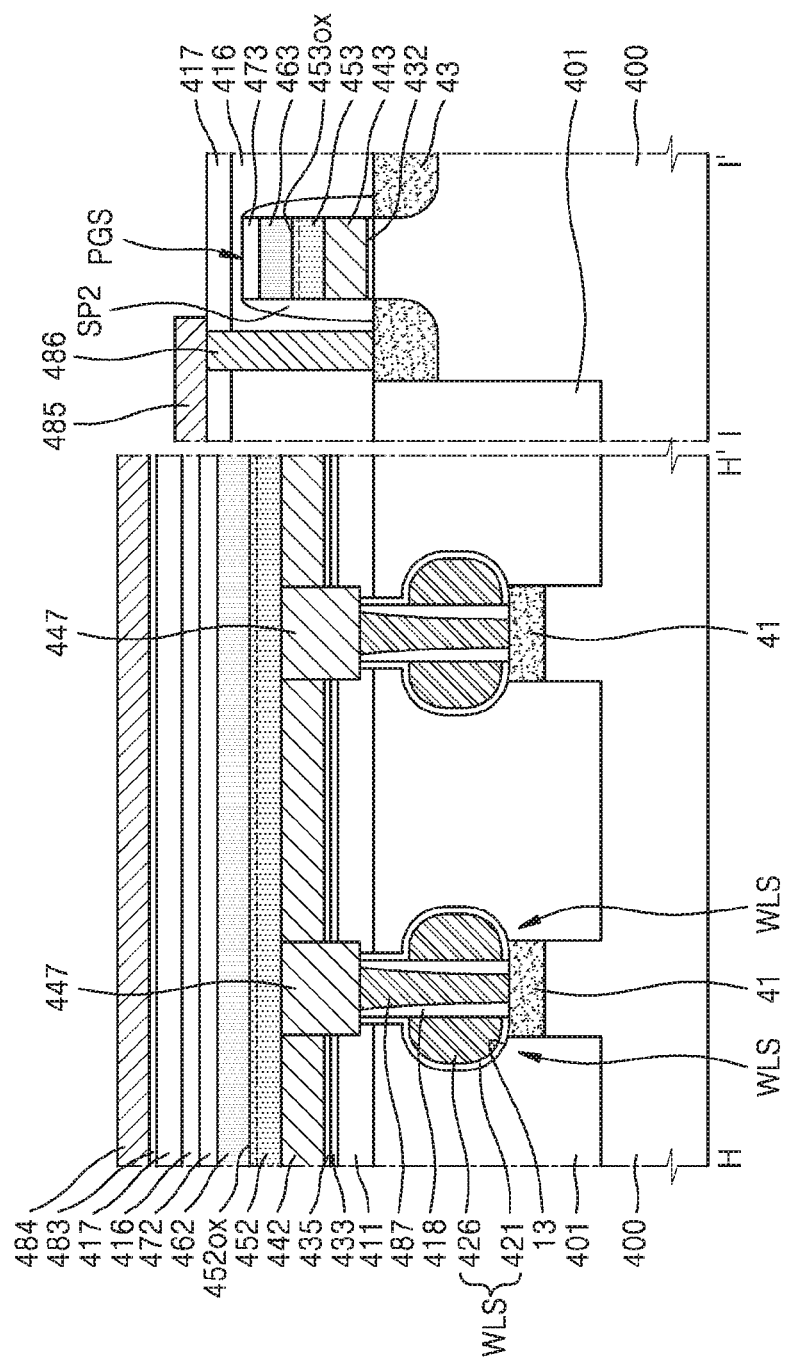

Referring to FIGS. 20, 26A, and 26B, a bit line structure BLS may be formed on the cell array region CAR, and a peripheral gate structure PGS may be formed on the peripheral circuit region PCR.

The bit line structure BLS may include a first conductive pattern 442, a barrier pattern 452, an oxidized barrier pattern 452ox, a second conductive pattern 462, and a capping pattern 472, and may be connected to the contact patterns 487 of the substrate 400 through a direct contact 447. The peripheral gate structure PGS may include a gate dielectric film 432, a first conductive pattern 443, a barrier pattern 453, an oxidized barrier pattern 453ox, a second conductive pattern 463, and a capping pattern 473.

The bit line structure BLS and the peripheral gate structure PGS may be formed by processes similar to those described with reference to FIGS. 10A to 13B.

Capacitors connected to the second impurity regions 42 by first contacts 481 may be formed on the cell array region CAR. The capacitors may include lower electrodes 482, an upper electrode 484, and an insulating layer 483 interposed between the lower electrodes 482 and the upper electrode 484.

A peripheral conductive line 485 connected to a third impurity region 43 by second contacts 486 may be formed on the peripheral circuit region PCR. The capacitors, the contacts 481, 482, and the peripheral conductive line 485 may be formed by processes similar to those described with reference to FIGS. 14A to 15B.

Figure 27:
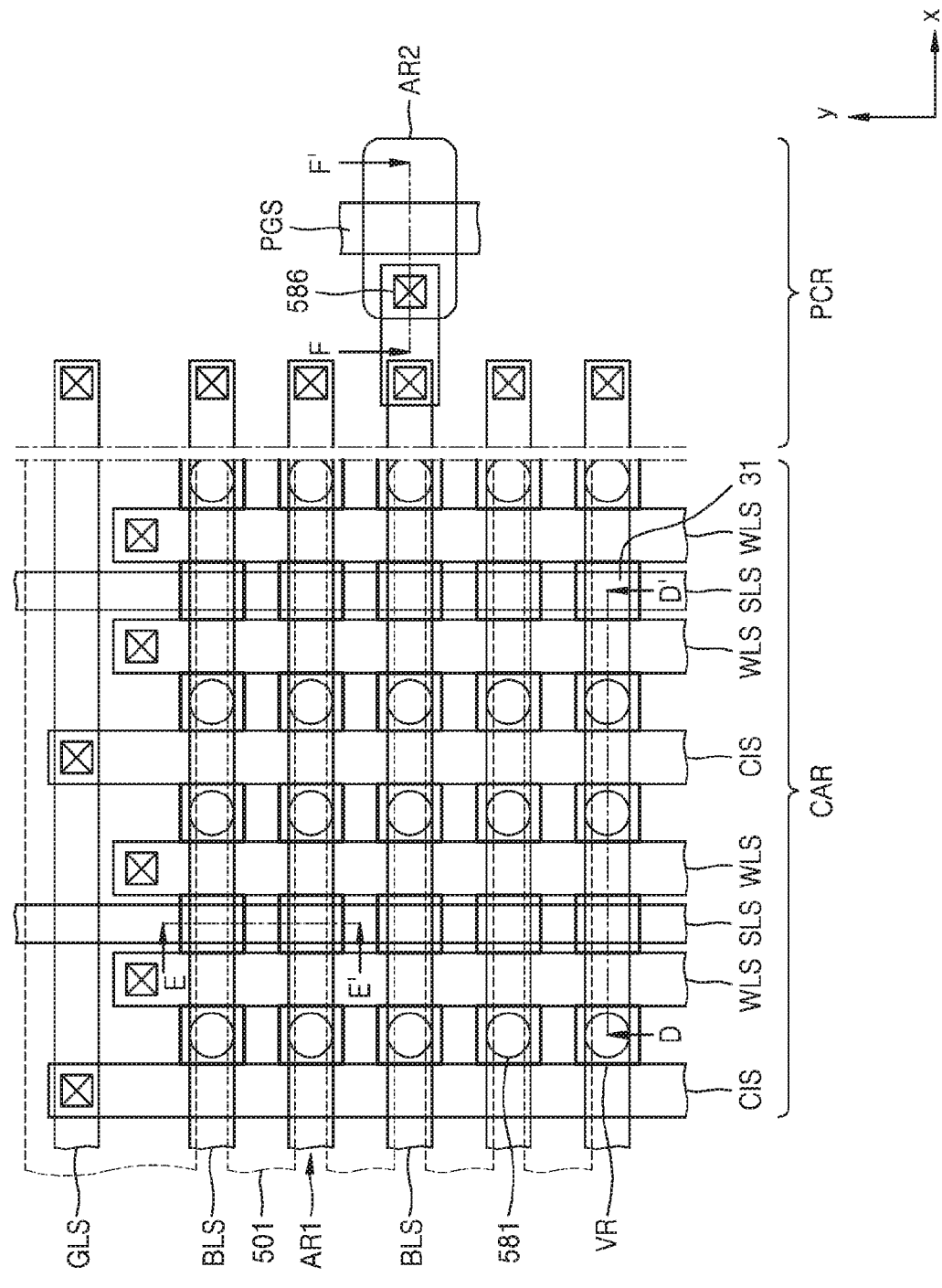
FIG. 27 is a plan view showing an exemplary portion of other semiconductor devices that may be fabricated according to the inventive concept.

FIG. 27 shows an exemplary layout of still other semiconductor devices that may be fabricated according to the inventive concept.

FIGS. 28A to 37B illustrate an example of a method of fabricating a semiconductor device having the layout shown in FIG. 27, according to the inventive concept. As has already been stated with respect to the examples described above, the specific shape and layout of elements and features of a cell array region CAR and a peripheral circuit region PCR shown in FIG. 27 are merely illustrative and not limitative of the inventive concept.

Figure 28A:
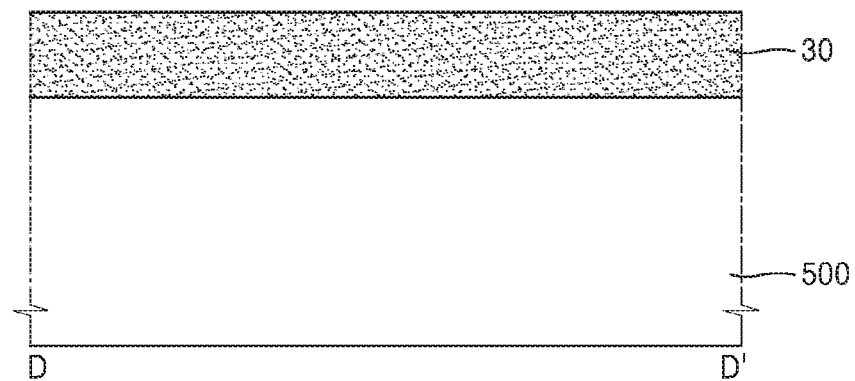
Figure 28B:
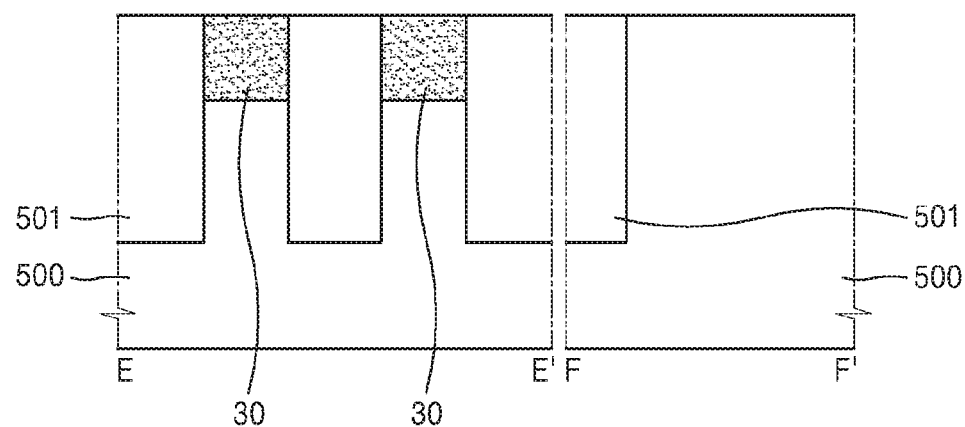

Referring to FIGS. 27, 28A, and 28B, a device isolation film 501 is formed in a substrate 500, whereby a first active region AR1 may be defined in the cell array region CAR, and a second active region AR2 may be defined in the peripheral circuit region PCR. The first active region AR1 and the device isolation film 501 may be linear patterns extending longitudinally in a first direction. An impurity region 30 may be formed at an upper portion of the first active region AR1.

Figure 29A:
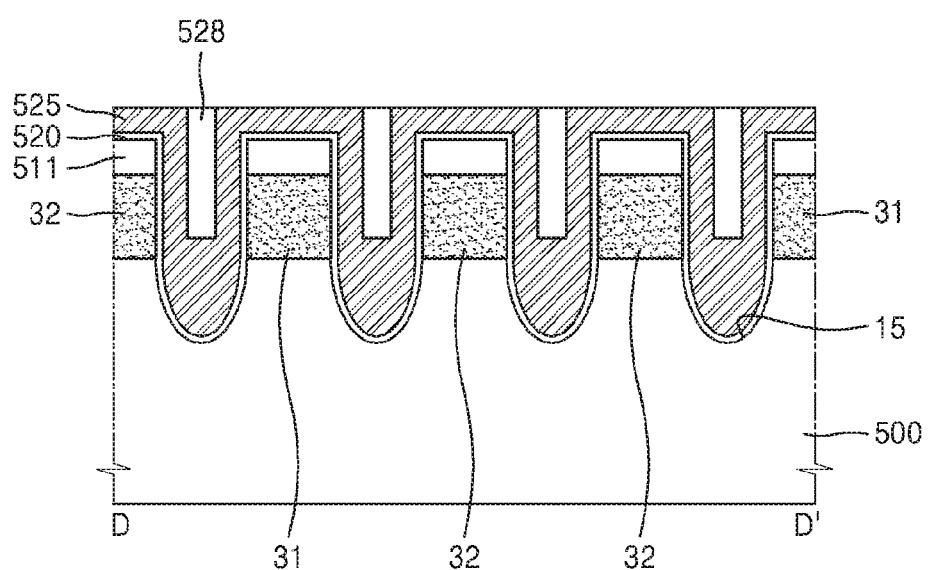
Figure 29B:
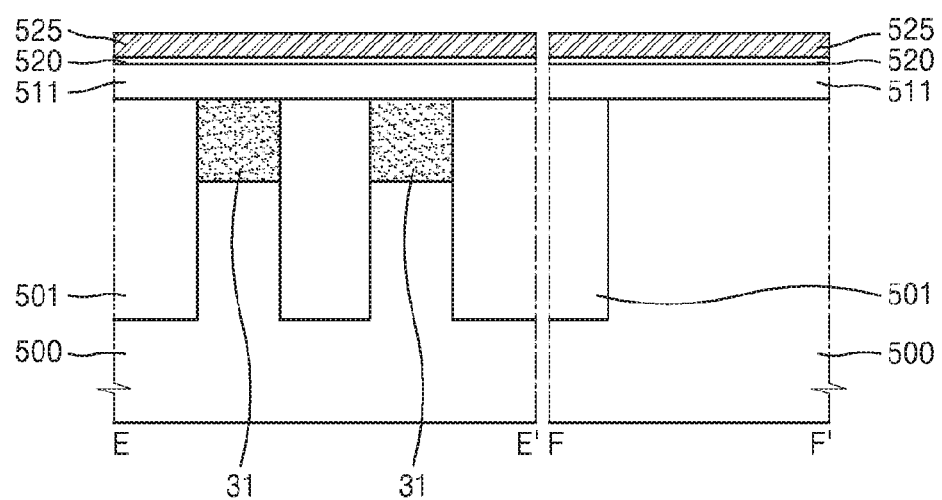

Referring to FIGS. 27, 29A, and 29B, trenches 15 extending in a second direction may be formed on the cell array region CAR. The trenches 15 may be formed by etching the substrate 500 using a mask pattern 511 as an etch mask.

A gate dielectric layer 520, a conductive layer 525, and a buried layer 528 may be formed in the stated order in the trenches 15.

In some examples, the gate dielectric layer 520 includes a silicon oxide layer, a high permittivity (high-k) dielectric layer, or the like. In other examples, the gate dielectric layer 520 is a composite layer having a double structure of a silicon oxide layer and a silicon nitride layer, or a surface-nitrided silicon oxide layer.

The conductive layer 525 may include at least one material selected from the group consisting of doped polysilicon, metals, metal nitrides, and metal silicides.

The buried layer 128 may include at least one of silicon oxide, silicon nitride, and silicon oxynitride. The buried layer 528 may be formed by forming an insulating layer (not shown) on the conductive layer 525, followed by recessing the insulating layer such that an upper surface of the insulating layer is situated at a level that is lower than that of the upper surface of the substrate 500.

Each of the gate dielectric layer 520, the conductive layer 525, and the buried layer 528 may be formed by an appropriate method such as physical vapour deposition (PVD), chemical vapour deposition (CVD), or atomic layer deposition (ALD).

Figure 30A:
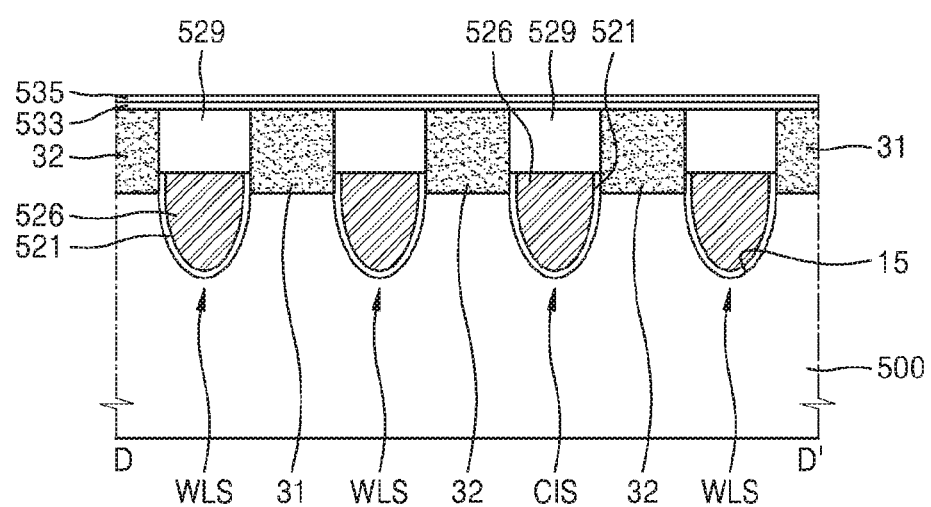
Figure 30B:
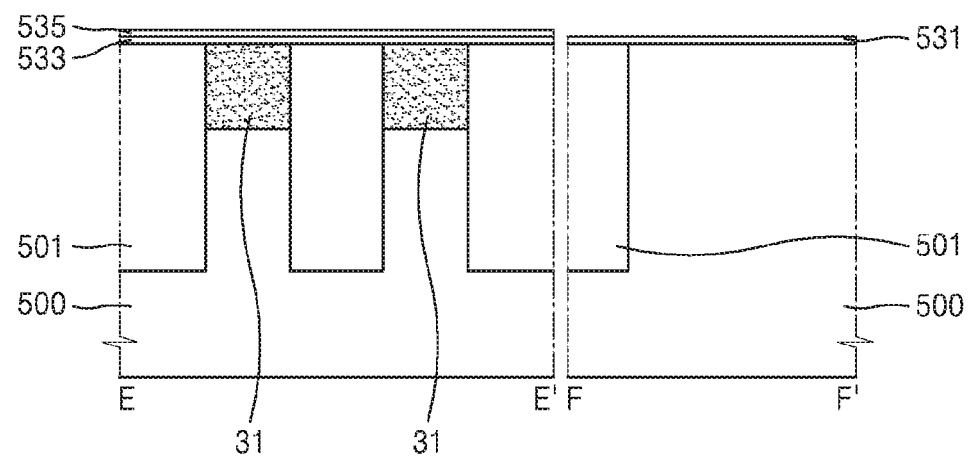

Referring to FIGS. 27, 30A, and 30B, the gate dielectric layer 520 and the conductive layer 525 may be etched to be confined within the trenches 15. As a result of the etching process, the gate dielectric layer 520 is separated into gate dielectric films 521 spaced from each other, and the conductive layer 525 may is separated into gate electrodes 526 spaced from each other. The etching process may be performed until the buried layer 528 is removed, and as a result, upper surfaces of the gate dielectric films 521 and the gate electrodes 526 may be situated at a level below that of the upper surface of the substrate 500.

Gate capping patterns 529 may be formed on the gate electrodes 526. As a result of forming the gate capping patterns 529, gate structures may be formed in the trenches 15. The gate structures may include word line structures WLS and split gate structures CIS. The word line structures WLS and the split gate structures CIS may have substantially the same structure. In a planar perspective, a pair of the word line structures WLS may be formed between the adjoining split gate structures CIS.

The split gate structures CIS may be structures providing insulation between the word line structures WLS. In both reading and writing operations of the semiconductor device, a ground voltage (GND) or a negative voltage may be applied to the split gate structures CIS. For example, a voltage applied to the split gate structures CIS may be substantially the same as a voltage applied to an unselected word line (unselected-WL). In other examples, the voltage applied to the split gate structures CIS may be smaller than the voltage applied to the unselected word line (unselected-WL). The split gate structures CIS may be connected to each other by a connection conductive pattern GL and thus be in a substantially equipotential state.

The impurity regions 30 are separated by the word line structures WLS and the split gate structures CIS, whereby first impurity regions 31 may be formed between the word line structures WLS, and second impurity regions 32 may be formed between the split gate structures CIS.

The first impurity regions 31 may be impurity regions separated from each other along the second direction between the word line structures WLS. The second impurity regions 32 may be impurity regions separated from each other along the second direction between the word line structures WLS and the split gate structures CIS. In some examples, one of the first and second impurity regions 31, 32 may be a source region, and the other of the first and second impurity regions 31, 32 may be a drain region.

After the word line structures WLS and the split gate structures CIS are formed, a first insulating layer 533 and a second insulating layer 535 may be formed in the stated order on the substrate 500 in the cell array region CAR and the peripheral circuit region PCR, followed by removing the first insulating layer 533 and the second insulating layer 535 in the peripheral circuit region PCR, thereby exposing the upper surface of the substrate 500 again. Next, while the cell array region CAR is covered with a mask pattern (not shown), a gate dielectric layer 531 is formed on the substrate 500 in the peripheral circuit region PCR.

The first insulating layer 533 may include an oxide film, and the second insulating layer 535 may include a nitride film, but are not limited thereto.

The gate dielectric layer 531 may be a silicon oxide layer, a high permittivity (high-k) dielectric layer, or the like. Alternatively, the gate dielectric layer 531 may be a composite layer having a double structure of a silicon oxide layer and a silicon nitride layer, or a surface-nitrided silicon oxide layer.

Figure 31A:
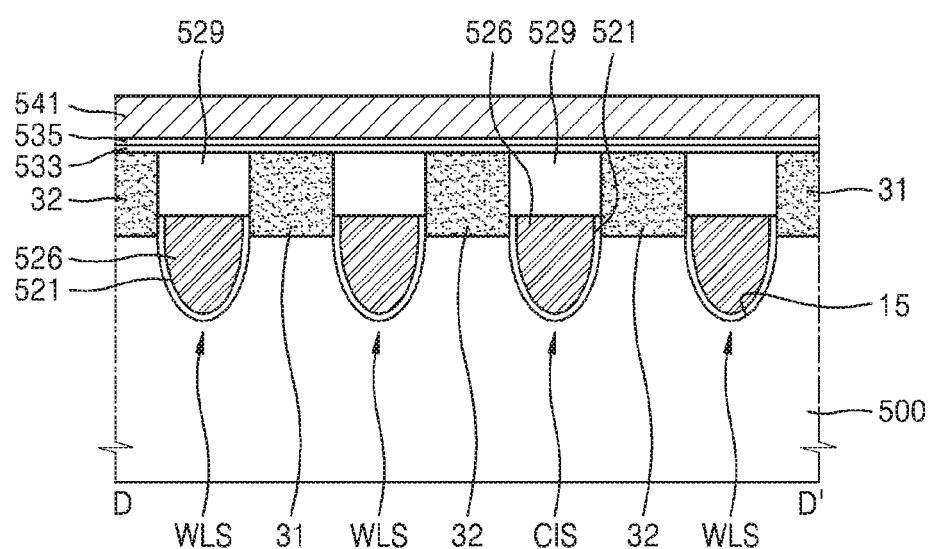
Figure 31B:
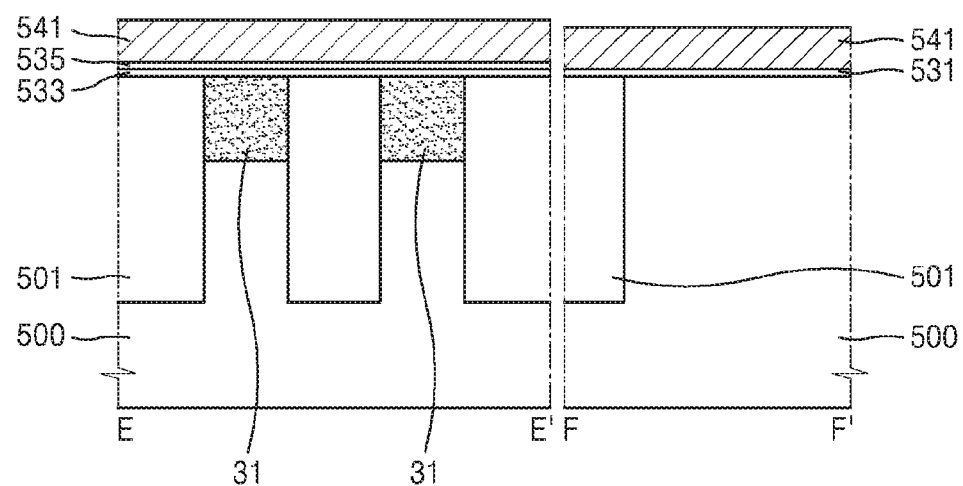

Referring to FIGS. 27, 31A, and 31B, a first semiconductor layer 541 is formed on the cell array region CAR and the peripheral circuit region PCR.

The first semiconductor layer 541 may include doped polysilicon but is not being limited thereto.

Figure 32A:
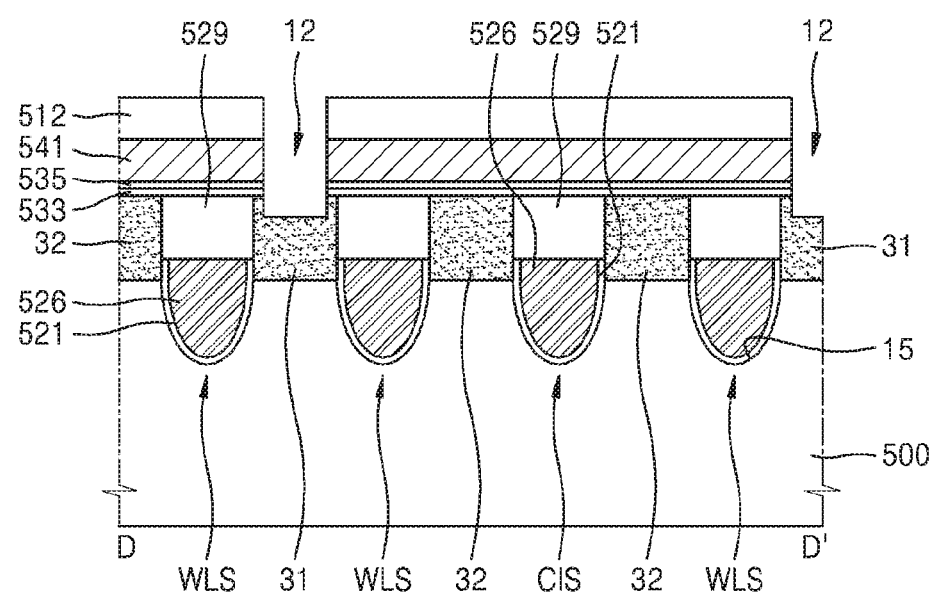
Figure 32B:
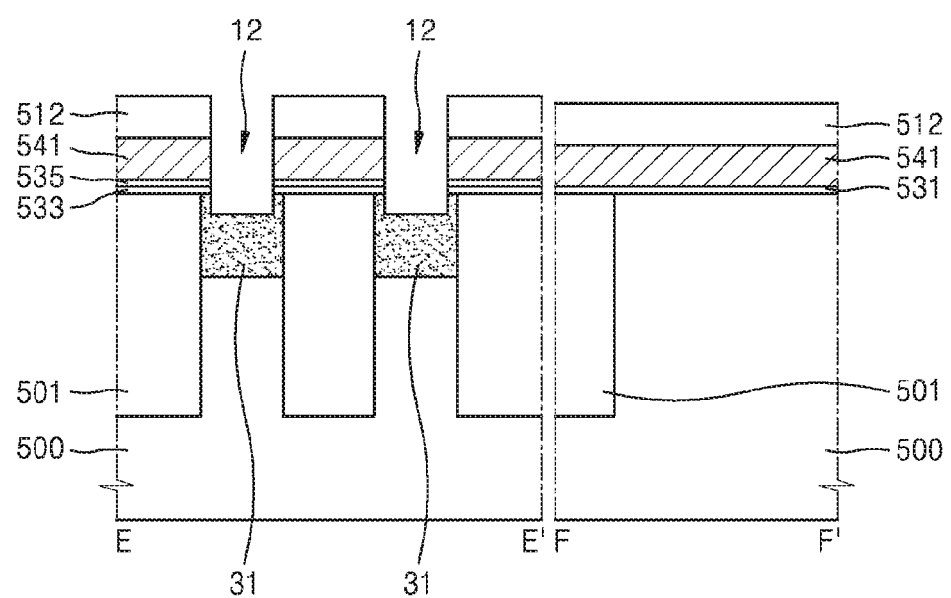

Referring to FIGS. 27, 32A, and 32B, a mask pattern 512 is formed on the first semiconductor layer 541 in the cell array region CAR and the peripheral circuit region PCR. An opening, which partially exposes the first semiconductor layer 541 in the cell array region CAR, may be formed in the mask pattern 512. The peripheral circuit region PCR may be covered with the mask pattern 512 and thus may not be exposed to the outside of the semiconductor device.

Next, the first semiconductor layer 541 exposed through the opening of the mask pattern 512 is etched, followed by etching a portion of the substrate 500 exposed as a result of the etching, thereby forming a contact hole exposing the first impurity region 31 in the cell array region CAR. The contact hole may have a circular or elliptical shape in a planar perspective. The mask pattern 512 may include a hard mask pattern including an oxide film or a nitride film. To form the mask pattern 512, a photolithography process may be used.

Figure 33A:
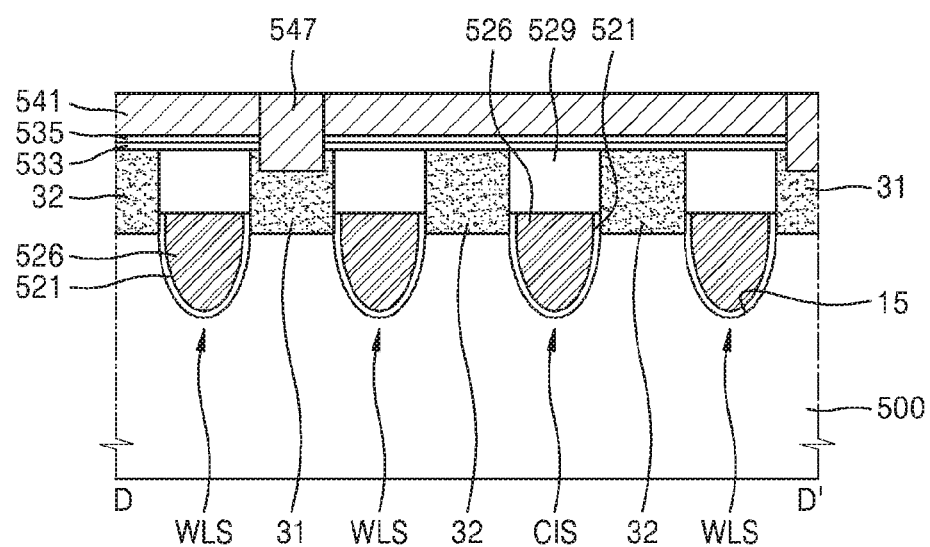
Figure 33B:
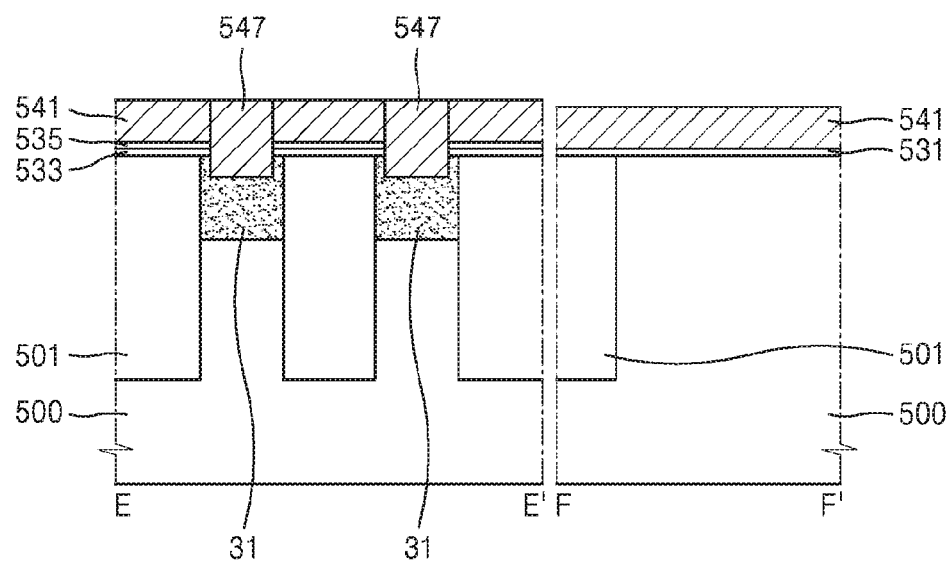

Referring to FIGS. 27, 33A, and 33B, the mask pattern 512 is removed, followed by forming a conductive layer to a sufficient thickness to fill the contact hole and cover an upper surface of the first semiconductor layer 541. Next, the conductive layer is etched-back so as to remain only in the contact hole, thereby forming a contact 547. The contact 547 may include doped polysilicon but is not limited thereto. In some examples, the contact 547 is of the same material as the first semiconductor layer 541.

Figure 34A:
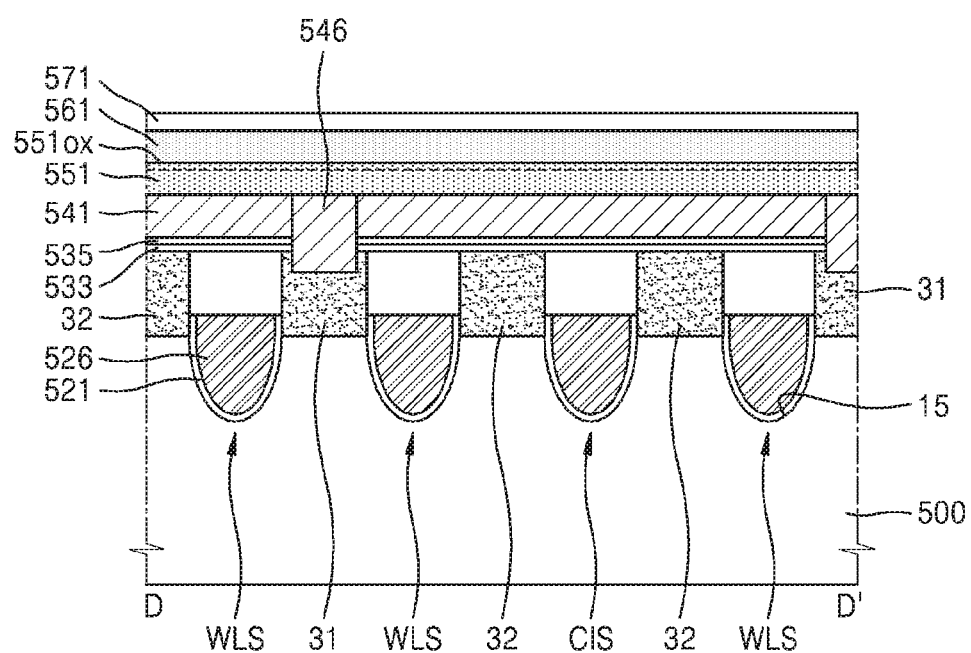
Figure 34B:
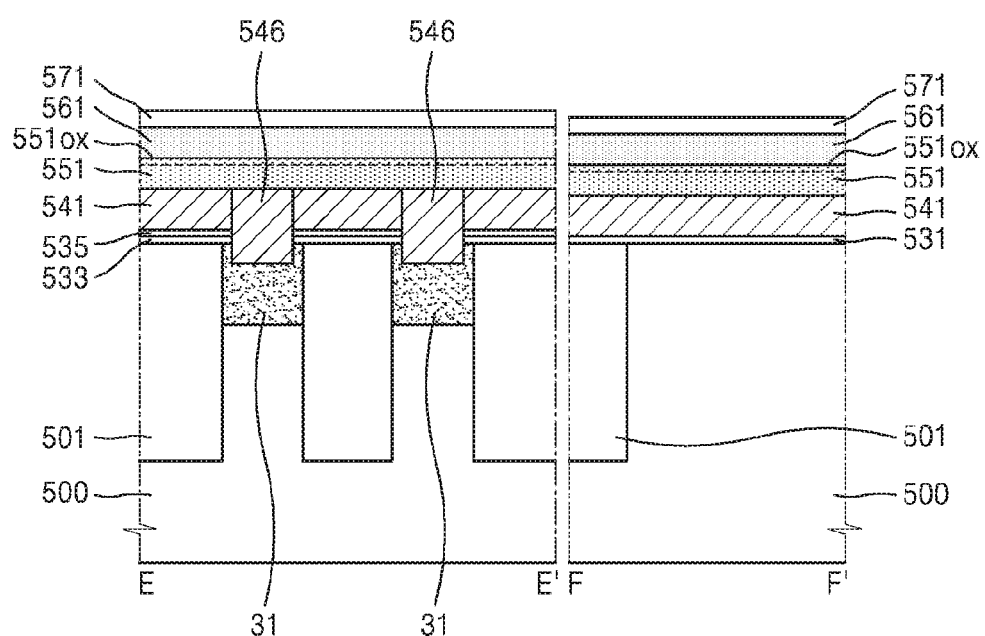

Referring to FIGS. 27, 34A, and 34B, a barrier layer 551, an oxidized barrier layer 551ox, a metal layer 561, and a capping layer 571 may be formed in the stated order on the cell array region CAR and the peripheral circuit region PCR. Each of the processes of forming the barrier layer 551, the oxidized barrier layer 551ox, the metal layer 561, and the capping layer 571 may be similar to each of the processes of forming the barrier layer 151, the oxidized barrier layer 151ox, the metal layer 161, and the capping layer 171 as described above with reference to FIGS. 10A to 12B.

Figure 35A:
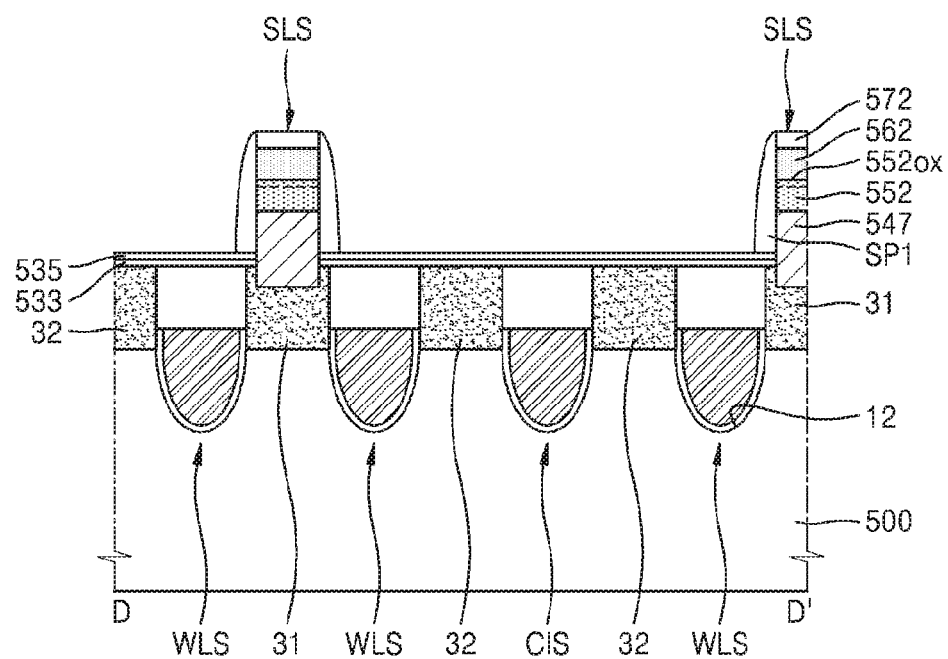
Figure 35B:
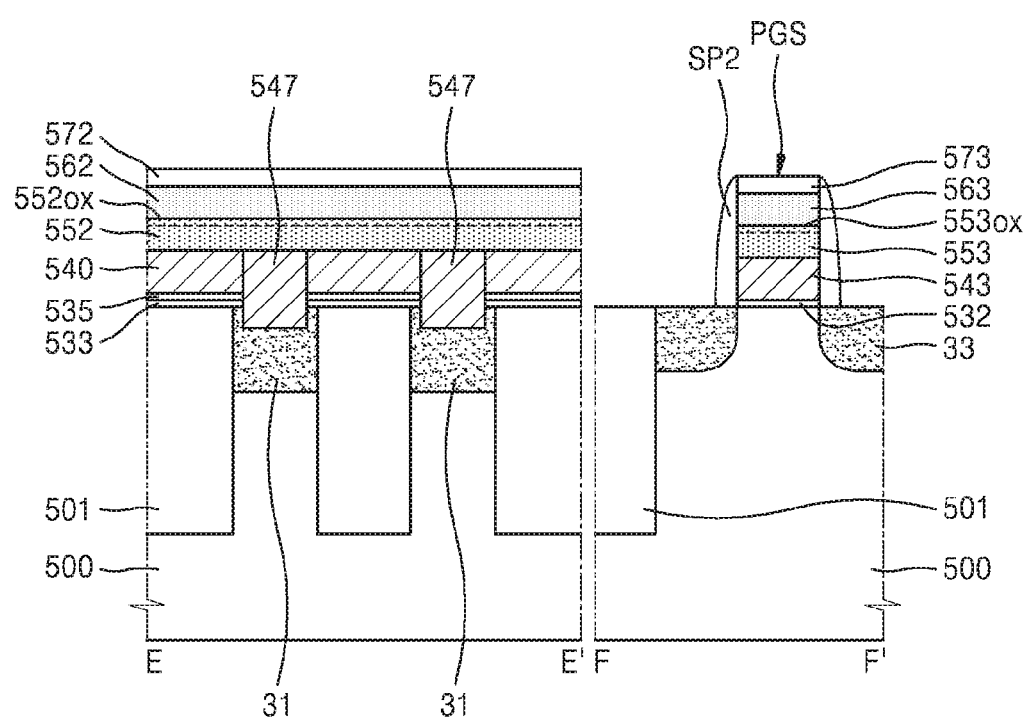

Referring to FIGS. 27, 35A, and 35B, a source line structure SLS may be formed in the cell array region CAR by patterning the first semiconductor layer 541, the barrier layer 551, the oxidized barrier layer 551ox, the metal layer 561, and the capping layer 571, and a peripheral gate structure PGS may be formed in the peripheral circuit region PCR. The source line structure SLS may be connected to the first impurity region 31 of the substrate 500 through the contact 547.

Forming the source line structure SLS and the peripheral gate structure PGS may include forming a first spacer SP1 on sides of the source line structure SLS and forming a second spacer SP2 on sides of the peripheral gate structure PGS.

A third impurity region 33 may be formed in the peripheral circuit region PCR adjoining the peripheral gate structure PGS. The third impurity region 33 may be formed by implanting impurity ions, which have the same conductivity type as that of the first conductive pattern 543, into the substrate 100 exposed by the peripheral gate structure PGS.

Figure 36A:
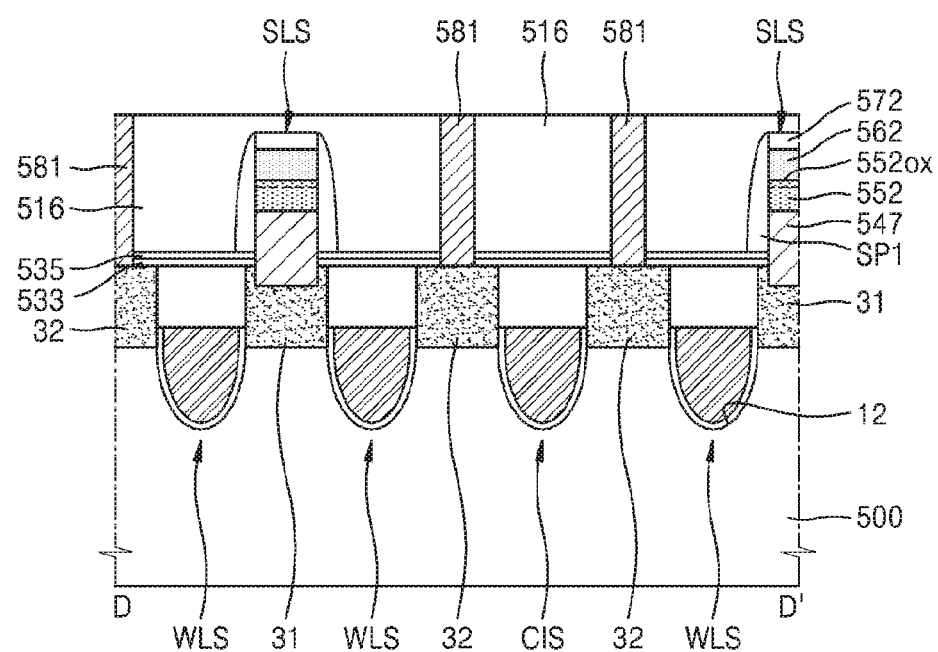
Figure 36B:
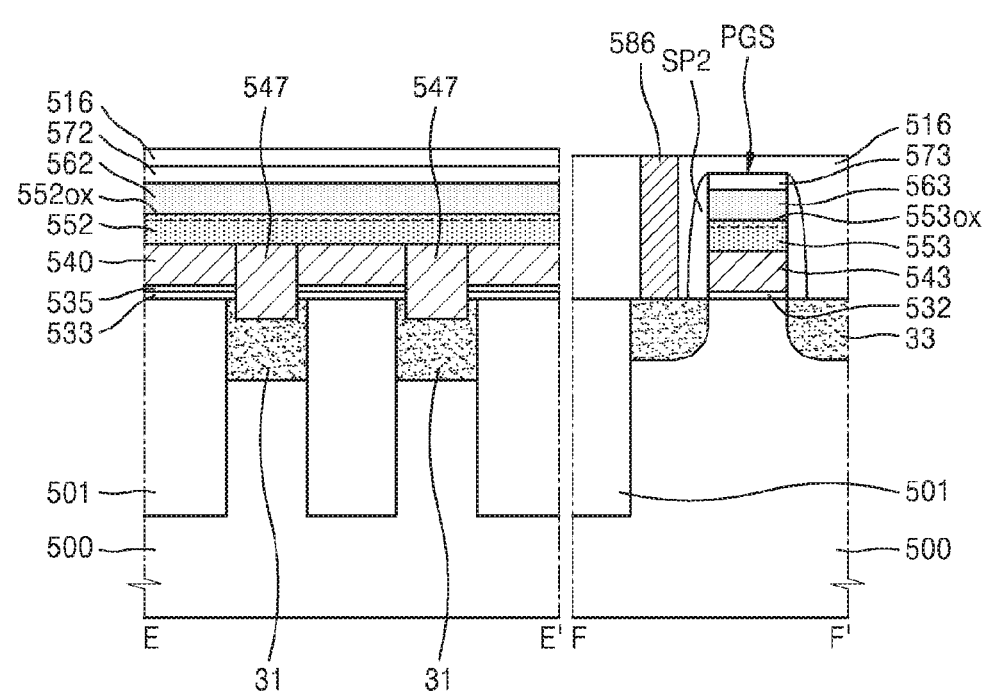

Referring to FIGS. 27, 36A, and 36B, a first interlayer dielectric 516, which covers the source line structure SLS and the peripheral gate structure PGS, may be formed, and first contacts 581, which extend through the first interlayer dielectric 516, the first insulating layer 533, and the second insulating layer 535 to be connected to the second impurity regions 32, may be formed. The first contacts 581 may be formed simultaneously with second contacts 586 connected to the third impurity region 33 of the peripheral circuit region PCR.

Figure 37A:
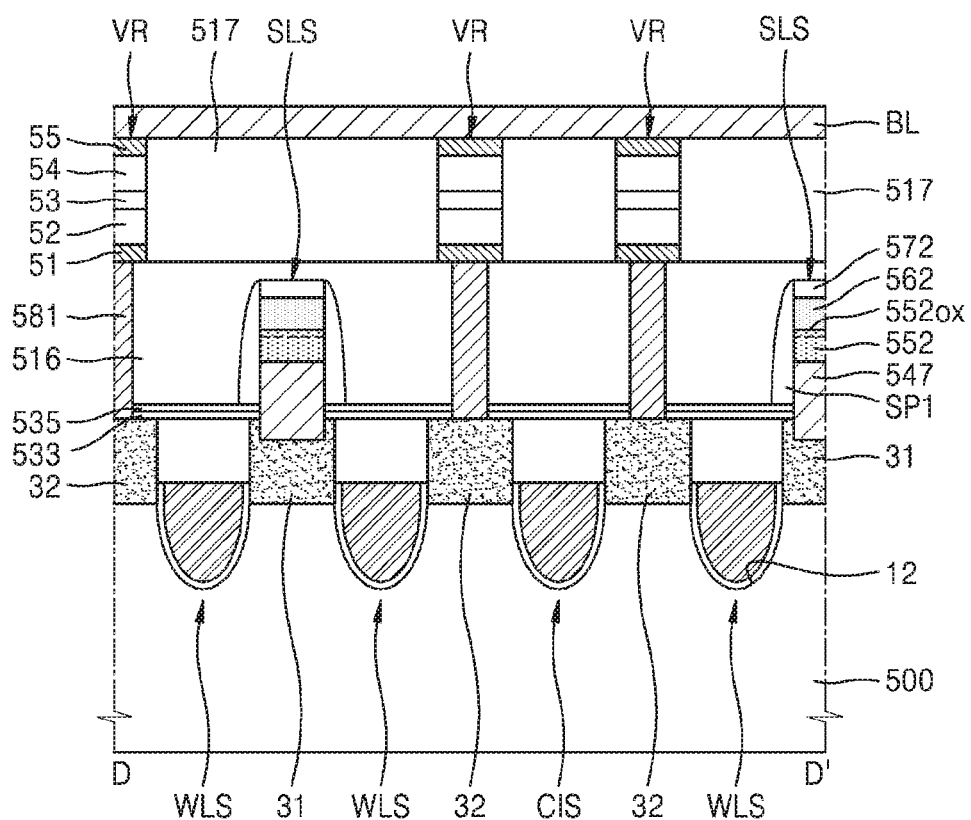
Figure 37B:
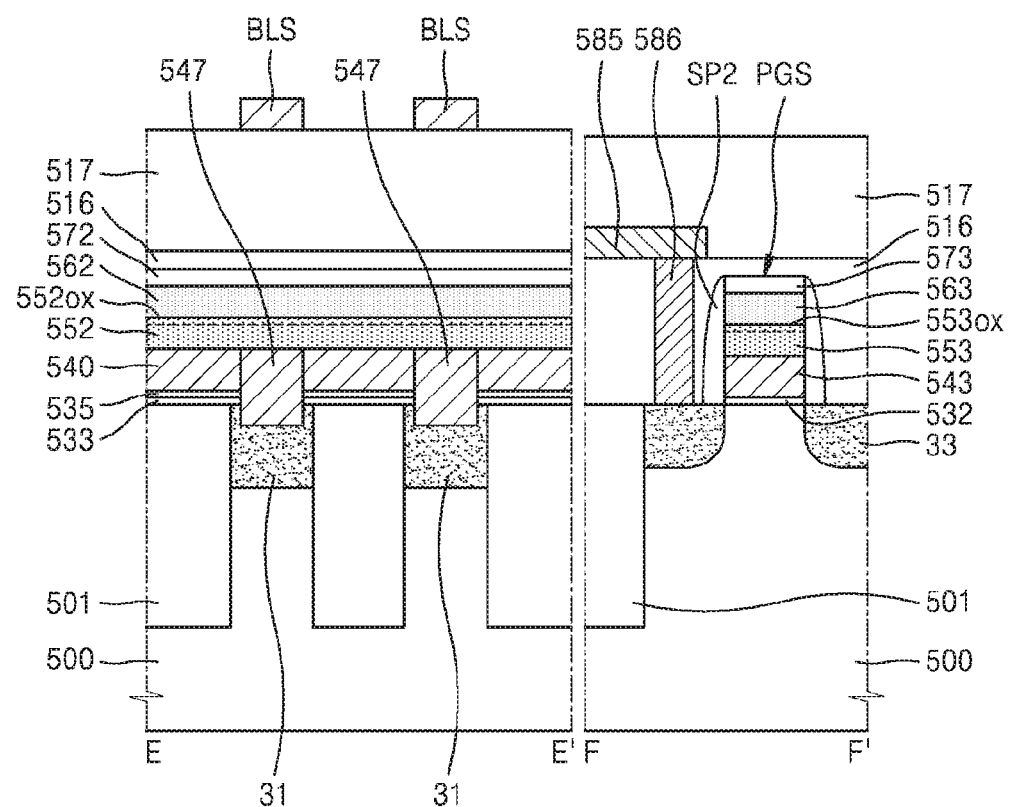

Referring to FIGS. 27, 37A, and 37B, information storage portions VR may be formed on the first contacts 581. The information storage portions VR may include a magnetic tunnel junction. For example, the information storage parts VR may include a first electrode 51, a reference magnetic layer 52, a tunnel barrier layer 53, a free layer 54, and a second electrode 55, which are formed in the stated order on the first contacts 581. The information storage portions VR may be formed in a second interlayer dielectric 517.

The first and second electrodes 51, 55 may include a low-reactivity conductive material. The first and second electrodes 51, 55 may include a conductive metal nitride. For example, the first and second electrodes 51, 55 may include at least one metal nitride selected from the group consisting of titanium nitride, tantalum nitride, tungsten nitride, and titanium aluminum nitride.

In the case of a horizontal MTJ, the reference magnetic layer 52 may include a pinning layer and a pinned layer. The pinning layer may include an anti-ferromagnetic material. For example, the pinning layer may include at least one material selected from the group consisting of PtMn, IrMn, MnO, MnS, MnTe, $MnF_2$, $FeCl_2$, FeO, $CoCl_2$, CoO, $NiCl_2$, NiO, and Cr. The pinned layer may have a magnetization direction fixed by the pinning layer. The pinned layer may include a ferromagnetic material. For example, the pinned layer may include at least one material selected from the group consisting of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The tunnel barrier layer 53 may have a thickness less than a spin diffusion distance. The tunnel barrier layer 53 may include a non-magnetic material. For example, the tunnel barrier layer 53 may include at least one material selected from the group consisting of magnesium (Mg), titanium (Ti), aluminium (Al), oxides of magnesium-zinc (MgZn) and magnesium-boron (MgB), and nitrides of titanium (Ti) and vanadium (V).

The free layer 54 may include a material having a variable magnetization direction. The magnetization direction of the free layer 54 may be changed by electrical/magnetic factors provided from the outside and/or the inside of a magnetic memory cell. The free layer 54 may include a ferromagnetic material including at least one of cobalt (Co), iron (Fe), and nickel (Ni). For example, the free layer 54 may include at least one material selected from the group consisting of FeB, Fe, Co, Ni, Gd, Dy, CoFe, NiFe, MnAs, MnBi, MnSb, CrO2, $MnOFe_2O_3$, $FeOFe_2O_3$, $NiOFe_2O_3$, $CuOFe_2O_3$, $MgOFe_2O_3$, EuO, and $Y_3Fe_5O_{12}$.

Bit lines BL, which extend in the first direction and allow the information storage portions VR to be connected, may be formed on the information storage portions VR. The bit lines BL may be of at least one material selected from the group consisting of metals, conductive metal nitrides, and doped semiconductors.

The inventive concept may be applied to the fabricating of a DRAM or MRAM device, a phase change random access memory (PRAM) device, a ferroelectric random access memory (FRAM) device, a resistive random access memory (RRAM) device, or the like. For example, in the case of fabricating a phase change random access memory (PRAM) device according to the inventive concept, the information storage portions VR may be formed to include a phase change material film between the electrodes 51, 55, instead of the reference magnetic layer 52, the tunnel barrier layer 53, and the free layer 54. In the case of fabricating a ferroelectric random access memory device, the information storage portions VR may be formed to include a ferroelectric film between the electrodes 51, 55, instead of the reference magnetic layer 52, the tunnel barrier layer 53, and the free layer 54.

The semiconductor devices disclosed in the examples described above may be formed as parts of various types of semiconductor packages. For example, semiconductor devices according to the examples of the inventive concept may be formed as part of a package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline package (TSOP), thin quad flat pack (TQFP), system in package (SIP), multi chip package (MCP), wafer-level fabricated package (WFP), or wafer-level processed stack package (WSP). Packages including semiconductor devices fabricated according to the inventive concept may further include controllers controlling the semiconductor devices, logic devices, and/or the like.

Figure 38:
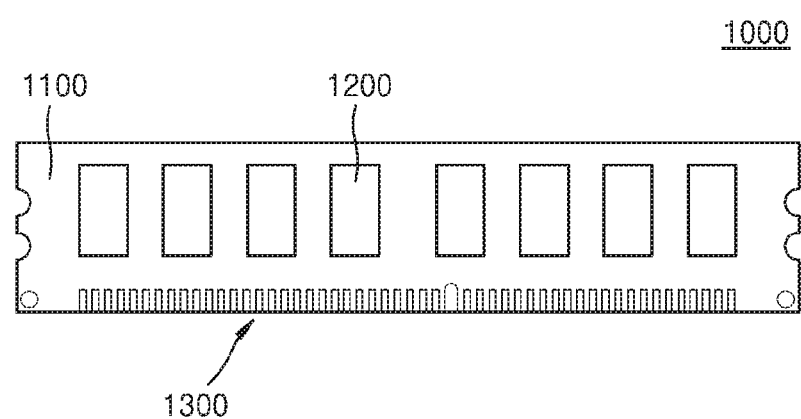
FIG. 38 is a plan view of a memory module having a semiconductor device according to the inventive concept.

FIG. 38 shows a memory module having a semiconductor device according to the inventive concept.

Referring to FIG. 38, memory module 1000 may include a memory module substrate 1100, a plurality of memory devices 1200 arranged on the memory module substrate 1100, and a plurality of terminals 1300.

The memory module substrate 1100 may include a printed circuit board or a wafer.

A process of fabricating the memory devices 1200 may include the fabricating of semiconductor devices as described above with reference to any of the examples of FIGS. 1 to 38B.

The plurality of terminals 1300 may include a metal. Each of the terminals 1300 may be electrically connected to each of the memory devices 1200.

Figure 39:
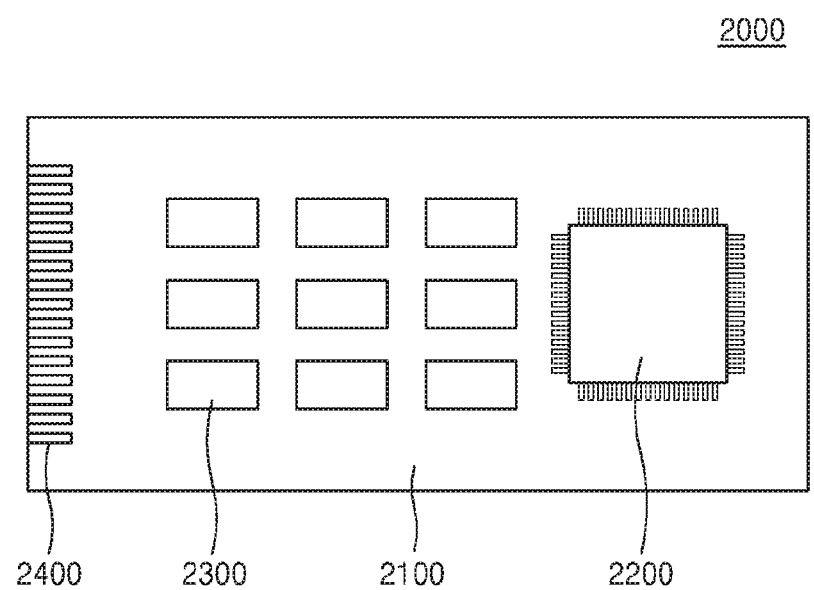
FIG. 39 is a plan view of a memory card having a semiconductor device according to the inventive concept.

FIG. 39 shows a memory card having a semiconductor device according to the inventive concept.

Referring to FIG. 39, memory card 2000 may include memory devices 2300 mounted on a memory card substrate 2100.

A process of fabricating the memory devices 2300 may the fabricating of semiconductor devices as described above with reference to any of the examples of FIGS. 1 to 38B.

The memory card 2000 may further include a microprocessor 2200 mounted on the memory card substrate 2100. Input/output terminals 2400 may be arranged on at least one of the sides of the memory card substrate 2100.

Figure 40:
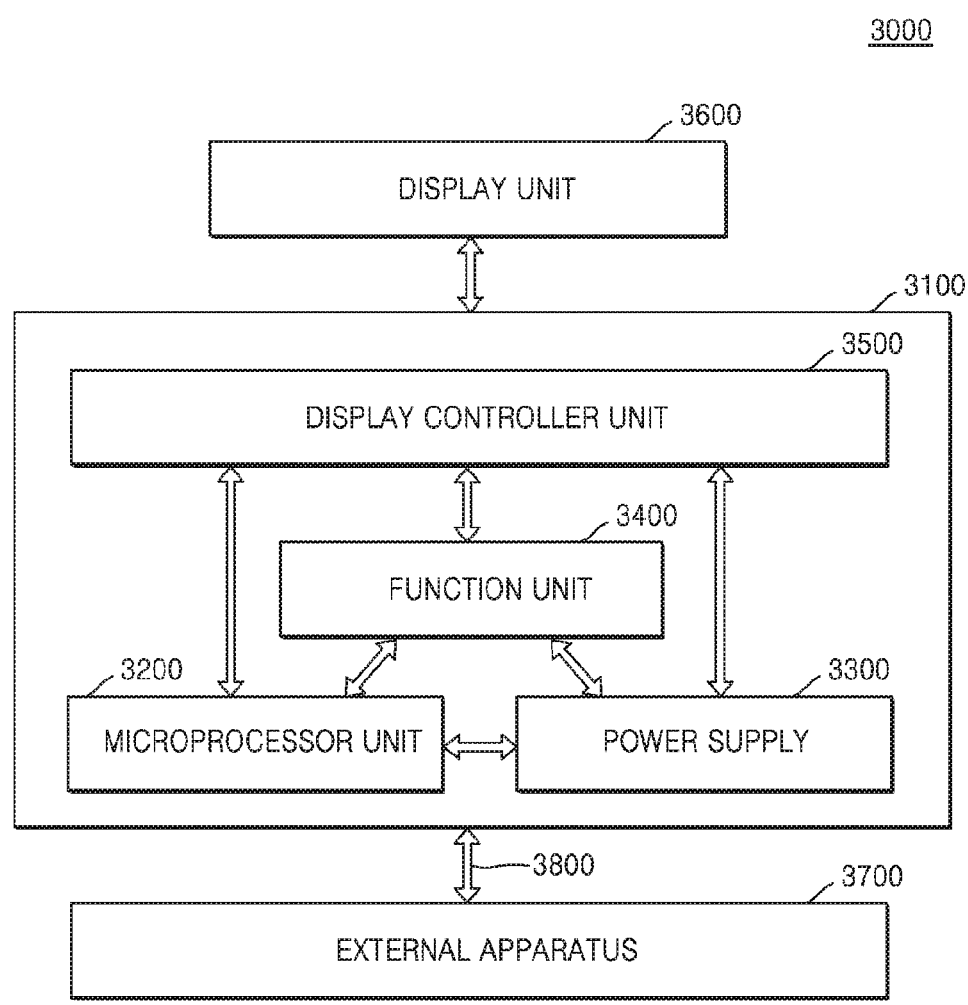
FIG. 40 is a block diagram of an electronic system including at least one semiconductor device according to the inventive concept.

FIG. 40 shows an electronic system including at least one semiconductor device according to the inventive concept.

Referring to FIG. 40, electronic system 3000 may include a body 3100. The body 3100 may include a microprocessor unit 3200, a power supply 3300, a function unit 3400, and/or a display controller unit 3500. The body 3100 may be a system board or mother board including a printed circuit board (PCB) or the like. The microprocessor unit 3200, the power supply 3300, the function unit 3400, and the display controller unit 3500 may be mounted on the body 3100.

A display unit 3600 may be arranged on an upper surface of the body 3100 or outside the body 3100. For example, the display unit 3600 may be arranged on the upper surface of the body 3100 and may display an image processed by the display controller unit 3500.

The power supply 3300 may divide a certain voltage, which is supplied from an external power source or the like, into various levels of voltages, and supply the various voltages to the microprocessor unit 3200, the function unit 3400, the display controller unit 3500, etc. The microprocessor unit 3200 may be supplied with a voltage from the power supply, and control the function unit 3400 and the display unit 3600.

The function unit 3400 may perform various functions of the electronic system 3000. For example, if the electronic system 3000 is a mobile electronic product such as a mobile phone, the function unit 3400 may include various components capable of performing wireless communication functions such as dialing, outputting an image to the display unit 3600 by communication with an external apparatus 3700, outputting a voice to a speaker, etc. In addition, if including a camera, the electronic system 3000 may serve as an image processor. Furthermore, if the electronic system 3000 is connected to a memory card or the like for capacity expansion, the function unit 3400 may be a memory card controller. The function unit 3400 may send a signal to or receive a signal from the external apparatus 3700 through a wired or wireless communication unit 3800. Furthermore, if the electronic system 3000 needs a universal serial bus (USB) or the like for function expansion, the function unit 3400 may serve as an interface controller.

A method of fabricating at least one of the microprocessor unit 3200 and the function unit 3400 may include the fabricating of semiconductor devices as described above with reference to any of the examples of FIGS. 1 to 38B.

Figure 41:
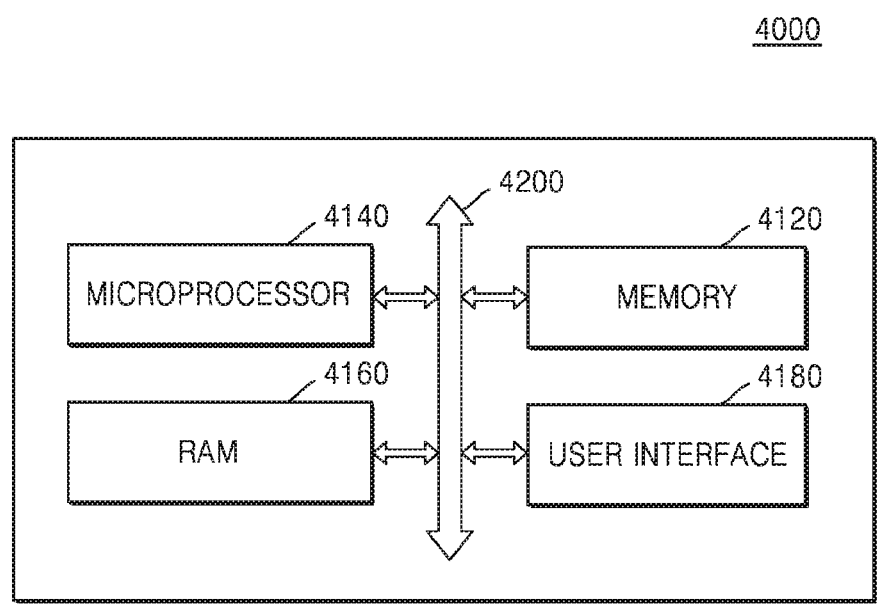
FIG. 41 is a block diagram of another electronic system including at least one semiconductor device according to the inventive concept.

FIG. 41 shows another electronic system including a semiconductor device according to the inventive concept.

Referring to FIG. 41, electronic system 4000 may be one employed by a mobile apparatus or a computer. For example, the electronic system 4000 may include a memory system 4120, and a microprocessor 4140, a RAM 4160, and a user interface 4180, which perform data communication through a bus 4200.

The microprocessor 4140 may program and control the electronic system 4000. The RAM 4160 may be used as an operation memory of the microprocessor 4140.

A method of fabricating at least one of the microprocessor 4140 and the RAM 4160 may include the fabricating of semiconductor devices as described above with reference to any of the examples of FIGS. 1 to 38B.

The microprocessor 4140, the RAM 4160 and/or the other components may be assembled into a single package.

The user interface 4180 may be used to input data to the electronic system 4000 or to output data from the electronic system 4000.

The memory system 4120 may store code for operating the microprocessor 4140, data processed by the microprocessor 4140, or external input data. The memory system 4120 may include a controller and a memory device.

Figure 42:
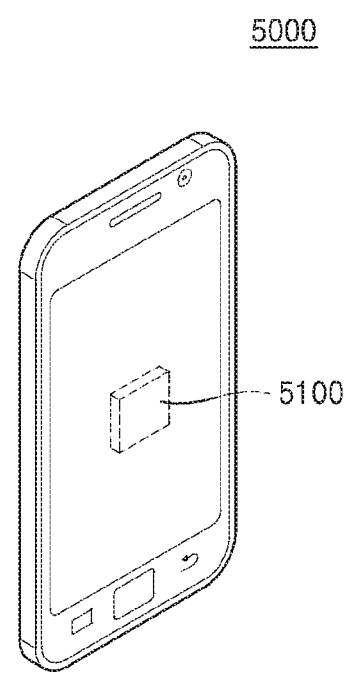
FIG. 42 is a perspective view of a mobile wireless phone having a semiconductor device according to the inventive concept.

FIG. 42 shows a mobile wireless phone 5000 having a semiconductor device according to the inventive concept.

Referring to FIG. 42, the mobile wireless phone 5000 may include a semiconductor device 5100. The semiconductor device 5100 may be fabricated according to any of the examples described above with reference to FIGS. 1 to 38B.

The mobile wireless phone 5000 is merely representative of the electronic products, such as a tablet PC, to which the inventive concept may be applied. Other electronic products that may be manufactured using the inventive concept include notebooks, mpeg-1 audio layer 3 (MP3) players, MP4 players, navigation systems, solid state drives, desk top computers, automobiles, and home appliances.

Although the inventive concept has been particularly shown and described with reference to examples thereof, it will be understood that various changes in form and details may be made thereto without departing from the spirit and scope of the following claims.

What is claimed is:

1. A method of fabricating a semiconductor device, the method comprising:
   forming a doped polysilicon layer on a substrate;
   forming a composite barrier layer structure by alternately forming metal nitride layers and silicon nitride layers repeatedly on the doped polysilicon layer;
   forming an oxidized barrier layer by executing an oxidation process that includes oxidizing a surface of the uppermost silicon nitride layer of the composite barrier layer structure; and
   forming a metal layer on the oxidized barrier layer.

2. The method according to claim 1, wherein each of the metal nitride layers comprises a crystalline metal nitride.

3. The method according to claim 1, wherein the forming of the oxidized barrier layer comprises oxidizing a thickness of about 1 Å to 20 Å of the composite barrier layer structure, to form the oxidized barrier layer, while leaving a thickness of about 20 Å to 70 Å of the composite barrier layer structure as is.

4. The method according to claim 3, wherein the oxidized barrier layer has a thickness that is less than that of the part of the barrier layer structure remaining as is after the oxidation process has been completed.

5. The method according to claim 1, wherein the oxidation process comprises oxidizing a surface of the uppermost silicon nitride layer of the composite barrier layer structure and is completed without oxidizing the layers of the composite barrier layer structure beneath the uppermost silicon nitride layer.

6. The method according to claim 5, wherein the composite barrier layer structure has a silicon concentration that continuously increases from a lower portion to an upper portion thereof.

7. The method according to claim 1, wherein the oxidation process is effected to oxidize the uppermost silicon nitride layer of the composite barrier layer structure and the metal nitride layer adjoining the uppermost silicon nitride layer.

8. The method according to claim 5, wherein the uppermost silicon nitride layer has a thickness greater than a thickness of each of the other silicon nitride layers of the composite barrier layer structure.

9. A method of fabricating a semiconductor device, the method comprising:
   providing a substrate;
   forming a bit line structure on the substrate in a cell array region; and
   forming a peripheral gate structure in a peripheral circuit region,
   wherein each of the bit line structure and the peripheral gate structure comprises a first conductive pattern, a barrier pattern on the first conductive pattern, an oxide at an upper part of the barrier pattern, and a second conductive pattern on the oxide, and
   the forming of the barrier pattern and the oxide of each of the bit line structure and the peripheral gate structure comprises forming a barrier of material by alternately forming metal nitride layers and silicon nitride layers repeatedly on conductive material and executing an oxidation process that includes oxidizing the uppermost silicon nitride layer of the barrier without oxidizing a lower portion of the barrier.

10. The method according to claim 9, wherein the first conductive pattern comprises doped polysilicon, and the second conductive pattern comprises a metal.

11. The method according to claim 9, wherein the second conductive pattern adjoins the oxide.

12. The method according to claim 9, wherein the oxidation process comprises a plasma oxidation process in an oxygen ($O_2$) or ozone ($O_3$) gas atmosphere.

13. The method according to claim 12, wherein, in the plasma oxidation process, an applied radio frequency (RF) power ranges from 1 W to 300 W.

14. A method of fabricating a semiconductor device, the method comprising:
   forming a layer of doped semiconductor material on a substrate;
   forming a barrier of material on the layer of doped semiconductor material, wherein at least an uppermost portion of the barrier comprises a crystalline metal nitride layer;
   oxidizing an upper portion only of the barrier to form an oxide at the uppermost portion of the barrier, such that a lower portion of the barrier remains un-oxidized on the layer of doped semiconductor material; and
   forming a conductive layer comprising metal directly on the oxide,
   wherein the forming of the barrier comprises alternately forming layers of silicon nitride (SiN) and the crystalline metal nitride on the layer of doped semiconductor material such that one of the layers of silicon nitride is a topmost part of the barrier, and
   the oxidizing comprises oxidizing a surface of one of the layers of silicon nitride.

15. The method according to claim 14, wherein the oxidizing comprises oxidizing said one of the layers of silicon nitride and the crystalline metal nitride layer adjoining said one of the layers of silicon nitride.

16. The method according to claim 14, wherein only said one of the layers of silicon nitride layer is oxidized in the forming of the oxide at the uppermost portion of the barrier.

17. The method according to claim 14, wherein at the conclusion of said oxidizing the oxide formed at the uppermost portion of the barrier is thinner than the lower portion of the barrier that remains un-oxidized on the layer of doped semiconductor material.

* * * * *